(12) United States Patent
Arft et al.

(10) Patent No.: US 12,656,188 B1
(45) Date of Patent: *Jun. 16, 2026

(54) MICROMACHINED THERMISTOR

(71) Applicant: SiTime Corporation, Santa Clara, CA (US)

(72) Inventors: Carl Arft, Sunnyvale, CA (US); Aaron Partridge, Cupertino, CA (US); Paul M. Hagelin, Saratoga, CA (US)

(73) Assignee: SiTime Corporation, Santa Clara, CA (US)

( * ) Notice: Subject to any disclaimer, the term of this patent is extended or adjusted under 35 U.S.C. 154(b) by 270 days.

This patent is subject to a terminal disclaimer.

(21) Appl. No.: 18/072,521

(22) Filed: Nov. 30, 2022

Related U.S. Application Data

(60) Continuation of application No. 16/565,908, filed on Sep. 10, 2019, now Pat. No. 11,543,301, which is a division of application No. 15/916,069, filed on Mar. 8, 2018, now Pat. No. 10,458,858, which is a division of application No. 15/601,431, filed on May 22, 2017, now Pat. No. 9,945,734, which is a division of application No. 14/681,848, filed on Apr. 8, 2015, now Pat. No. 9,677,948, which is a division of application No. 13/607,597, filed on Sep. 7, 2012, now Pat. No. 9,022,644.

(60) Provisional application No. 61/533,148, filed on Sep. 9, 2011.

(51) Int. Cl.
  *G01K 7/22* (2006.01)
  *G01K 13/02* (2021.01)
  *H03L 1/00* (2006.01)

(52) U.S. Cl.
  CPC ............. *G01K 7/226* (2013.01); *G01K 13/02* (2013.01); *H03L 1/00* (2013.01)

(58) Field of Classification Search
  CPC .................................................... G01K 7/226
  USPC .......................................................... 374/185
  See application file for complete search history.

(56) References Cited

U.S. PATENT DOCUMENTS

| | | | |
|---|---|---|---|
| 3,140,531 A | 7/1964 | Vanik et al. |
| 3,177,560 A | 4/1965 | Argamakoff |
| 3,292,129 A | 12/1966 | Sanchez et al. |
| 3,312,572 A | 4/1967 | Norton et al. |
| 3,364,565 A | 1/1968 | Sapoff et al. |
| 3,430,336 A | 3/1969 | Riddel |
| 3,936,789 A | 2/1976 | Matzen et al. |
| 4,622,856 A | 11/1986 | Binder et al. |
| 6,252,229 B1 | 6/2001 | Hays et al. |
| 6,851,849 B2 | 2/2005 | Kimura |
| 6,936,491 B2 | 8/2005 | Partridge et al. |
| 6,995,622 B2 | 2/2006 | Partridge et al. |
| 7,075,160 B2 | 7/2006 | Partridge et al. |
| 7,078,259 B2 | 7/2006 | Casey et al. |
| 7,131,766 B2 | 11/2006 | Sultan et al. |
| 7,306,967 B1 | 12/2007 | Kozhukh |
| 7,368,312 B1 | 5/2008 | Kranz et al. |

(Continued)

*Primary Examiner* — Joseph Chang

(57) ABSTRACT

A micromachined apparatus includes micromachined thermistor having first and second ends physically and thermally coupled to a substrate via first and second anchor structures to enable a temperature-dependent resistance of the micromachined thermistor to vary according to a time-varying temperature of the substrate. The micromachined thermistor has a length, from the first end to the second end, greater than a linear distance between the first and second anchor structures.

24 Claims, 79 Drawing Sheets

Thermistor 10 →

Micromachined Thermistor Structure 12

Substrate 14

(56)                    References Cited

U.S. PATENT DOCUMENTS

| | | | |
|---|---|---|---|
| 7,405,457 B1 | 7/2008 | Kozhukh | |
| 7,514,283 B2 | 4/2009 | Partridge et al. | |
| 7,780,343 B2 | 8/2010 | Chen et al. | |
| 7,953,573 B2 | 5/2011 | Walker | |
| 7,989,249 B2 | 8/2011 | Bluzer et al. | |
| 8,007,169 B2 | 8/2011 | Opitz et al. | |
| 8,022,554 B2 | 9/2011 | Gupta et al. | |
| 8,047,710 B2 | 11/2011 | Ikushima | |
| 8,171,801 B2 | 5/2012 | Le Noc et al. | |
| 8,916,407 B1 | 12/2014 | Grosjean et al. | |
| 9,022,644 B1 | 5/2015 | Arft et al. | |
| 9,667,948 B2 | 5/2017 | Wang et al. | |
| 9,945,734 B1 | 4/2018 | Arft et al. | |
| 10,458,858 B1 | 10/2019 | Arft et al. | |
| 11,543,301 B1* | 1/2023 | Arft | H03L 1/00 |
| 2002/0090012 A1* | 7/2002 | Kroeger | G05D 23/1913 |
| | | | 372/34 |
| 2003/0048970 A1 | 3/2003 | Cole et al. | |
| 2003/0217458 A1* | 11/2003 | Haga | H01C 1/14 |
| | | | 29/610.1 |
| 2004/0253794 A1 | 12/2004 | Faris | |
| 2005/0012588 A1 | 1/2005 | Sultan et al. | |
| 2005/0151213 A1 | 7/2005 | Casey et al. | |
| 2005/0242904 A1 | 11/2005 | Lutz et al. | |
| 2006/0033594 A1 | 2/2006 | Lutz et al. | |
| 2007/0262831 A1 | 11/2007 | Van Beek et al. | |
| 2007/0281379 A1 | 12/2007 | Stark et al. | |
| 2008/0002755 A1 | 1/2008 | Raravikar et al. | |
| 2010/0289613 A1* | 11/2010 | De Bruyker | H01C 17/06533 |
| | | | 29/612 |
| 2011/0150030 A1 | 6/2011 | Abdelmoneum et al. | |
| 2011/0210415 A1 | 9/2011 | Altavilla et al. | |
| 2012/0287962 A1 | 11/2012 | Ooishi | |
| 2013/0334635 A1 | 12/2013 | Kennedy et al. | |
| 2014/0138259 A1 | 5/2014 | Mickelson et al. | |
| 2014/0169405 A1* | 6/2014 | Graham | G01K 7/226 |
| | | | 374/185 |
| 2015/0055682 A1 | 2/2015 | Nagatomo et al. | |
| 2015/0177272 A1 | 6/2015 | Clark | |

* cited by examiner

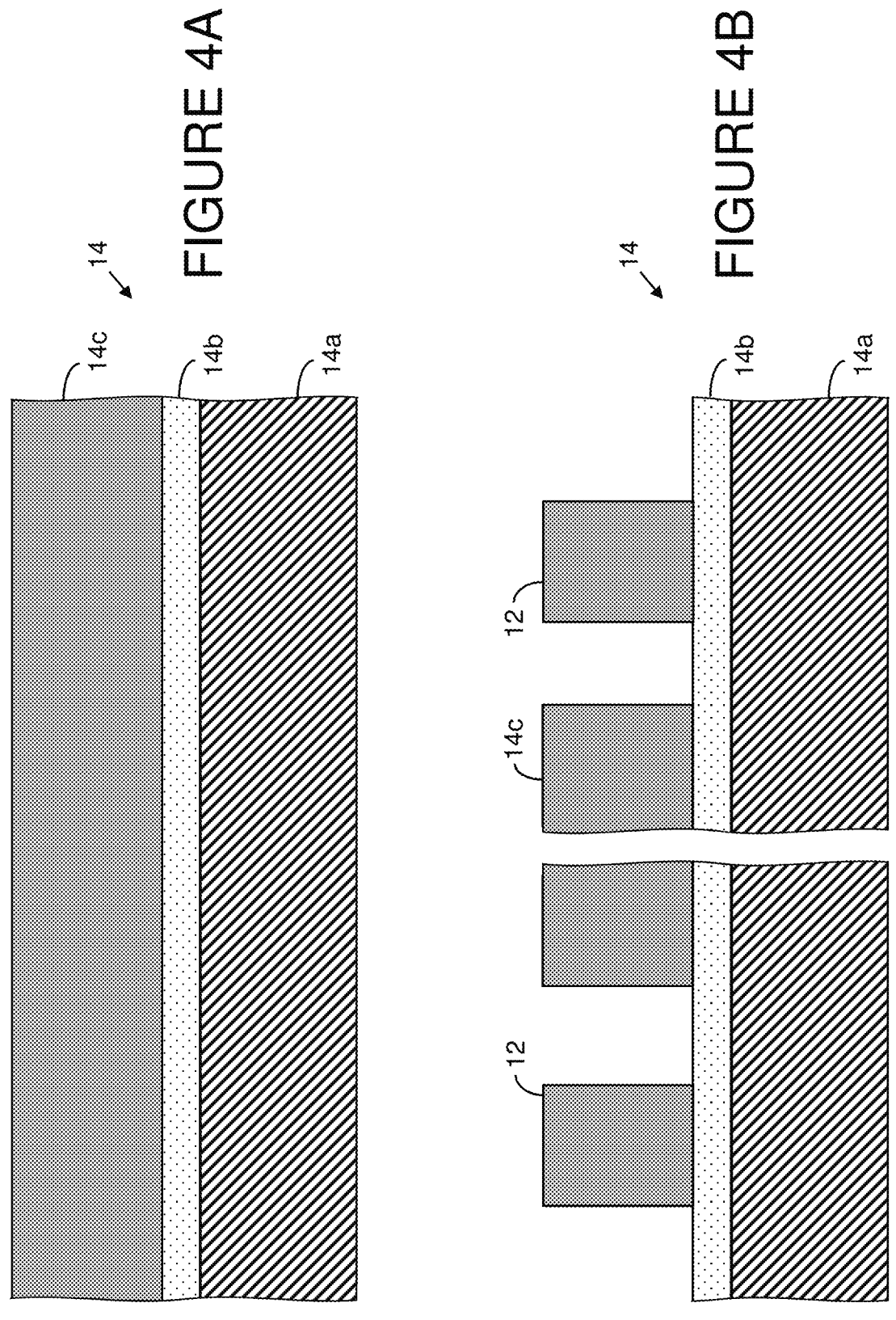

Thermistor 10

Substrate 14

Micromachined
Thermistor
Structure
12

MEMS
Device 36

34

14

Micromachined
Thermistor
Structure
12

12

12

MEMS
Device 36

34

14

12

12

Portion including
MEMS Device 36

Portion including
Micromachined
Thermistor
Structure
12b

Portion including
Micromachined
Thermistor
Structure
12a

Thermal
Coupler 46

46

46

34

Thermistor 10

18

16

12

12

12

18

16

48

38 or 40

MEMS Device 36

Substrate 14

Loop-shape

12

Loop-shape

12

Loop-shape

12

MICROMACHINED THERMISTOR

CROSS-REFERENCE TO RELATED APPLICATIONS

This application is a continuation of U.S. patent application Ser. No. 16/565,908 filed Sep. 10, 2019, which is a divisional of U.S. patent application Ser. No. 15/916,069 filed Mar. 8, 2018, which is a divisional of U.S. patent application Ser. No. 15/601,431 filed May 22, 2017 (now U.S. Pat. No. 9,945,734), which is a divisional of U.S. patent application Ser. No. 14/681,848 filed Apr. 8, 2015 (now U.S. Pat. No. 9,677,948), which is a divisional of U.S. patent application Ser. No. 13/607,597 filed Sep. 7, 2012 (now U.S. Pat. No. 9,022,644), which claims priority to U.S. Provisional Application No. 61/533,148 filed Sep. 9, 2011. Each of the above-identified patent applications is hereby incorporated by reference.

INTRODUCTION

The present inventions are directed to, among other things, a micromachined thermistor (and the method of manufacturing such a thermistor) having predetermined and/or high correlation of resistance to ambient temperature and, preferably, limited, minimized and/or reduced stress-resistance dependence and/or improved long-term stability. In one embodiment, the thermistor includes one or more micromachined thermistor structures which are fabricated from a temperature-sensitive crystalline material (for example, doped or undoped semiconductor material(s) such as, for example, monocrystalline, polycrystalline and/or amorphous silicon, germanium, silicon/germanium, silicon carbide (SiC), and gallium arsenide) using any micromachining processing or fabrication techniques now known or later developed. In addition thereto, or in lieu thereof, the thermistor may include one or more micromachined thermistor structure which are fabricated from a metal material (for example, platinum, aluminum, molybdenum, titanium and/or copper (or alloys thereof)).

For example, in one embodiment, the micromachined thermistor structure may be fabricated from a doped monocrystalline or polycrystalline silicon (for example, doped with a p-type impurity (such as, for example, boron, aluminum, gallium, or other element in group 13 of the periodic table as well as compounds) or an n-type impurity (such as, for example, phosphorus and/or arsenic)) using well-known deposition, lithographic and/or doping techniques. In another embodiment, the micromachined thermistor structure may be fabricated from platinum, molybdenum, titanium and/or copper (or alloys thereof). Indeed, in another embodiment, the thermistor includes a plurality of thermistor structures including at least one micromachined thermistor structure fabricated from a doped monocrystalline or polycrystalline semiconductor material and at least one micromachined thermistor structure fabricated from a metal material.

Where the micromachined thermistor structure includes or is fabricated from a impurity doped semiconductor material, in one embodiment, the impurity dopant type and/or doping levels (both of which may depend on a given base or substrate material of the structure) may be selected to provide a predetermined, increased, linearized enhanced and/or maximum sensitivity of the temperature dependent characteristic of the structure (for example, resistance) relative to undoped or intrinsic semiconductor material. In another embodiment, the micromachined thermistor structure is doped with a dopant type and/or at doping levels that provide a predetermined increase in sensitivity of the temperature dependent characteristic of the structure (for example, resistance) in relation to a predetermined and/or minimum sensitivity to doping variations (which may depend on manufacturing controllability and/or tolerances of the doping operation) and/or linearity of the change of the temperature dependent characteristic of the structure (for example, resistance) over temperature (for example, an operating or predetermined temperature range). For example, in one embodiment, the impurity doping levels provide a predetermined enhancement of the sensitivity of the temperature dependent characteristic of the structure (for example, resistance) but such sensitivity over a range of doping levels (for example, the manufacturing controllability and/or tolerances of the doping operation) is within a predetermined sensitivity range. In this way, although the dopant and doping levels may not provide a maximum sensitivity to the temperature dependent characteristic of the micromachined thermistor structure, such dopant and/or levels provide an increase in the temperature dependent characteristic, relative to an undoped base material of the structure, and a sensitivity of the temperature dependent characteristic (for example, resistance) over manufacturing variations or tolerances in doping operations or concentrations is within a predetermined range or limits.

Notably, in one embodiment, the doping processes (which may employ multiple masking processes) of the micromachined thermistor structure may include a plurality of impurity dopant types and/or a plurality of doping levels, which, in sum, provide a net doping concentration. In one embodiment, the doping processes may include (i) a first impurity dopant type at first doping level and (ii) a second impurity dopant type (which is the same impurity type as the first impurity dopant type) at a second doping level. In another embodiment, the doping processes may include counter-doping which includes (i) a first impurity dopant type at first doping level and (ii) a second impurity dopant type (which is opposite the first impurity dopant type) at a second doping level. In the context of counter-doping, the dominant impurity type and the net doping concentration of the micromachined thermistor structure depend on, among other things, the impurity dopant types and the doping levels of such impurities. Indeed, in another embodiment, the doping processes of the thermistor (which may employ multiple masking processes) may provide a first region of the thermistor (for example, the electrical contacts) having first impurity dopant type(s) and/or first impurity doping level(s), and a second region of the thermistor (for example, the micromachined thermistor structure) having second impurity dopant type(s) and/or second impurity doping level(s).

The thermistor of the present inventions may be a discrete device or integrated on a substrate or die with one or more other structures (for example, one or more mechanical structures of a micro- or nano-electromechanical device (MEMS or NEMS device, respectively, hereinafter collectively "MEMS device")). In addition thereto, or in lieu thereof, the thermistor may be integrated with circuitry as an integrated circuit type device. In this regard, the thermistor of the present inventions (which may have one or more micromachined thermistor structures) may be integrated on a die including integrated circuitry and/or one or more MEMS devices having one or more other structures (for example, one or more mechanical structures of a micro- or nano-electromechanical device).

In one embodiment, the micromachined thermistor structure may be partially, substantially or entirely released (vertically and/or horizontally), suspended, and/or "free-standing" relative to the substrate. For example, in one embodiment, the micromachined thermistor structure may be vertically and/or horizontally released and/or suspended (for example, in a cantilever-like manner) above the substrate to limit and/or reduce changes in the temperature dependent characteristics (for example, resistance) of the structure due to stresses in the substrate (for example, internal or external stresses introduced during operation). In these embodiments, the temperature dependent characteristics (for example, resistance) of the micromachined thermistor structure, which is partially, substantially or entirely released (vertically and/or horizontally), suspended, and/or "free-standing" relative to the substrate, are substantially independent of internally or externally induced stresses in the substrate and, as such, provide a more accurate and/or a more reliable representation of the ambient temperature regardless of the non-temperature related/dependent ambient operating conditions of the thermistor (for example, substrate stress or forces (internal or external) applied thereto).

In one embodiment, the micromachined thermistor structure of the thermistor is unsealed or not encapsulated, but is exposed to the ambient atmosphere. In another embodiment, the micromachined thermistor structure is sealed or encapsulated in a cavity. Here, the micromachined thermistor structure may be sealed or encapsulated in a cavity using any technique now known or later developed. (See, for example, MEMS fabrication, encapsulation and packaging process as described and illustrated in U.S. Pat. Nos. 6,146,917; 6,307,815; 6,352,935; 6,477,901; 6,507,082; 6,936,491; 7,075,160; and/or 7,514,283). Moreover, in one embodiment, the micromachined thermistor structure of the thermistor is sealed or encapsulated in a cavity having a predetermined environment and fluid (for example, a cavity having a vacuum environment or having a predetermined pressure and/or fluid (for example, hydrogen and/or an inert gas such as helium). (See, for example, U.S. Pat. No. 7,514,283). Indeed, in one embodiment, a fluid (for example, gas or liquid such as, for example, helium, argon, nitrogen, an oil, a silicon liquid and a silicon gel) may be disposed in the cavity and/or around the thermistor to, for example, enhance thermal conductivity/contact with other portions of the die, other structures disposed or fabricated in the die (for example, a MEMS device such as a MEMS resonator, accelerometer, gyroscope, pressure sensor and/or combinations thereof) and/or with structures disposed or fabricated in a related/associated die (for example, a MEMS device disposed or fabricated in the related/associated die).

The micromachined thermistor structure of the thermistor may include one or more anchors which secure, attach and/or physically couple the thermistor structure to the substrate of the discrete, integrated and/or integrated circuit device. In addition thereto, or in lieu thereof, the micromachined thermistor structure of the thermistor may include one or more anchors which secure, attach and/or physically couple the thermistor structure to the encapsulation structure of the discrete, integrated and/or integrated circuit device. Notably, the one or more anchors may be displaced (for example, laterally) relative to the signal flow (for example, current flow) through or in the micromachined thermistor structure. In this way, the impact of internal or external stress introduced into the micromachined thermistor structure via the anchors may be limited, minimized and/or reduced in relation to the temperature dependent output signal.

The micromachined thermistor structure of the thermistor may include a stem-loop or hairpin loop shape (hereinafter collectively, "loop-shape"). Under these circumstances, the anchors are located in close proximity (for example, juxtaposed) such that the anchors secure, attach and/or physically couple the thermistor structure to the substrate and/or encapsulation material/structure of the sensor or the integrated device. In this way, displacement of or impact on the micromachined thermistor structure (or portions thereof) due to internal or external stress may be limited, minimized and/or reduced thereby limiting and/or reducing the impact on the thermistor's temperature dependent output signal.

Moreover, a loop-shape (wherein the anchors of the micromachined thermistor structure are located in close proximity) may increase the rigidity, restoring force and/or resonant frequency of the micromachined thermistor structure of the thermistor in response to external forces or vibration applied to the substrate (particularly in those embodiments where the micromachined thermistor structure is partially, substantially or entirely released (vertically and/or horizontally), suspended, or "free-standing" relative to the substrate). In addition to limiting and/or reducing the impact of such external forces on the temperature dependent characteristics (for example, resistance) of the micromachined thermistor structure (which will improve the accuracy and/or reliability of the temperature dependent output signal of the structure), the rigidity, restoring force and/or resonant frequency of the micromachined thermistor structure of the thermistor will reduce or minimize stiction concerns—wherein the micromachined thermistor structure comes in physical contact with nearby structure, the substrate and/or the cover (in those embodiments where the micromachined thermistor structure of the thermistor is encapsulated or a protective cover is disposed over the structure).

The micromachined thermistor structure of the thermistor may also include (in whole or in part) a serpentine or undulating shape. For example, where the micromachined thermistor structure includes a loop-shape, one or more of the legs or portions of the loop-shape of the micromachined thermistor structure may include a serpentine or undulating shape or structure to, among other things, increase the amplitude of the output signal corresponding to the temperature dependent characteristics of the micromachined thermistor structure, increase resistance of the overall structure and/or limit and/or reduce the impact on the micromachined thermistor structure (or portions thereof) of internal or external stress. Indeed, in one embodiment, the micromachined thermistor structure includes one or more major portions of the loop-shape of the micromachined thermistor structure which are symmetrical or substantially symmetrical (for example, in relation to an axis of the structure), such major portions may include symmetrical or substantially symmetrical serpentine or undulating shapes.

In addition, in one embodiment, the thermistor includes two or more electrical contacts to input and/or output signals from the thermistor. The electrical contacts facilitate measurement of a temperature dependent characteristics of the micromachined thermistor structure (and/or change therein) of the thermistor. In one embodiment, the thermistor includes two electrical contacts to facilitate a 2-point sensing configuration/architecture where measurement circuitry samples, detects and/or measures the temperature dependent characteristics (and/or changes therein) of the micromachined thermistor structure (for example, resistance or change in resistance of the micromachined thermistor structure). In another embodiment, the thermistor includes four electrical contacts to facilitate implementation of 2-point, 3-point or 4-point sensing configurations/architectures wherein a 4-point sensing configuration/architecture may facilitate more accurate measurement of the temperature dependent characteristics (for example, resistance), and/or change therein, of the thermistor with minimal, reduced, little or no contribution to the overall or measured resistance due to, for example, (i) the electrical contacts or signal path to the measurement circuitry and/or (ii) non-idealities of the measurement circuitry.

Notably, in one embodiment, one or more of the electrical contacts of the thermistor and/or the micromachined therm-istor structure are physically integrated or disposed in one or more of the anchors of the thermistor. Indeed, where the anchors are laterally displaced relative to the signal flow (for example, current flow) through or in the micromachined thermistor structure, it may be advantageous to physically integrate or dispose the electrical contacts in the anchors of the thermistor to limit and/or reduce the impact of internal or external stress introduced into the micromachined therm-istor structure via the anchors and thereby limit and/or reduced the impact of such forces on the temperature dependent output signal. In this way, the thermistor provides a more accurate and/or a more reliable representation of the ambient temperature regardless of the non-temperature related/dependent ambient operating conditions of the thermistor (for example, substrate stress or forces (internal or external) applied thereto).

In those embodiments where the micromachined therm-istor structure provides information which is representative of another structure (for example, a one or more mechanical structures of a MEMS device), a thermal coupler may be employed to enhance the thermal coupling of the structure with the micromachined thermistor structure. In this way, the thermistor provides a more accurate and/or a more reliable representation of the temperature of the other struc-ture even where the structures are disposed in a cavity having a vacuum environment. Indeed, in one embodiment, the micromachined thermistor structure may share or physi-cally contact the other structure (for example, the microma-chined thermistor structure may share an anchor with one or more mechanical structures of a MEMS device). Such an embodiment enhances the thermal exchange between the thermistor and the other structure and, where the structures are disposed in a cavity having a vacuum environment, such an exchange may dramatically enhance the accuracy and reliability of the representation of temperature of the other structure by the thermistor.

As intimated above, the thermistor may electrically couple to measurement circuitry. In one embodiment, the measurement circuitry includes resistance, voltage and/or current sensors (for example, an ohm meter, a voltmeter and/or a current meter). Any resistance, voltage and/or current sensors, whether now known or later developed, may be employed in conjunction with the thermistors of the present inventions. Indeed, the measurement circuitry may be configured in a 2-point configuration/architecture (for example, ohm meter type circuitry coupled to electrical connection or contact points of the thermistor). In another embodiment, the measurement circuitry may be configured in 3-point or 4-point configuration/architecture (for example, current meter and voltmeter type circuitry coupled to electrical connection or contact points of the thermistor). The circuitry may include a bridge network, configuration or architecture (for example, a Wheatstone bridge). Such bridge may be 2 or 4 element, and may be AC or DC excited, and may include one or more active or passive elements including resistors, capacitors, inductors and/or transistors/diodes.

Notably, the measurement circuitry may be partially or wholly (i) integrated on the same substrate or die as the thermistor or (ii) disposed on a separate or different die.

Importantly, in one aspect, the present inventions are directed to measurement circuitry and methods of operating such circuitry. In one embodiment of this aspect, the mea-surement circuitry minimizes the impact of non-idealities of the measurement system and/or configuration to measure the temperature dependent characteristics of the micromachined thermistor structure and/or change therein (for example, resistance introduced via the measurement circuitry) by measuring a parameter (for example, capacitance) that is a measure of but different from the temperature dependent characteristics of the micromachined thermistor structure (for example, resistance).

Moreover, such inventions provide a low noise tempera-ture sensing with high accuracy, low power, and/or low area using a thermistor element as the micromachined tempera-ture sensitive device (for example, one or more of the thermistors of the present inventions wherein the resistance of the micromachined thermistor structure depends on or changes with temperature). For example, in one embodi-ment, the measurement circuitry includes a switched capaci-tor network that creates a low noise adaptable reference resistor for comparison purposes, a frequency divider that is controlled by a digital Sigma-Delta modulator (also known as a Delta-Sigma modulator—which hereinafter identified as a "Sigma-Delta" modulator) to achieve an accurately controlled switching frequency for the switched capacitor network, a chopping method to mitigate the effect of 1/f noise and circuit offsets, a pseudo-differential VCO-based analog-to-digital converter structure to efficiently convert the analog error between the MEMS-based resistance value and the effective resistance of the switched capacitor net-work into a digital code, and an overall feedback loop that changes a Sigma-Delta modulator input in response to that error. In this way, the measurement circuitry minimizes the impact of non-idealities of the measurement system and/or configuration to measure the temperature dependent char-acteristics of the micromachined thermistor structure and/or change therein (for example, resistance introduced via the measurement circuitry) by measuring a parameter (for example, capacitance) that is a measure of but different from the temperature dependent characteristics of the microma-chined thermistor structure (for example, resistance).

The measurement circuitry may electrically couple to data processing circuitry. Here the data processing circuitry, using the output signal of the measurement circuitry (which may be a measure of the temperature dependent resistance and/or change therein), may determine and/or generate data which is indicative or representative of a temperature and/or change therein. The data processing circuitry may be par-tially or wholly (i) integrated on the same substrate(s)/die (dice) as the thermistor and/or measurement circuitry or (ii) disposed on a separate or different substrate/die. Notably, the data processing circuitry may be one or more processors, one or more state machines, one or more processors imple-menting software, one or more gate arrays, programmable gate arrays and/or field programmable gate arrays (whether integrated or otherwise). Indeed, the processing circuitry may be any circuitry now known or later developed which determines, calculates and/or generate data which is indica-tive or representative of a temperature (and/or change therein) based on or using the output signal of the measure-ment circuitry.

BRIEF DESCRIPTION OF THE DRAWINGS

In the course of the detailed description to follow, refer-ence will be made to the attached drawings. These drawings show different aspects of the present inventions and, where appropriate, reference numerals illustrating like structures, components, materials and/or devices in different figures are labeled similarly. It is understood that various combinations of the structures, components, and/or devices, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

FIGS. 1A-1C illustrate block diagram representations of a thermistor, implemented in various system configurations, according to certain aspects of certain embodiments of the present inventions, wherein FIG. 1A illustrates a thermistor including a micromachined thermistor structure disposed on or in a substrate, FIG. 1B illustrates a thermistor (according to any of the embodiments disclosed herein) electrically coupled to measurement circuitry, and FIG. 1C illustrates a thermistor (according to any of the embodiments disclosed herein) electrically coupled to measurement circuitry, which is coupled to data processing circuitry (notably, the data processing circuitry, in certain embodiments, employs the data which is representative of the ambient temperature, as measured by the measurement circuitry, to calculate, generate and/or determine data which is indicative or representative of temperature);

FIGS. 1D-1F illustrate block diagram representations of the system architecture of FIG. 1C (which includes a thermistor) in conjunction with clock generation circuitry (for example, one or more integer and/or fractional phase locked loops (PLLs), delay locked loops (DLLs), digital/frequency synthesizer (for example, a direct digital synthesizer ("DDS"), frequency synthesizer, fractional synthesizer and/or numerically controlled oscillator) and/or frequency locked loops (FLLs)), wherein in FIGS. 1E and 1F, the system also includes a MEMS device (for example, a MEMS resonator, accelerometer, gyroscope, pressure sensor and/or combinations thereof) and the clock generation circuitry may employ the output signal of the MEMS device as a reference signal to generate a clock output signal having a predetermined, substantially stable frequency, and the data processing circuitry employs the data from the thermistor (which provides information of the operating temperature of the MEMS device) to adjust the operation of the clock generation circuitry (for example, adjust, change one or more values or parameters of the PLL or DLL circuitry in accordance with or to accommodate for changes in temperature-see, for example, U.S. Pat. No. 6,995,622);

FIGS. 3A-3E illustrate cross-sectional views of the portion of the exemplary thermistor of FIGS. 2A-2C (along dotted line A-A, B-B, C-C, D-D, and E-E respectively), wherein FIG. 3A illustrates a cross-sectional view of the anchors and electrodes, FIG. 3B illustrates a cross-sectional view of a center section of the micromachined thermistor structure which is (i) disposed and suspended over (for example, in a cantilever-like manner) and/or (ii) vertically and horizontally released from the substrate, FIG. 3C illustrates an end portion of the micromachined thermistor structure which is also (i) disposed and suspended over (for example, in a cantilever-like manner) and/or (ii) vertically and horizontally released from the substrate, FIG. 3D illustrates a cross-sectional view of an end portion of the micromachined thermistor structure wherein the sectional view of FIG. 3D is perpendicular to the sectional view of FIG. 3C, and FIG. 3E illustrates a cross-sectional view of the anchor and electrode of the exemplary thermistor of FIGS. 2A and 2B;

FIGS. 4A-4C illustrate cross-sectional views (along dotted line B-B of FIGS. 2A-2C) at various stages of manufacturing of the exemplary thermistors of FIGS. 2A-2C, wherein FIG. 4A illustrates a cross-sectional view of substrate prior to formation of the micromachined thermistor structure (wherein in this exemplary illustration, the starting wafer may be a semiconductor-on-insulator wafer or a metal-on-insulator-on-substrate type wafer, FIG. 4B illustrates a cross-sectional view of the micromachined thermistor structure after definition or formation (using, for example, well-known lithographic and etching techniques), FIG. 4C illustrates the micromachined thermistor structure after removal of the sacrificial or insulating layer wherein the micromachined thermistor structure is (i) disposed and suspended over (for example, in a cantilever-like manner) and/or (ii) vertically and horizontally released from the substrate, in accordance with certain aspects and/or embodiments of the present inventions;

in FIG. 7B, current meter and voltmeter type circuitry may be coupled to the thermistor, in a 4-point measurement architecture/configuration, to measure a resistance or changes in resistance of the thermistor wherein the resistance of the thermistor is determined by applying/forcing a current, I, across the F+/F− terminals, and sensing a voltage, V, across the S+/S− terminals; and, in FIG. 7C, current meter and voltmeter type circuitry may be coupled to the thermistor, in a 3-point measurement architecture/configuration, to measure a resistance or changes in resistance of the thermistor wherein resistance of the thermistor is determined by applying/forcing a current, I, across the F+/F− terminals, and sensing a voltage, V, across the S+/S− terminals; notably, the measuring circuitry of FIGS. 7B and 7C may measure a parameter (for example, capacitance) although representative of temperature dependent characteristics of the micromachined thermistor structure, is different from the temperature dependent characteristics (for example, resistance) of the micromachined thermistor structure;

FIGS. 9A-9E illustrate cross-sectional views, along dotted line A-A of the exemplary thermistor illustrated in FIG. 5A, at various stages of manufacturing, wherein FIG. 9A illustrates a cross-sectional view of the micromachined thermistor structure after formation and prior to release from the substrate, FIG. 9B illustrates a cross-sectional view of the micromachined thermistor structure after providing or depositing a sacrificial layer on the micromachined thermistor structure, FIG. 9C illustrates a cross-sectional view after forming, depositing, growing and/or providing an encapsulation layer on and/or over sacrificial layer and prior to release of the micromachined thermistor structure from the substrate (via removal or etching of the sacrificial layer from around the micromachined thermistor structure), and FIG. 9D illustrates a cross-sectional view after releasing of the micromachined thermistor structure from the substrate wherein the sacrificial layer is removed or etched from around micromachined thermistor structure thereby substantially or entirely releasing (vertically and horizontally) micromachined thermistor structure; in one embodiment, the vents are closed and the cavity sealed after releasing micromachined thermistor structure, for example, via deposition forming, depositing, growing and/or providing another encapsulation layer (see FIG. 9E); notably, in one embodiment, vents (not illustrated in this series of figures) are formed in encapsulation layer and the sacrificial layer is removed or etched around micromachined thermistor structure using well known processing techniques; in this way, the temperature dependent characteristics (for example, resistance) of micromachined thermistor structure, which is released (vertically and/or horizontally), suspended, and/or "free-standing", are relatively and/or substantially independent of internally or externally induced stresses in substrate and, as such, provide a more accurate and/or reliable representation of the ambient temperature notwithstanding any non-temperature related/dependent ambient operating conditions of thermistor (for example, substrate stress or forces (internal or external) applied thereto);

Figure 15A:
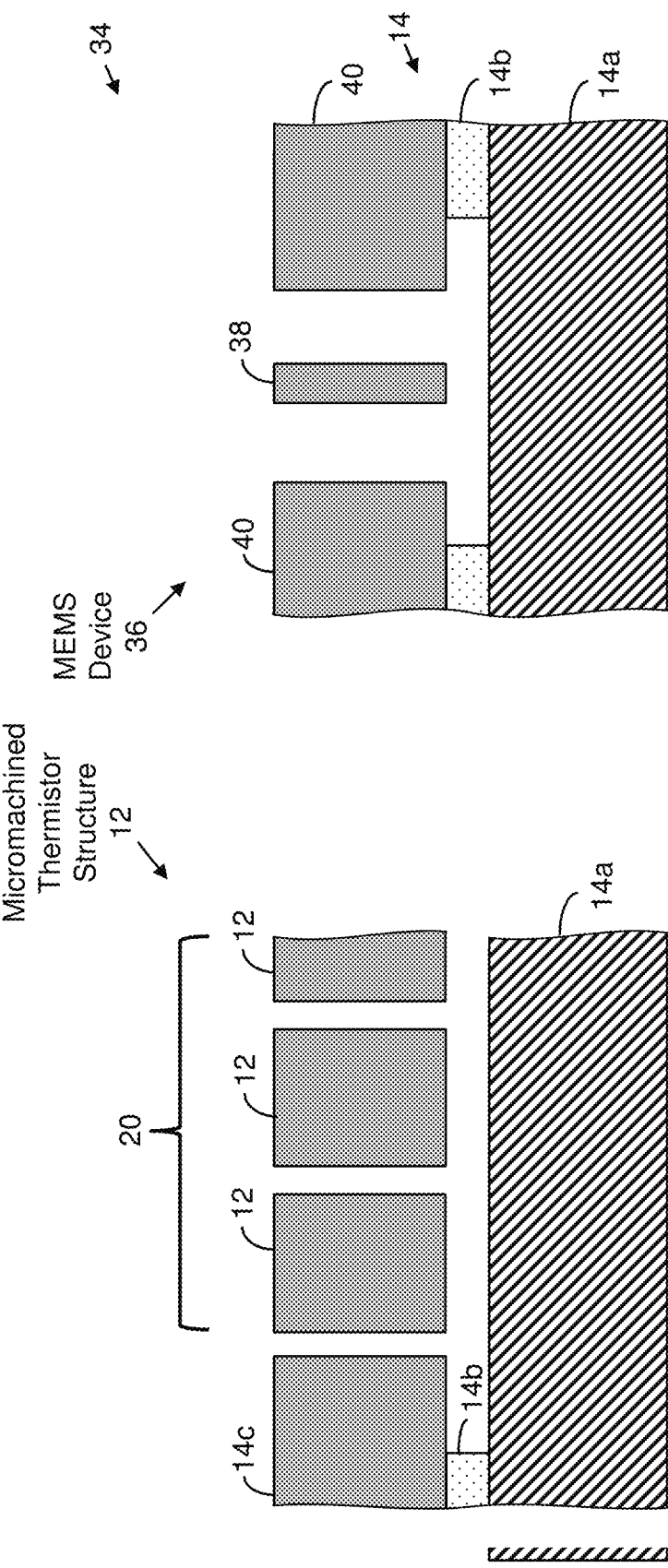
FIG. 15A illustrates a cross-sectional view a micromachined thermistor structure of a thermistor, according to one or more or the present inventions, integrated in, on and/or above a substrate which includes one or more other structures (for example, one or more mechanical structures of a micro- or nano-electromechanical device), according to one or more of the present inventions; notably, in this illustrated embodiment, the other structure and thermistor are disposed in, on and/or above the substrate and formed (in whole or in part) in, on and/or from an active layer and in and/or on die.
Figure 15B:
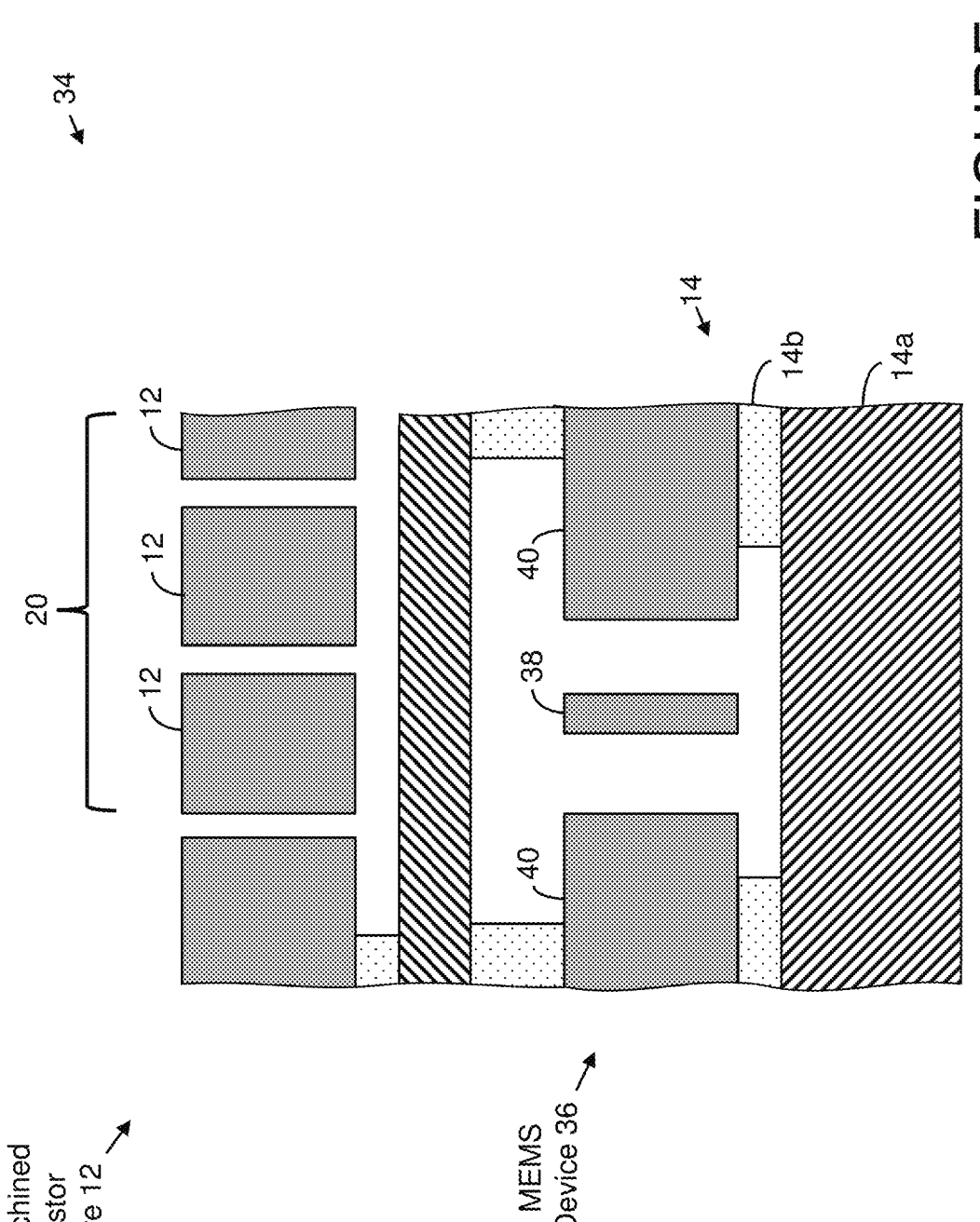
Figure 15C:
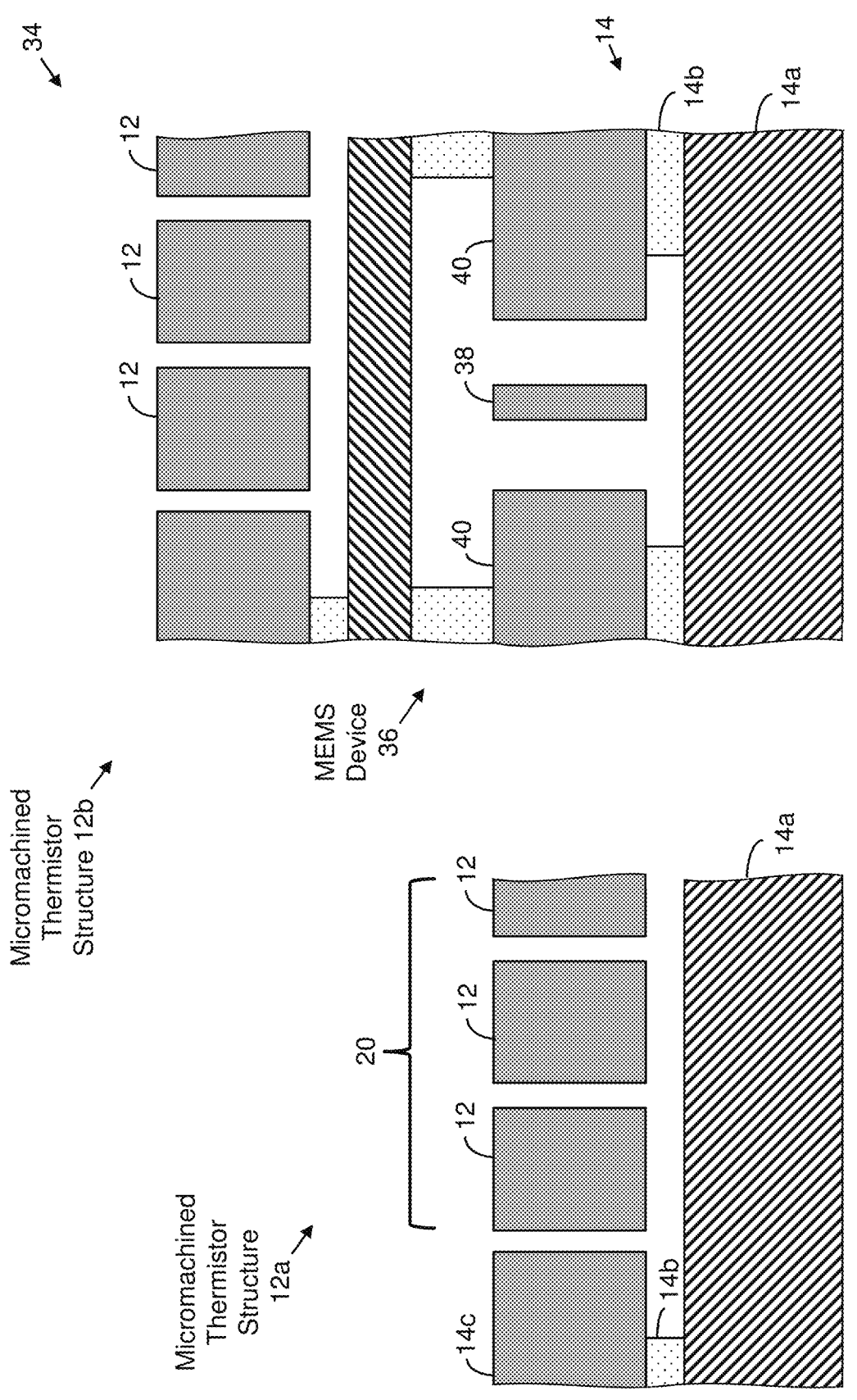
Figure 16:
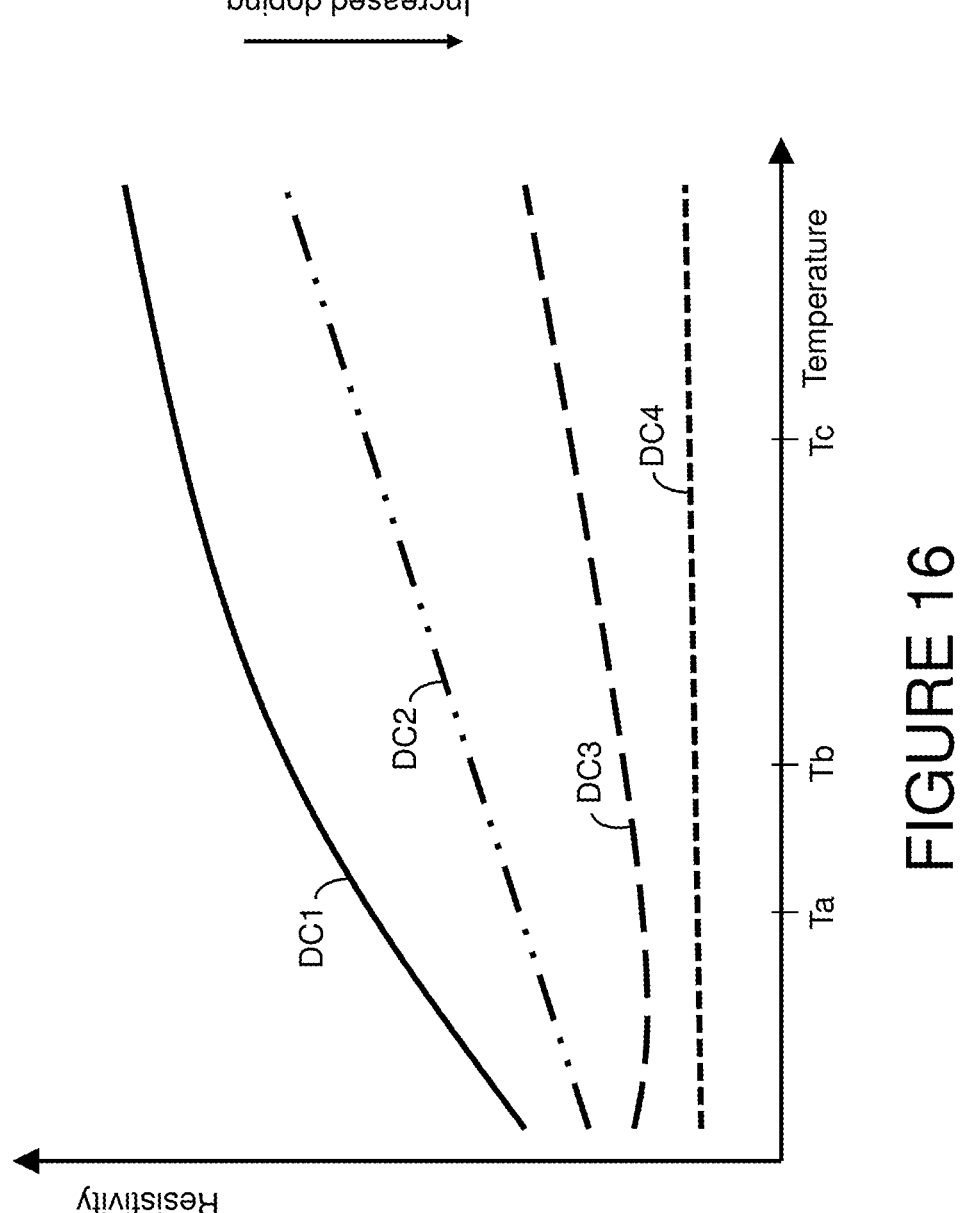
Figure 17A:
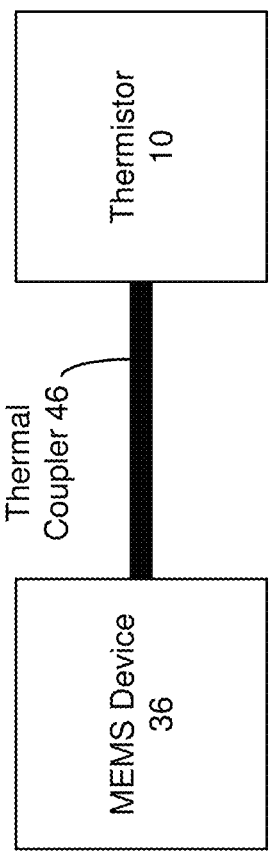
Figure 17B:
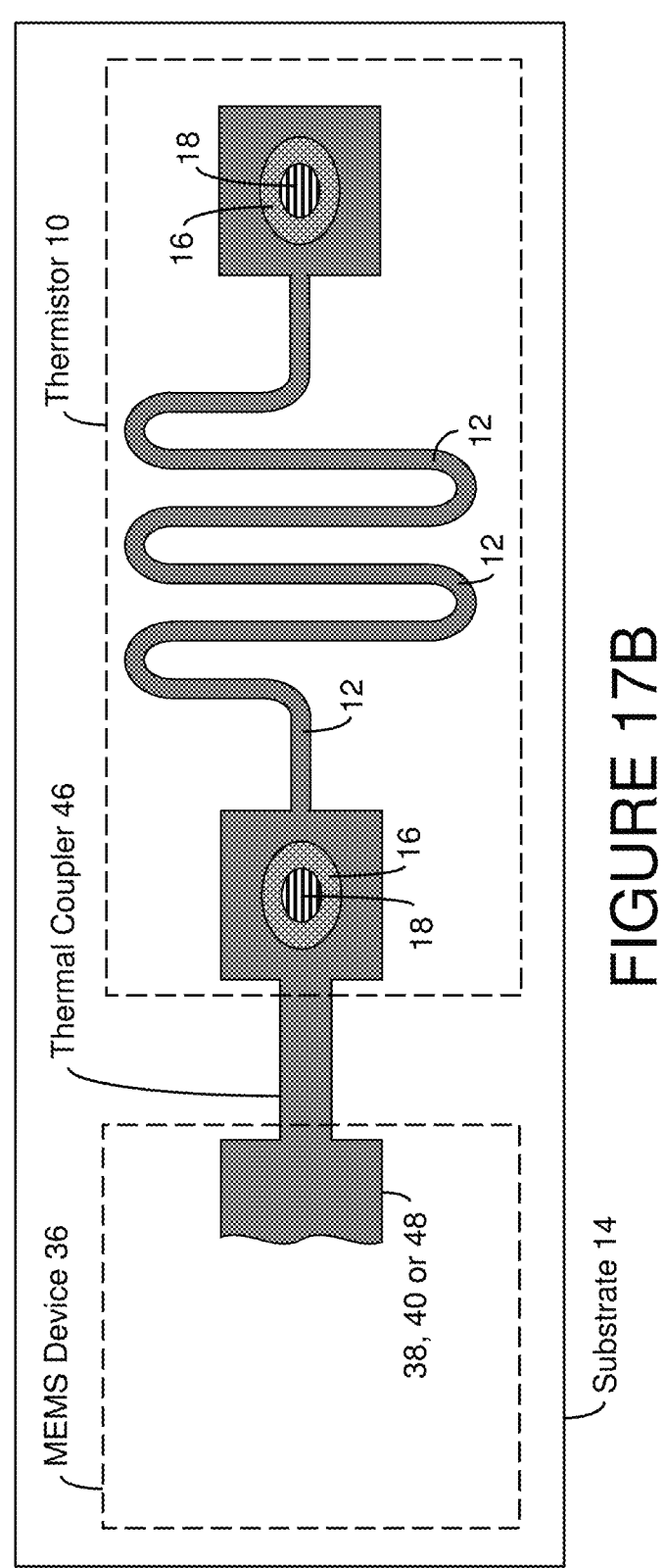
Figure 17C:
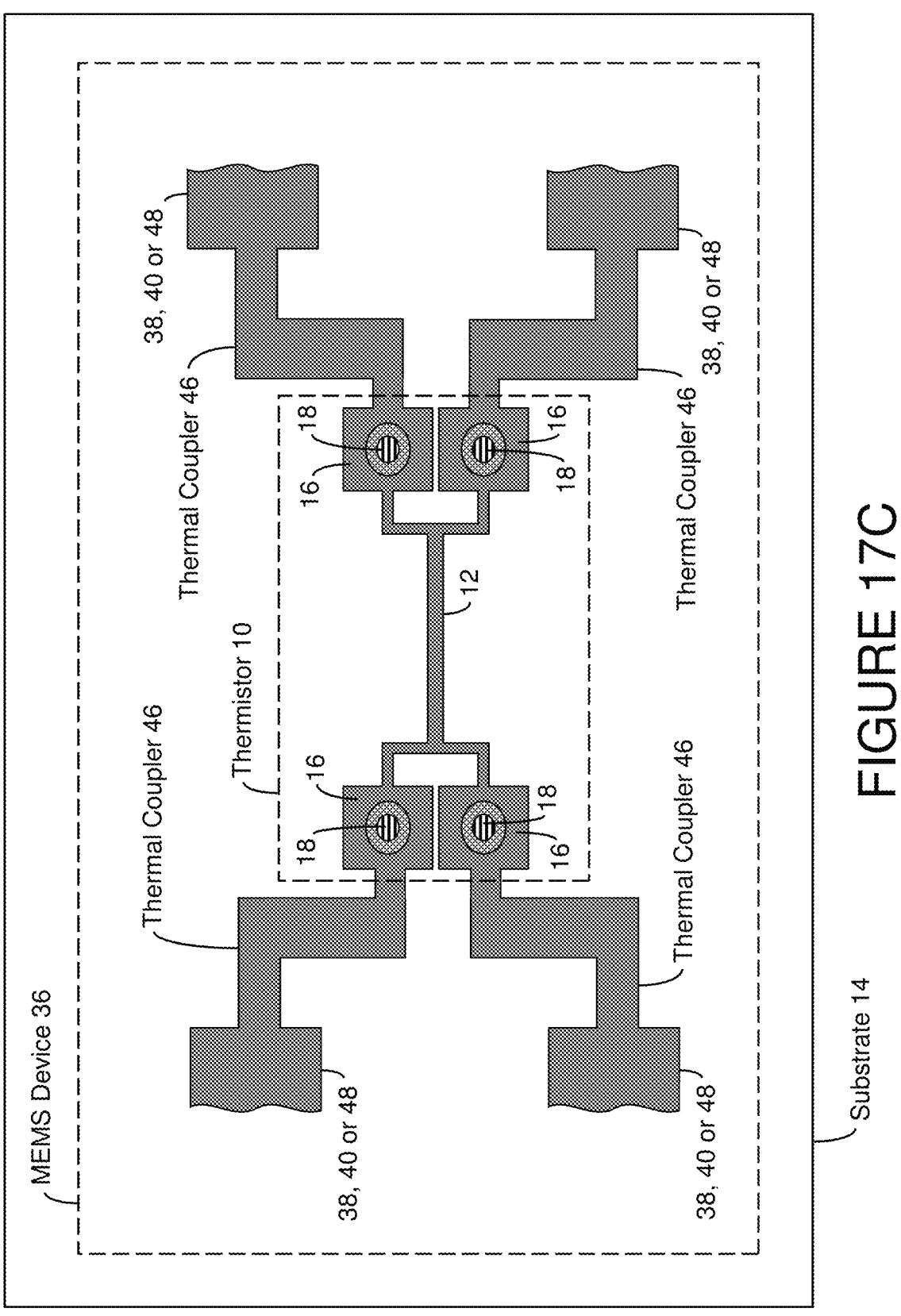
Figure 17D:
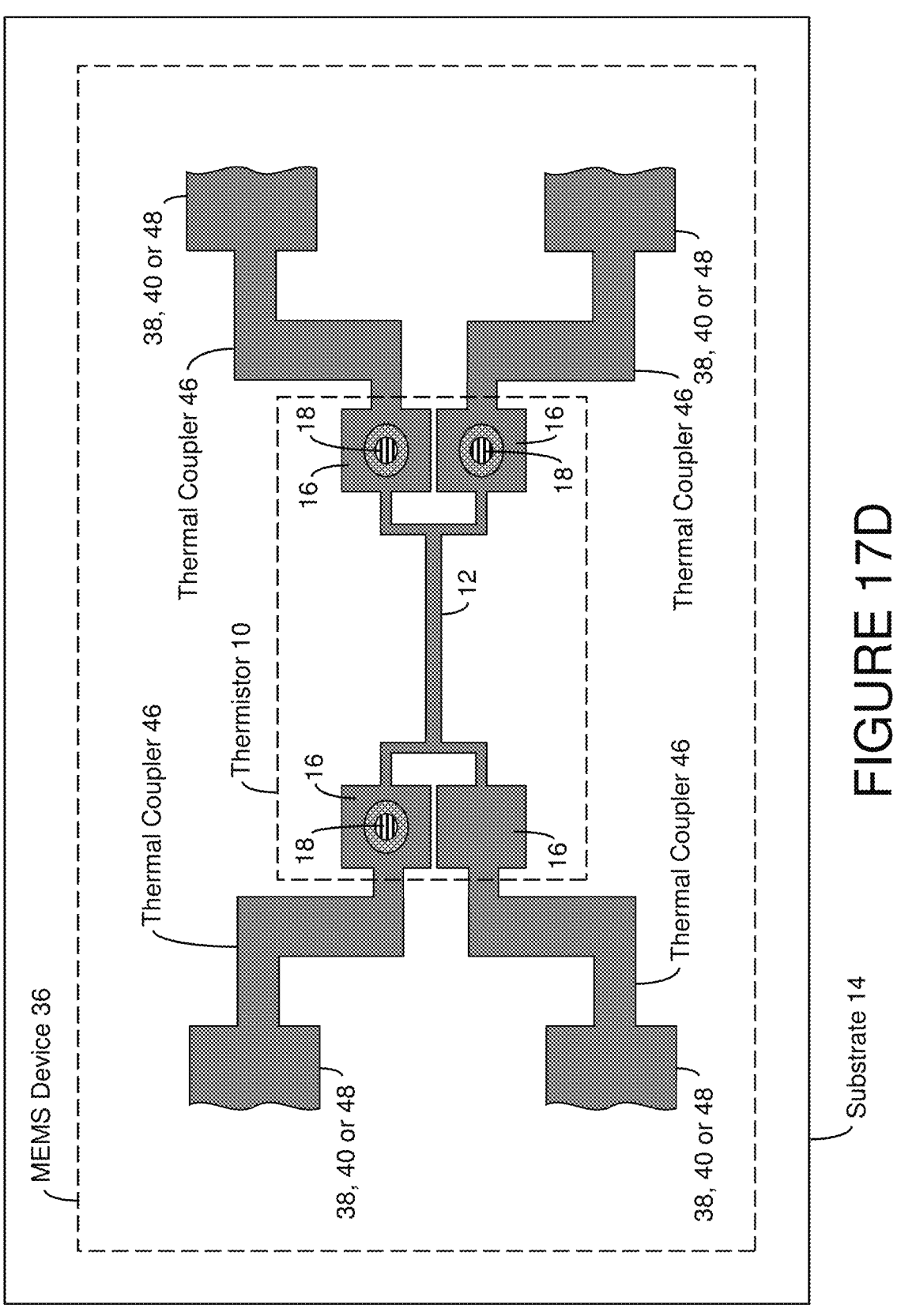
Figures 17E, 17F:
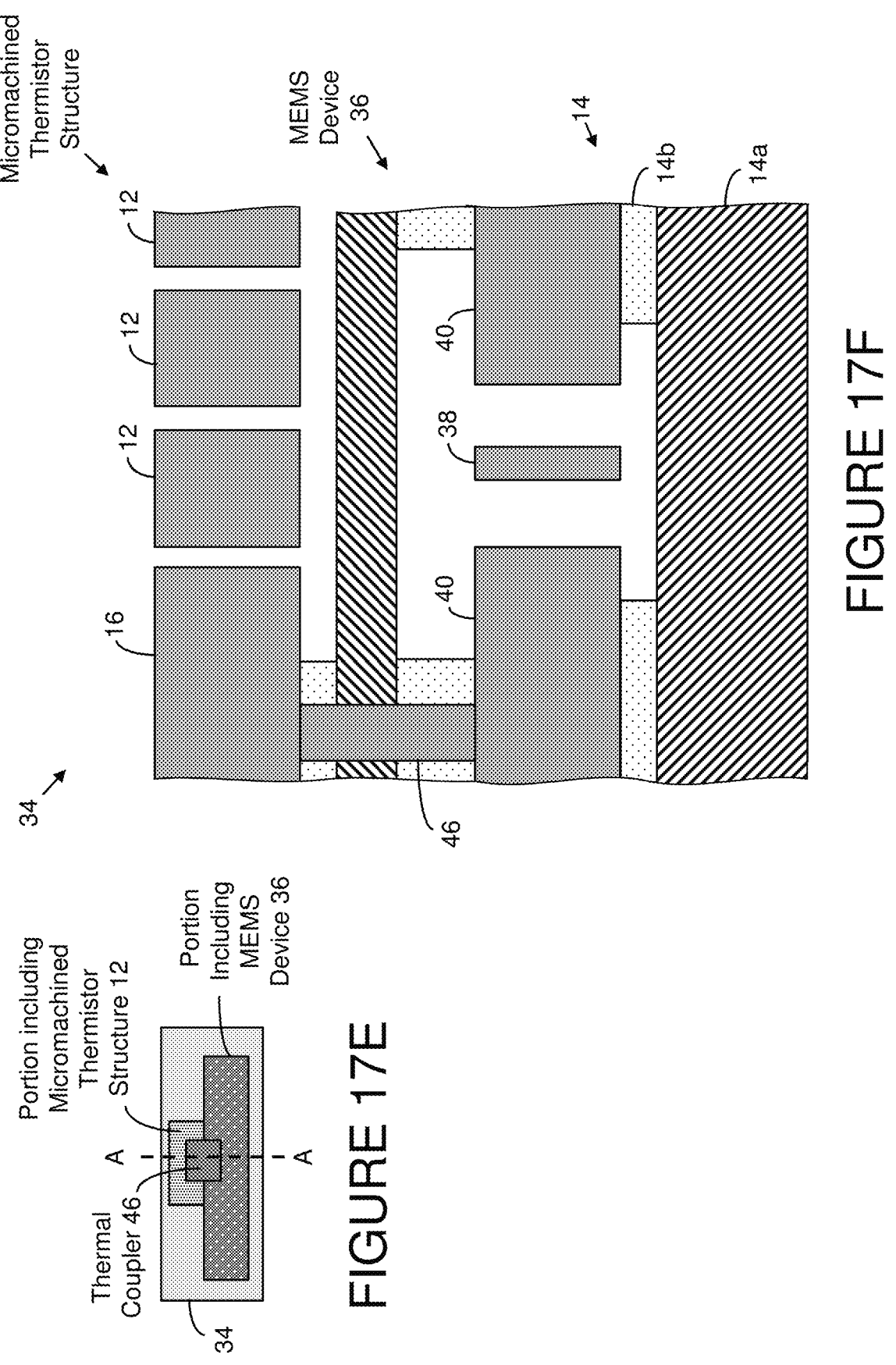
Figure 17G:
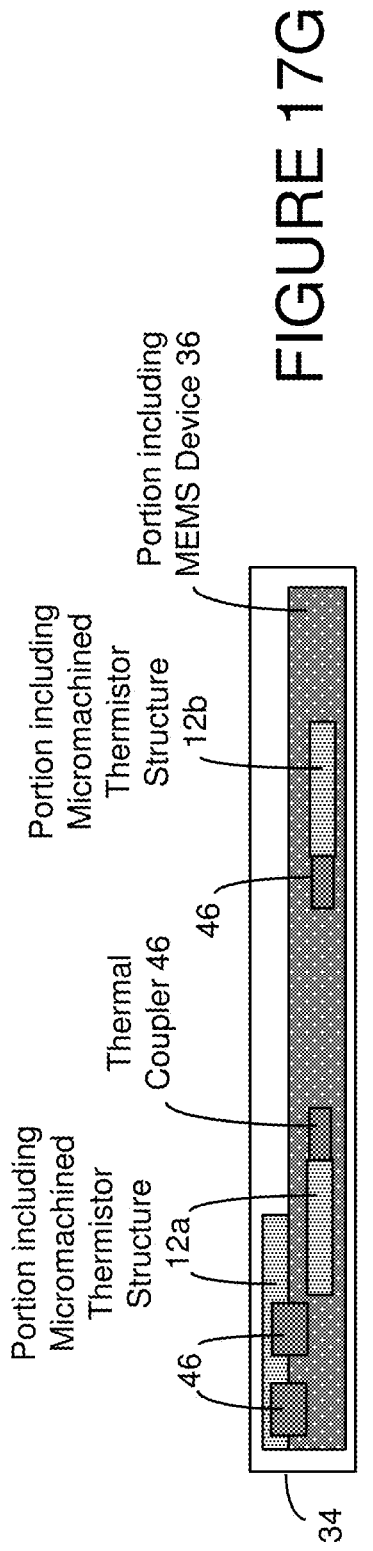
Figure 18:
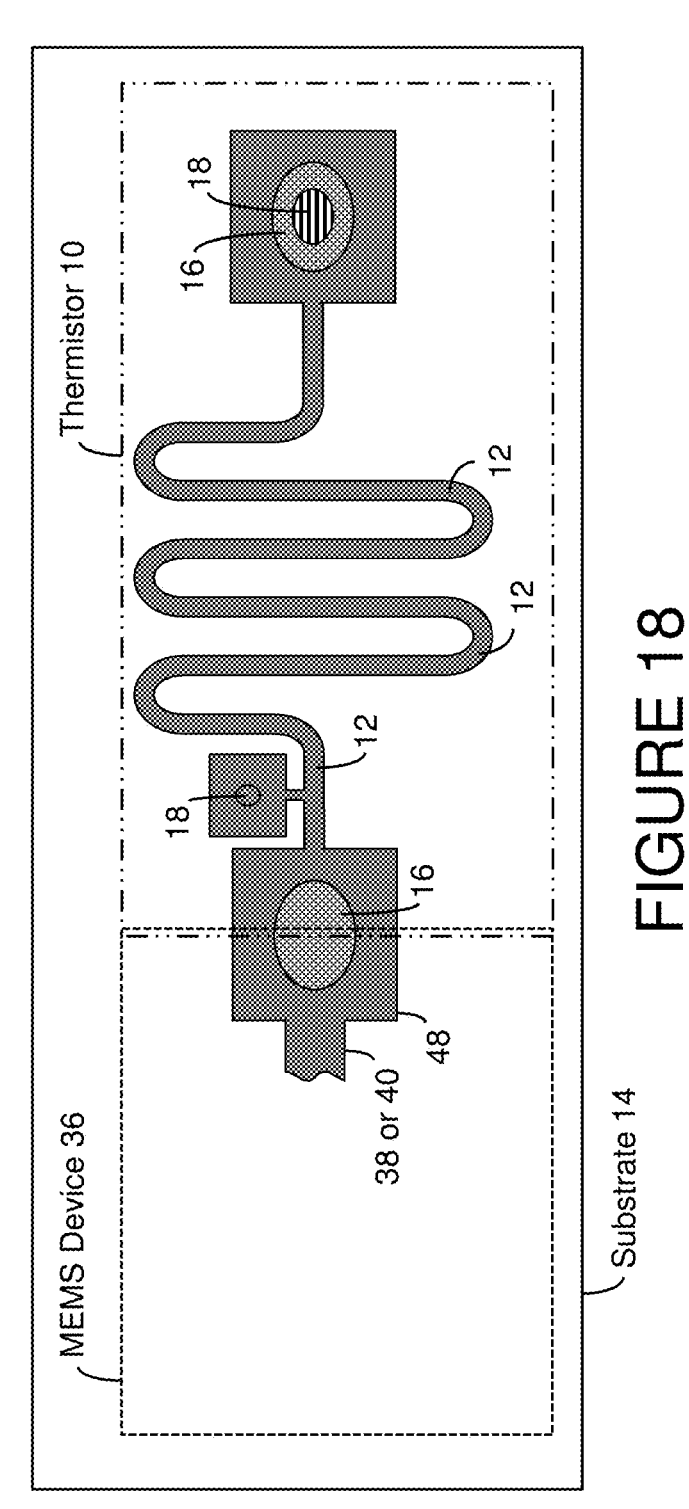
Figures 19A, 19B, 20A:
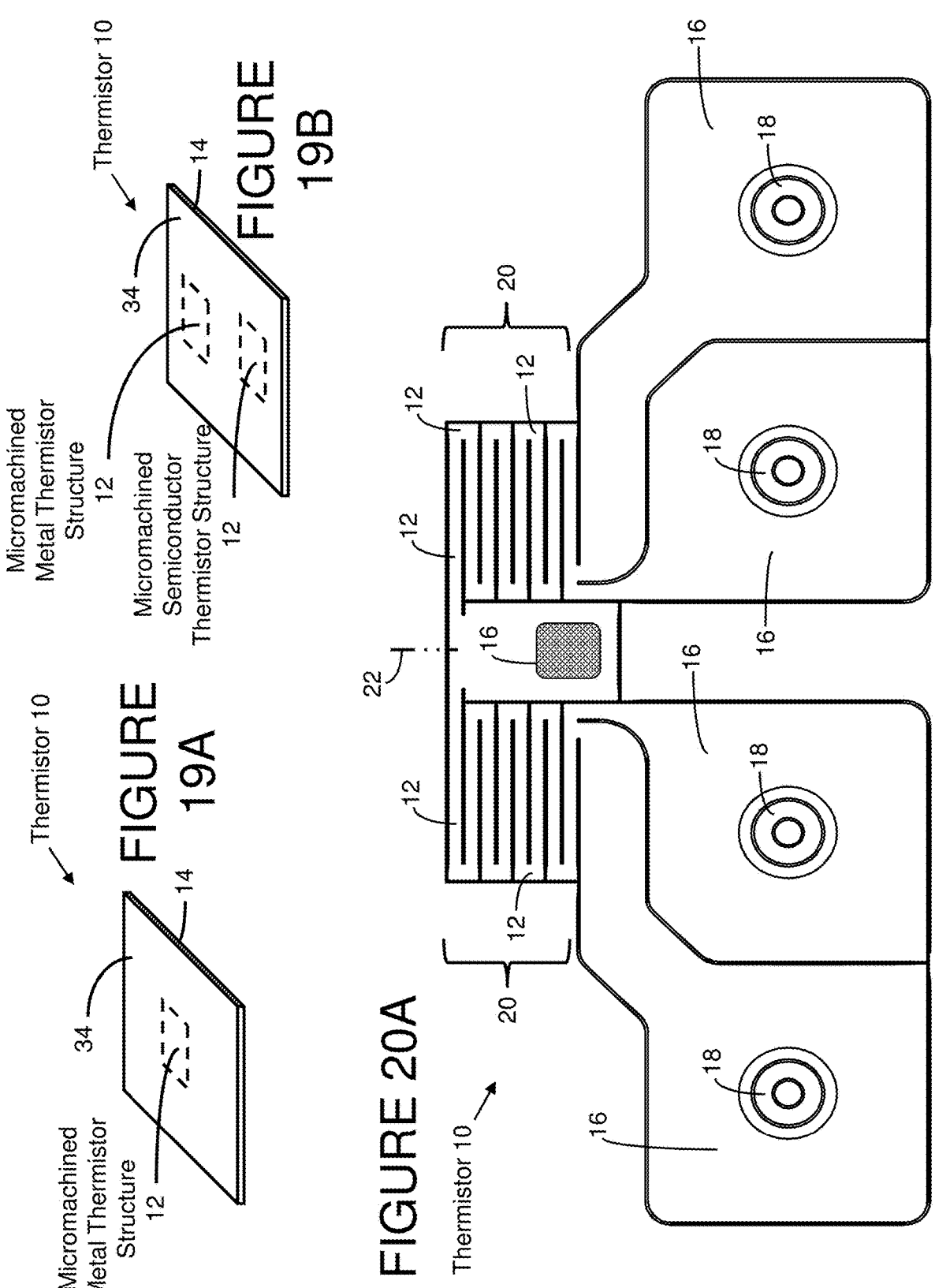
Figure 20B:
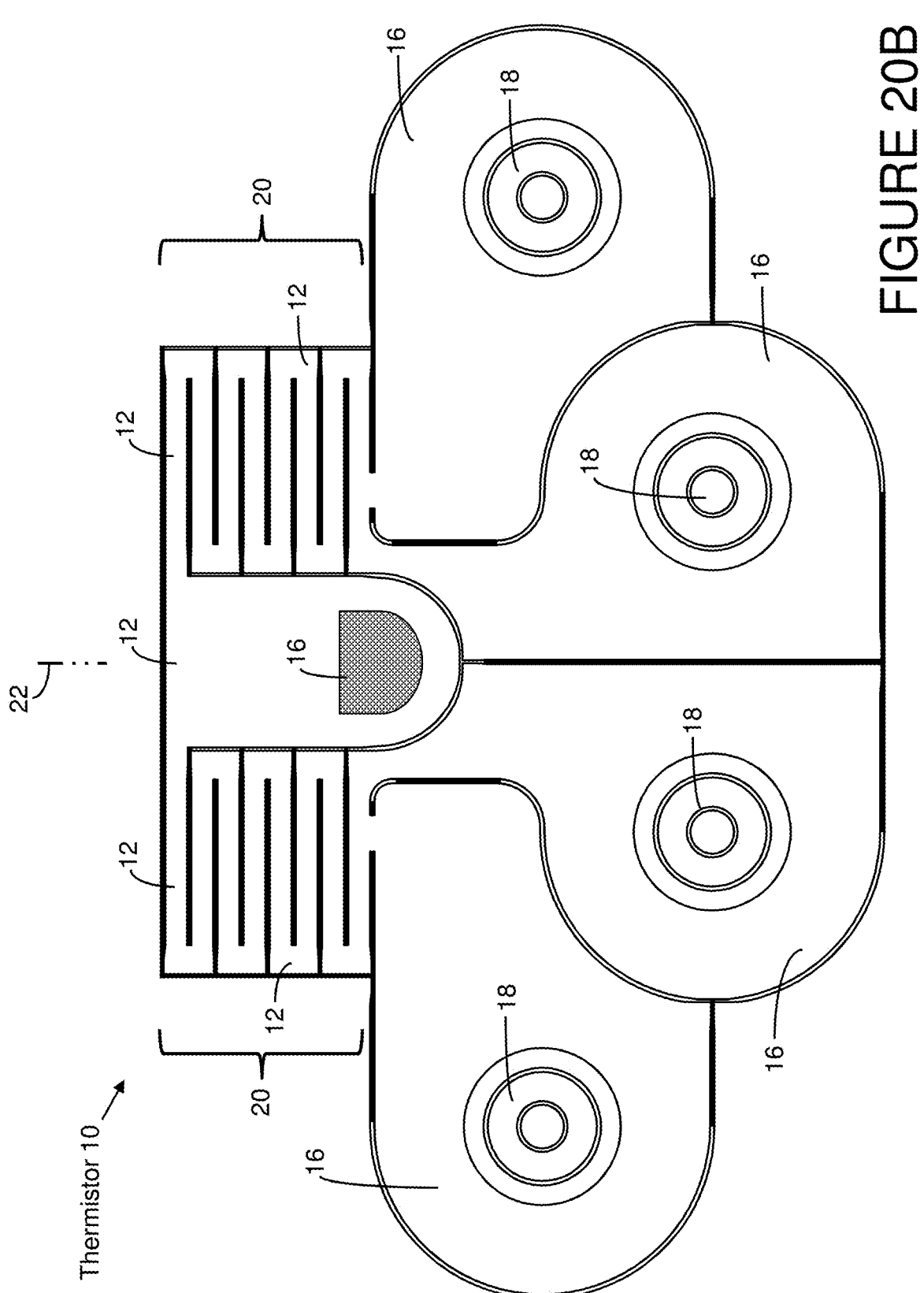
Figure 20C:
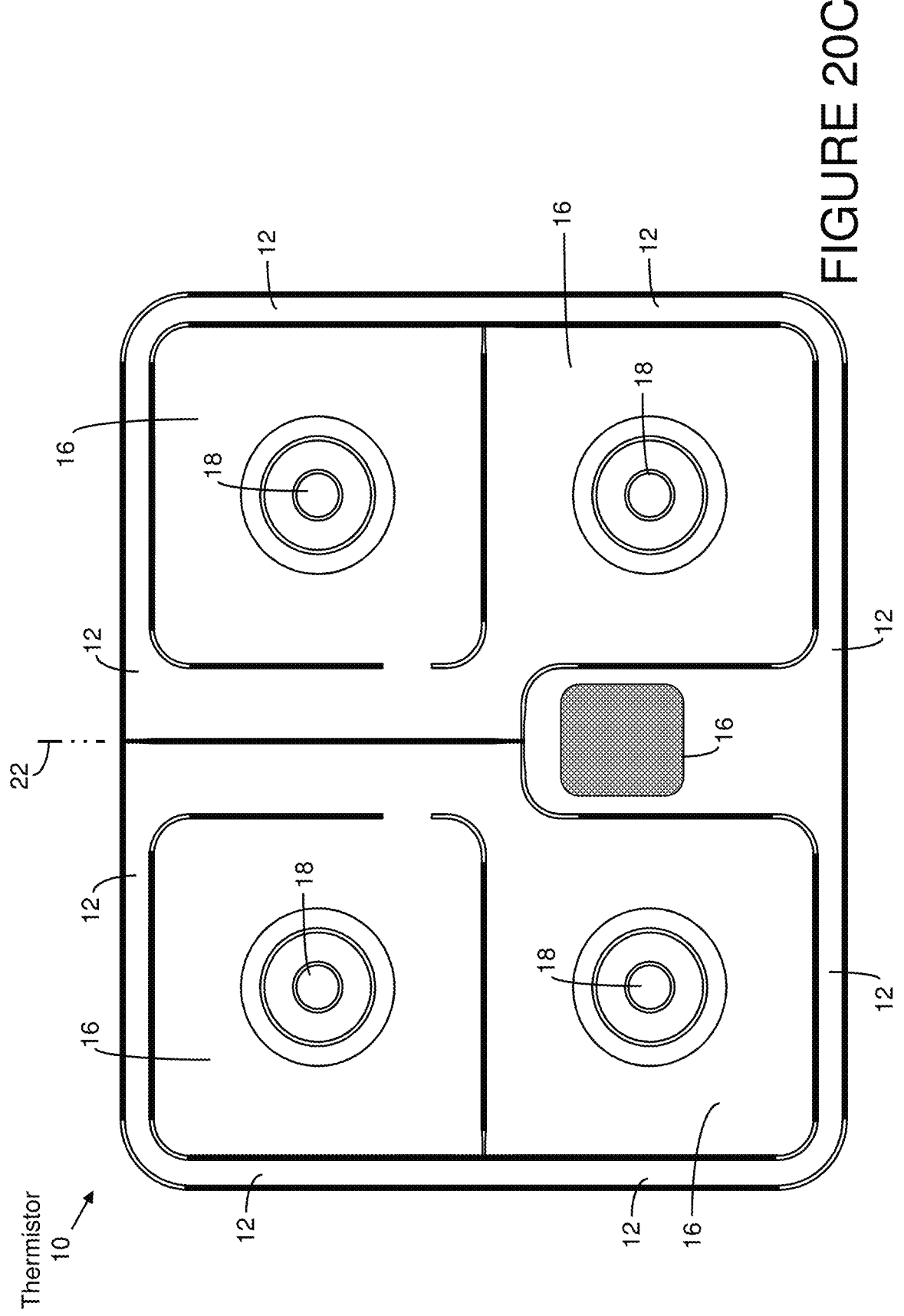
Figure 20D:
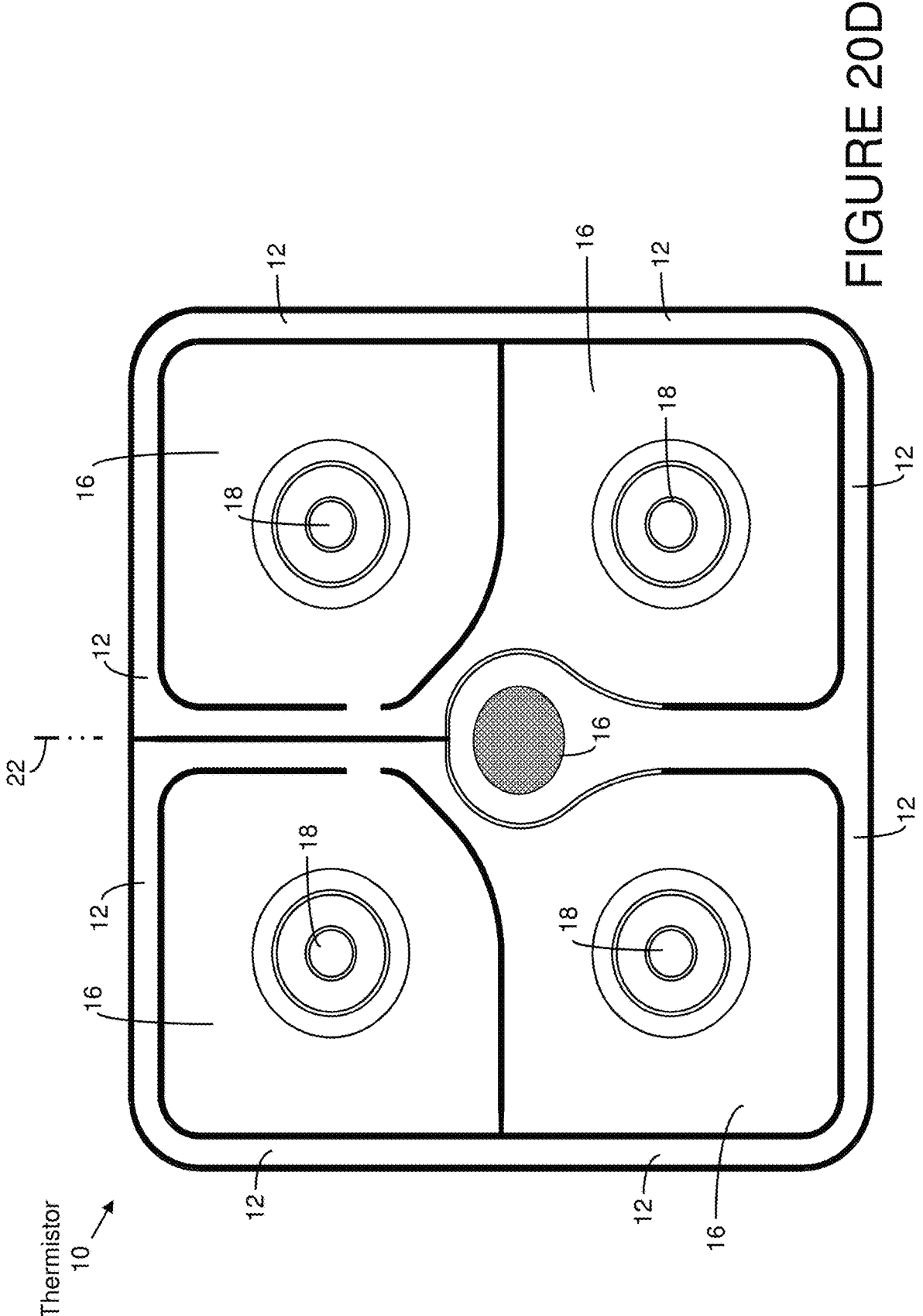
Figure 21A:
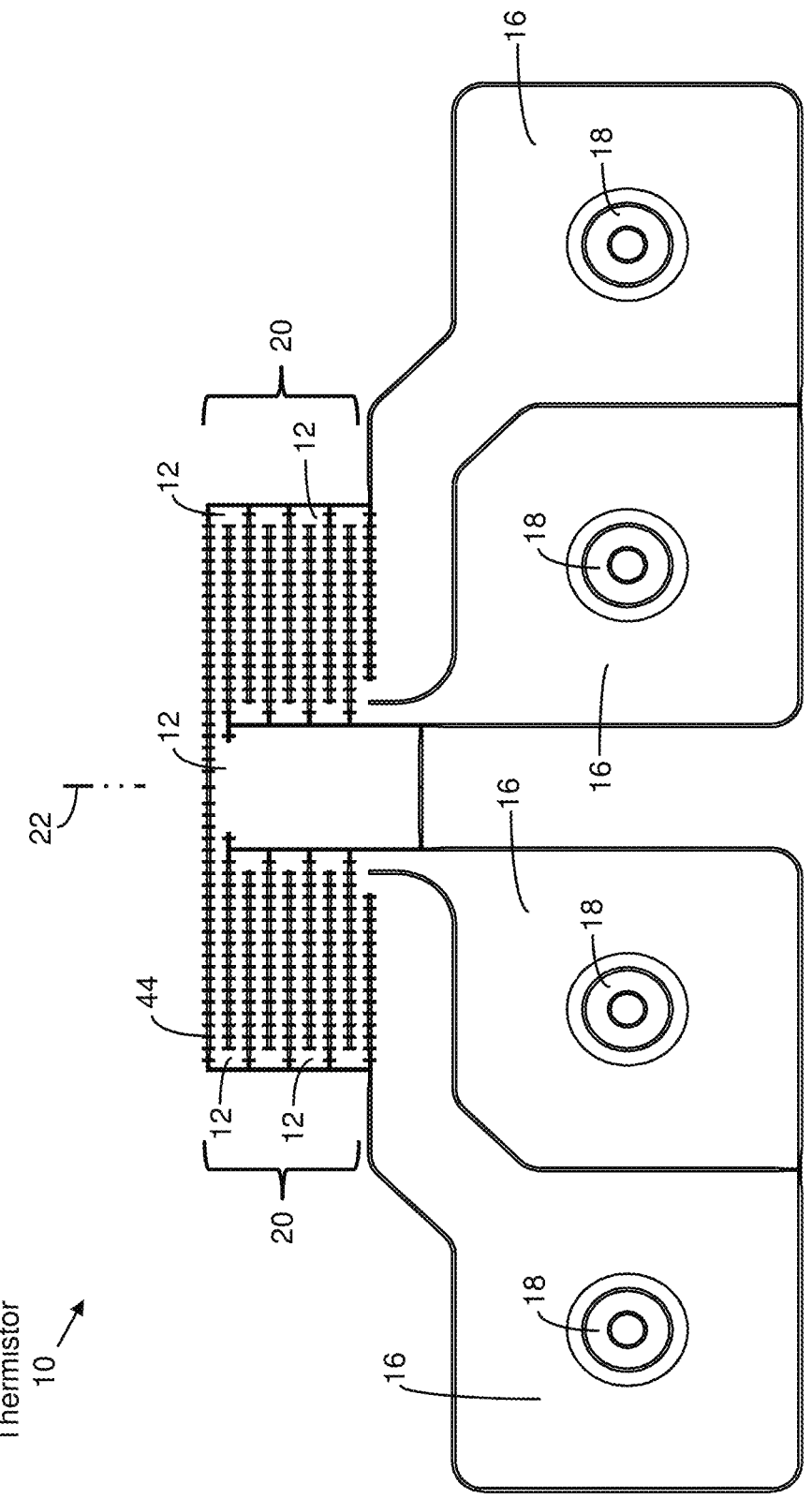
Figure 21B:
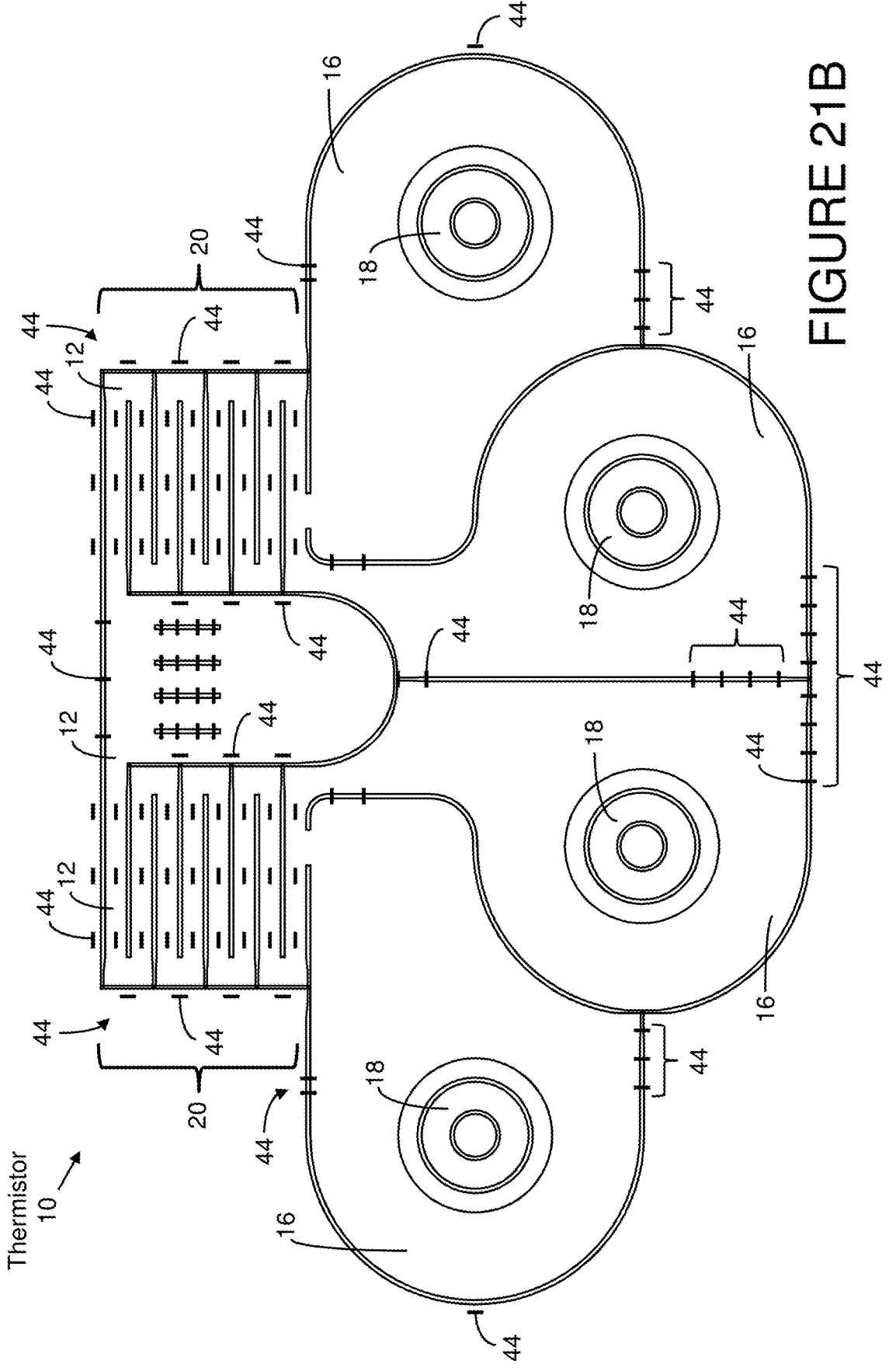
Figure 21C:
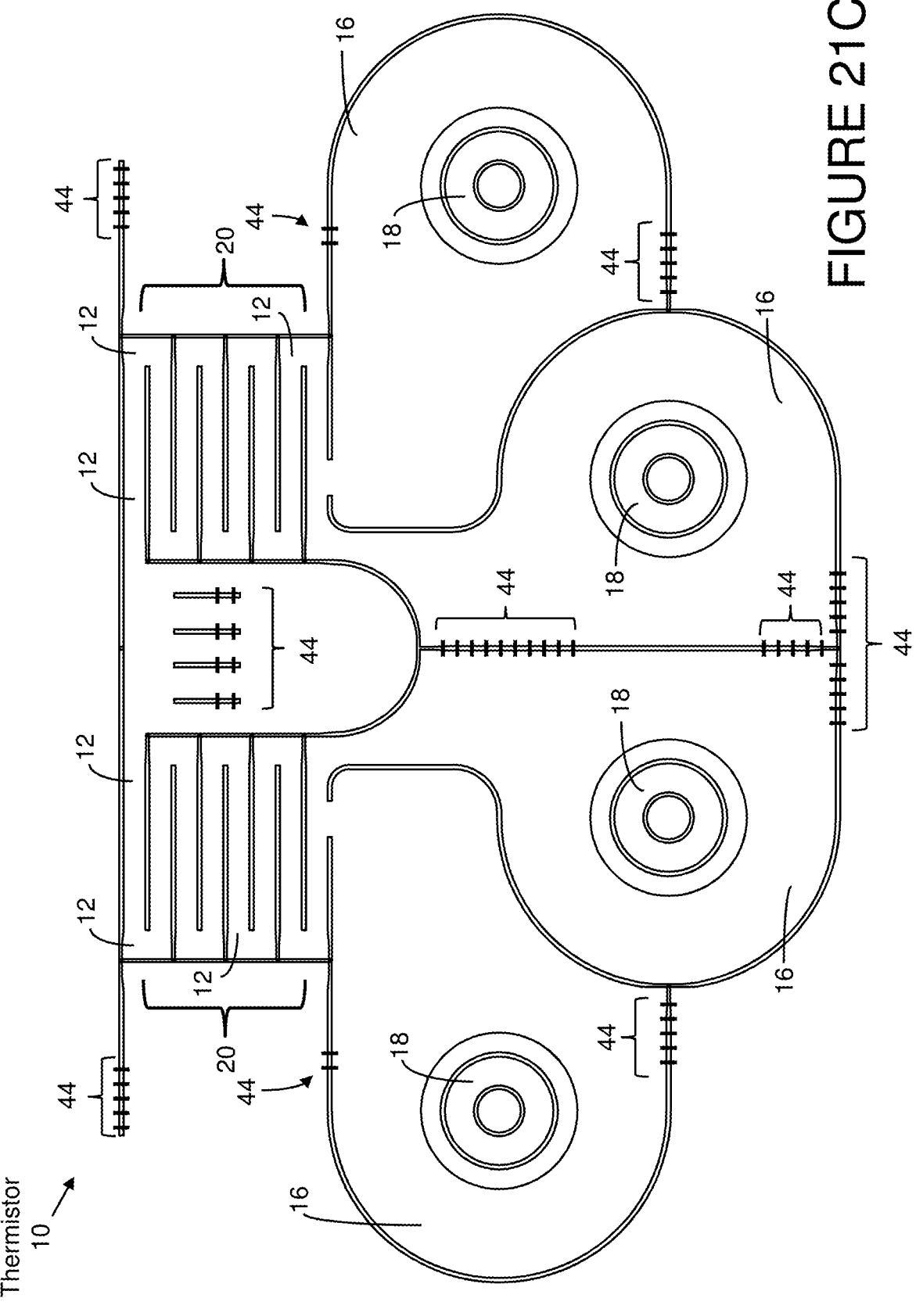
Figure 21D:
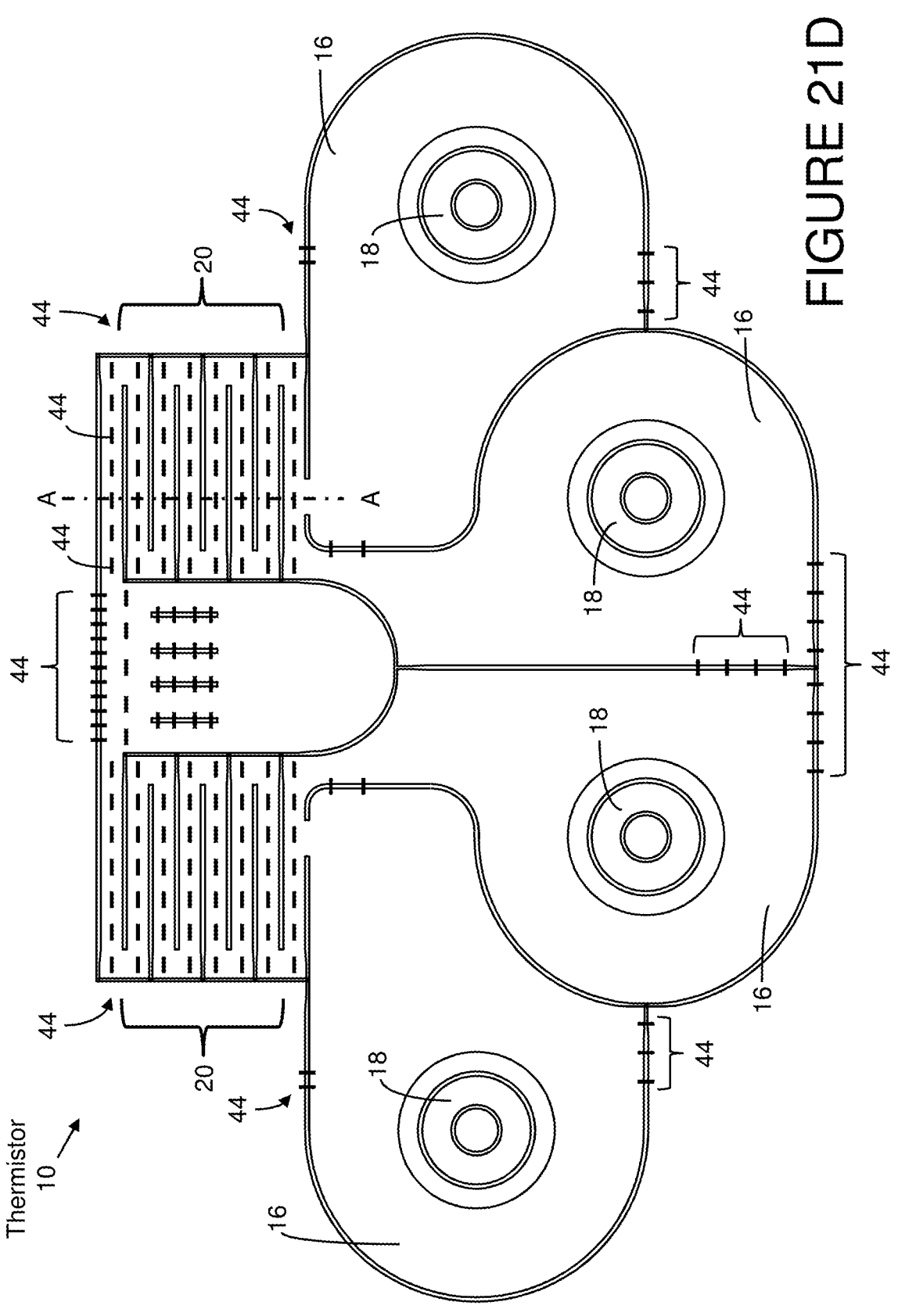
Figure 21E:
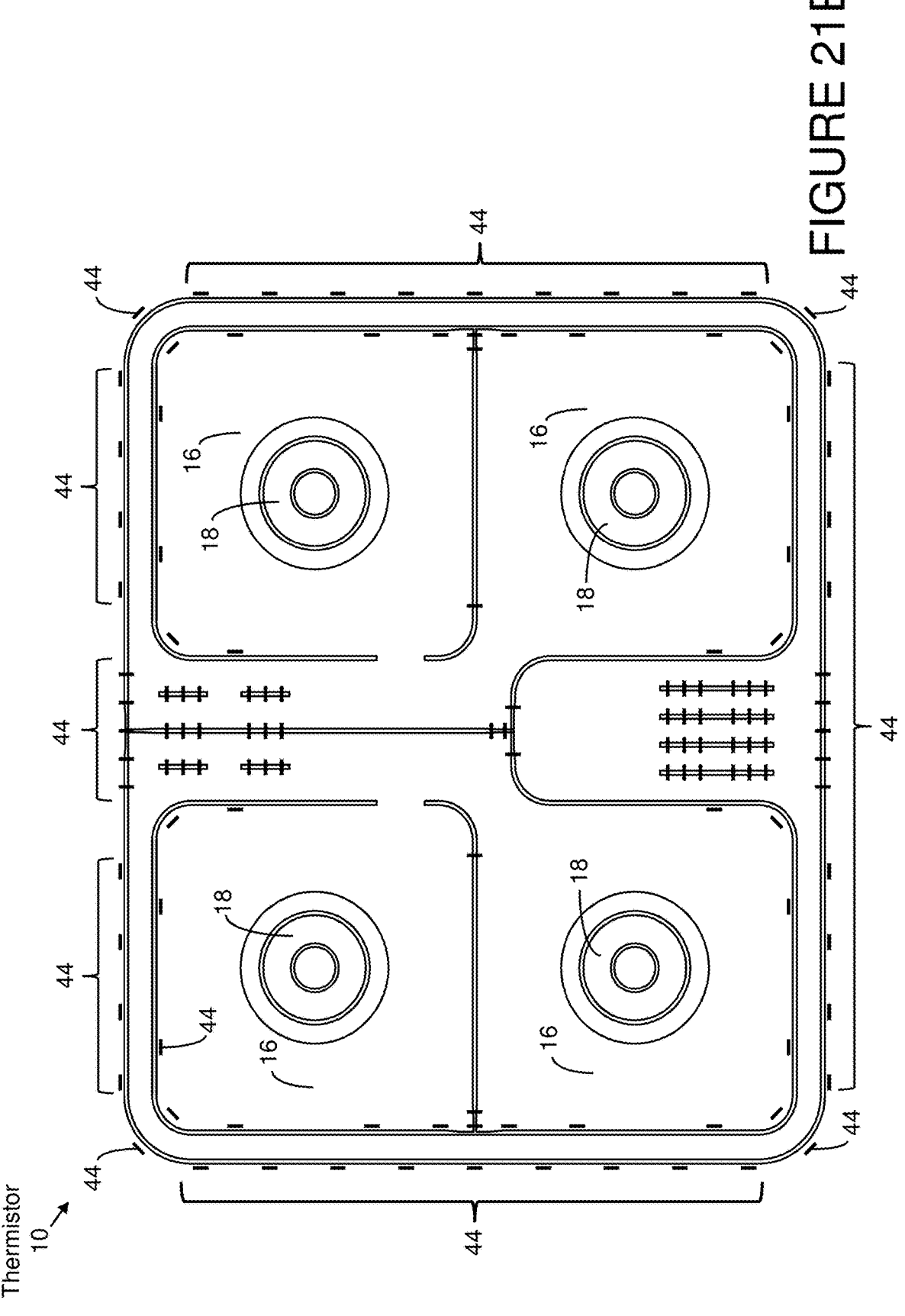
Figure 21F:
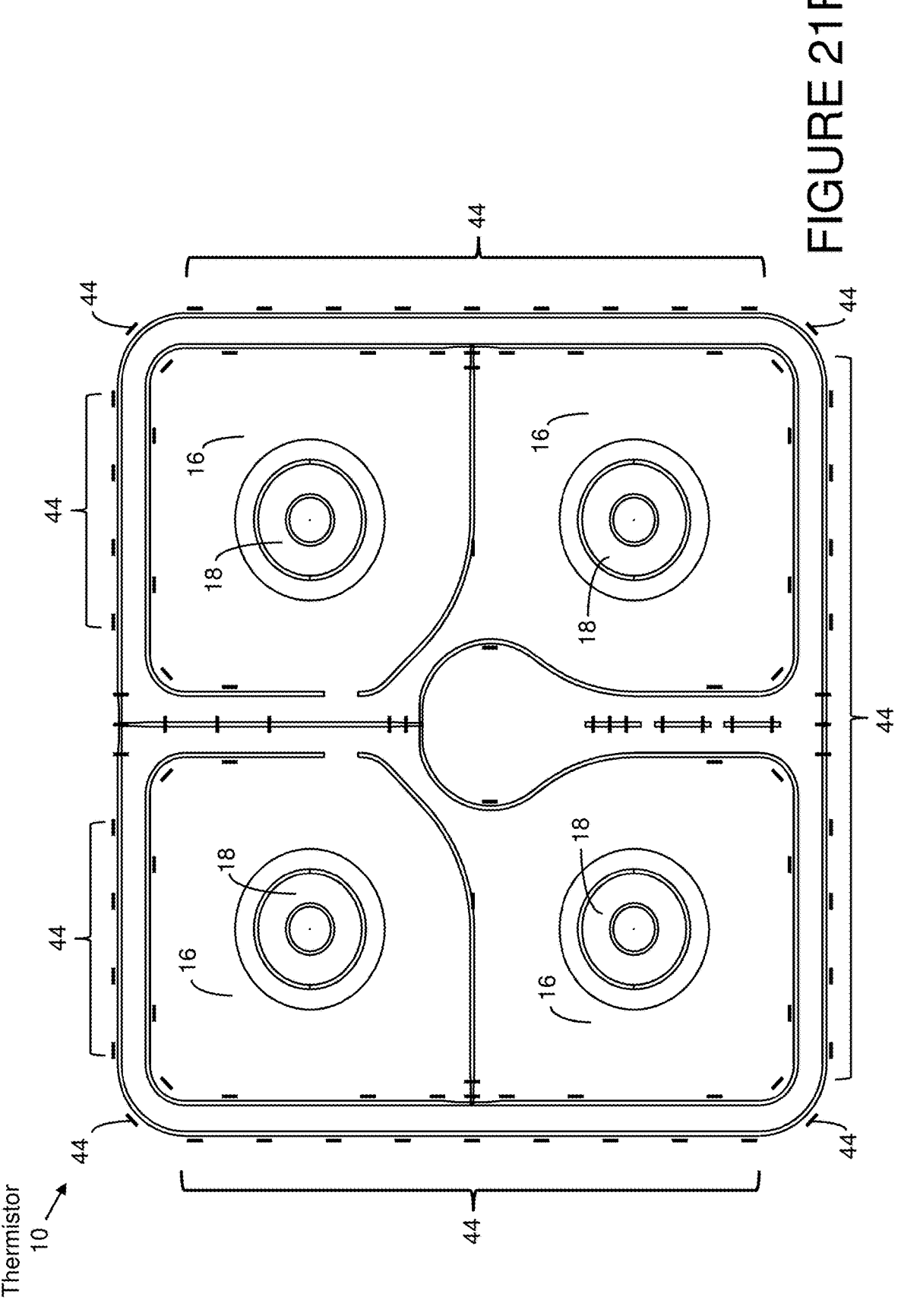

as such, the other structure (for example, MEMS or NEMS structure) and micromachined thermistor structure are "coplanar" on the die;

FIG. 15B illustrates a cross-sectional view of a micromachined thermistor structure of a thermistor, according to one or more or the present inventions, and a MEMS or NEMS structures, according to one or more of the present inventions; notably, in this illustrative embodiment, the MEMS/NEMS structure is fabricated, formed and/or disposed in or from a first active layer and the micromachined thermistor structure is fabricated, formed and/or disposed in or from a second active layer (which, relative to the substrate base, may be above or below the first active layer; and, as such, the thermistor and MEMS/NEMS device are "stacked" on the same die;

FIG. 15C illustrates a cross-sectional view of two micromachined thermistor structures of a thermistor, according to one or more or the present inventions, and a MEMS or NEMS structures, according to one or more of the present inventions; notably, in this illustrative embodiment, the MEMS/NEMS structure and one of the micromachined thermistor structures are fabricated, formed and/or disposed in or from a first active layer, and a second micromachined thermistor structure is fabricated, formed and/or disposed in or from a second active layer (which, relative to the substrate base, may be above or below the first active layer; and, as such, the thermistor and MEMS/NEMS device are coplanar and stacked on the same die;

FIG. 16 is a graphical illustration of a relationship of temperature versus resistivity for different doping concentrations of a semiconductor material wherein DC4 is greater than DC3 is greater than DC2 is greater than DC1; notably, using conventional doping techniques, the ability to control (within a predetermined tolerance or range) the doping concentration DC4 is greater than DC3 is greater than DC2 is greater than DC1, wherein the amount of doping (if any) of the thermistor may depend on or include competing consideration between temperature versus resistivity and controllability of the doping processes and uniformity;

FIG. 17A illustrates, in block diagram form, a thermal coupler disposed between a MEMS device and a thermistor, to enhance the thermal coupling between the MEMS device with the thermistor, in accordance with certain aspects and/or embodiments of the present inventions;

FIGS. 17B-17D illustrate top views of exemplary lateral thermal couplers disposed between exemplary thermistors and MEMS devices, according to certain aspects and embodiments of the present inventions;

FIG. 17E illustrates, in a general diagram form, a vertical thermal coupler disposed between a MEMS device and a thermistor, to thermal couple the MEMS device with the thermistor, in accordance with certain aspects and/or embodiments of the present inventions;

FIG. 17F illustrates a cross-sectional view of a portion of the die of FIG. 17E sectioned along A-A, wherein an exemplary vertical thermal coupler is disposed between a portion of an exemplary thermistor and a portion of a MEMS device, according to certain aspects and embodiments of the present inventions;

FIG. 17G illustrates, in a general diagram form, horizontal/lateral and vertical thermal couplers disposed between MEMS device(s) and a thermistor, to thermally couple the MEMS device(s) with the thermistor, in accordance with certain aspects and/or embodiments of the present inventions;

FIG. 18 illustrate a top view of exemplary an exemplary thermistor which shares structural features with a MEMS device, according to certain aspects and embodiments of the present inventions;

FIGS. 19A and 19B illustrate discrete thermistor devices, in accordance with aspects and/or embodiments of the present inventions, wherein the thermistor of FIG. 19A includes a micromachined metal thermistor structure and FIG. 19B includes a micromachined metal thermistor structure and a micromachined semiconductor thermistor structure; notably, although at times the description below may appear to be directed to a micromachined semiconductor thermistor structure, the inventions, embodiments and features are entirely applicable to a micromachined metal thermistor structure and, although for the sake of brevity, the discussion is not repeated specifically in the context of the micromachined metal thermistor structure-one skilled in the art understands that such inventions, embodiments and features are entirely applicable to micromachined metal thermistor structure according to the aspects and embodiments of the present inventions;

FIGS. 20A-20D illustrate top views of exemplary thermistors according to certain aspects and embodiments of the present inventions wherein the exemplary thermistor may include four or more anchors which secure, attach and/or physically couple the thermistor structure to the substrate, electrical contacts disposed or integrated in or on one or more of the anchors, and a micromachined thermistor structure includes (i) a loop-shape and, in FIGS. 20A and 20B, (ii) a serpentine or undulating shape;

FIGS. 21A-21F illustrate top views of exemplary thermistors according to certain aspects and embodiments of the present inventions wherein the exemplary thermistor are released via the vents; the vents may be located (i) directly over portions of the micromachined thermistor structure (see FIGS. 21A, 21B and 21D), and/or (ii) remote from portions of the micromachined thermistor structure (see FIG. 21C), and/or (iii) adjacent to portions of structure 12 (see FIGS. 21E and 21F)

Figure 22A:
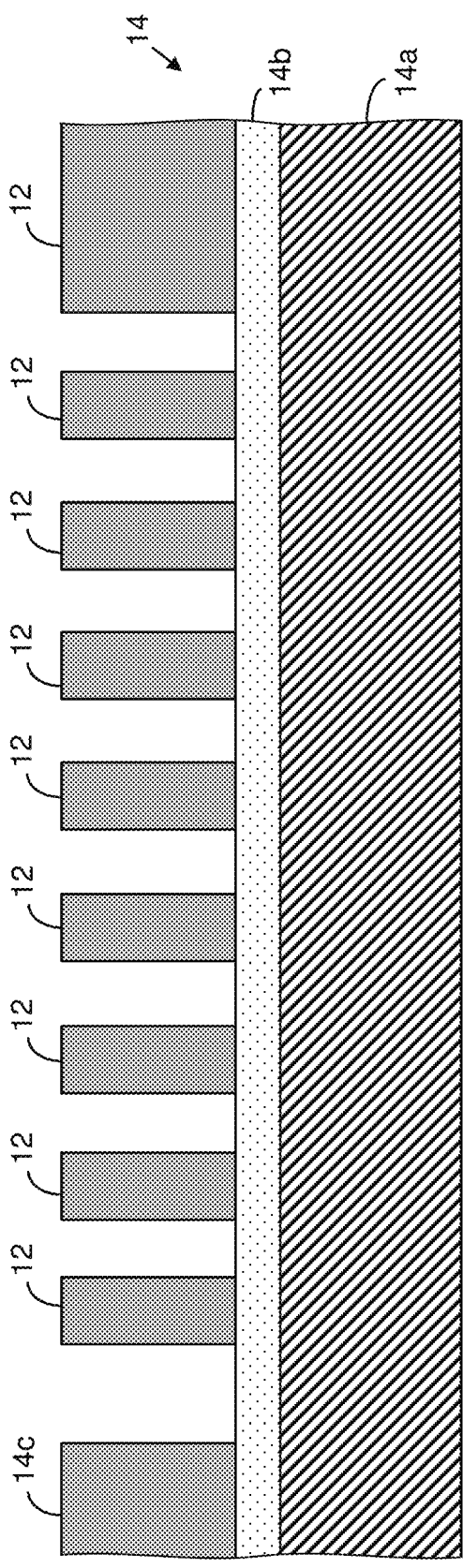
Figure 22B:
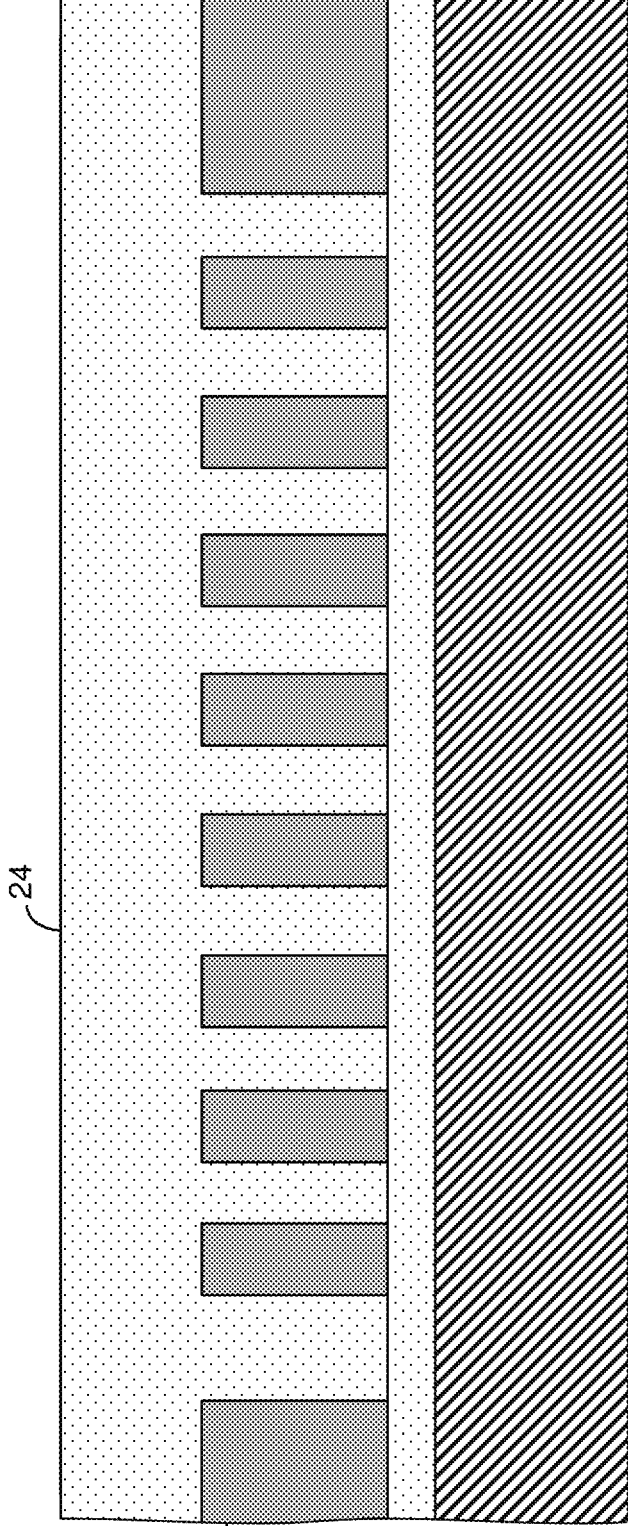
Figure 22C:
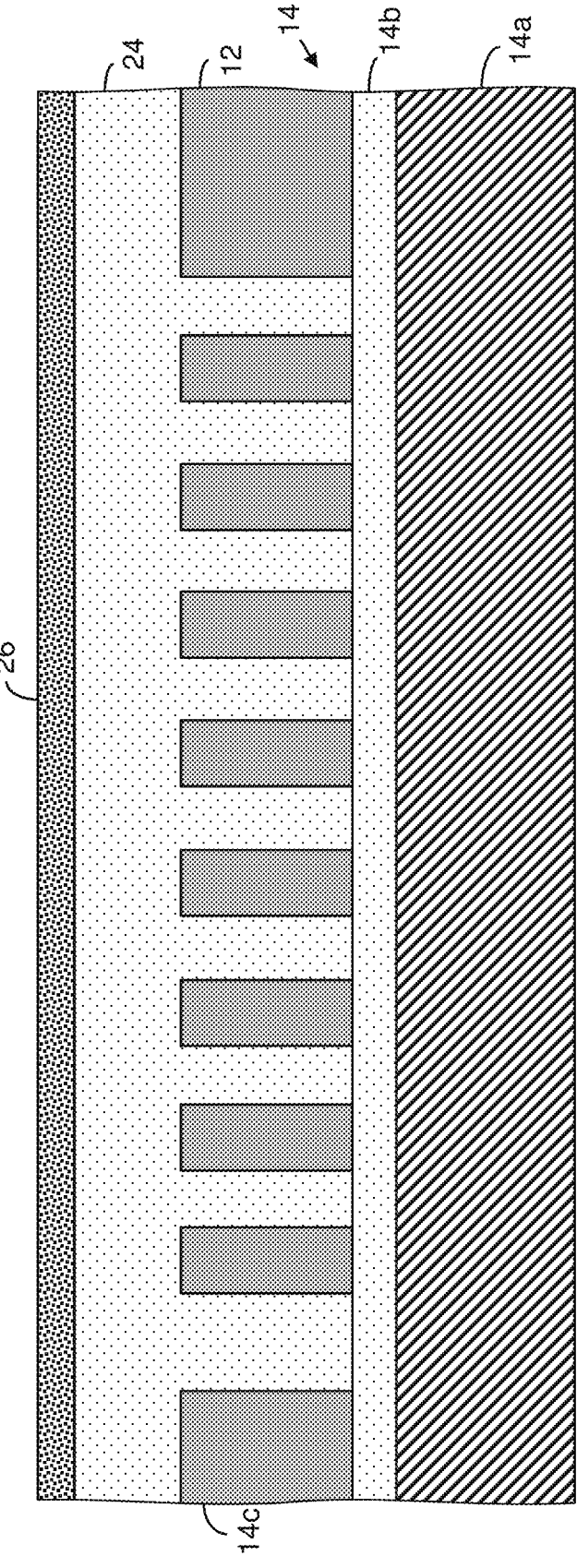
Figure 22D:
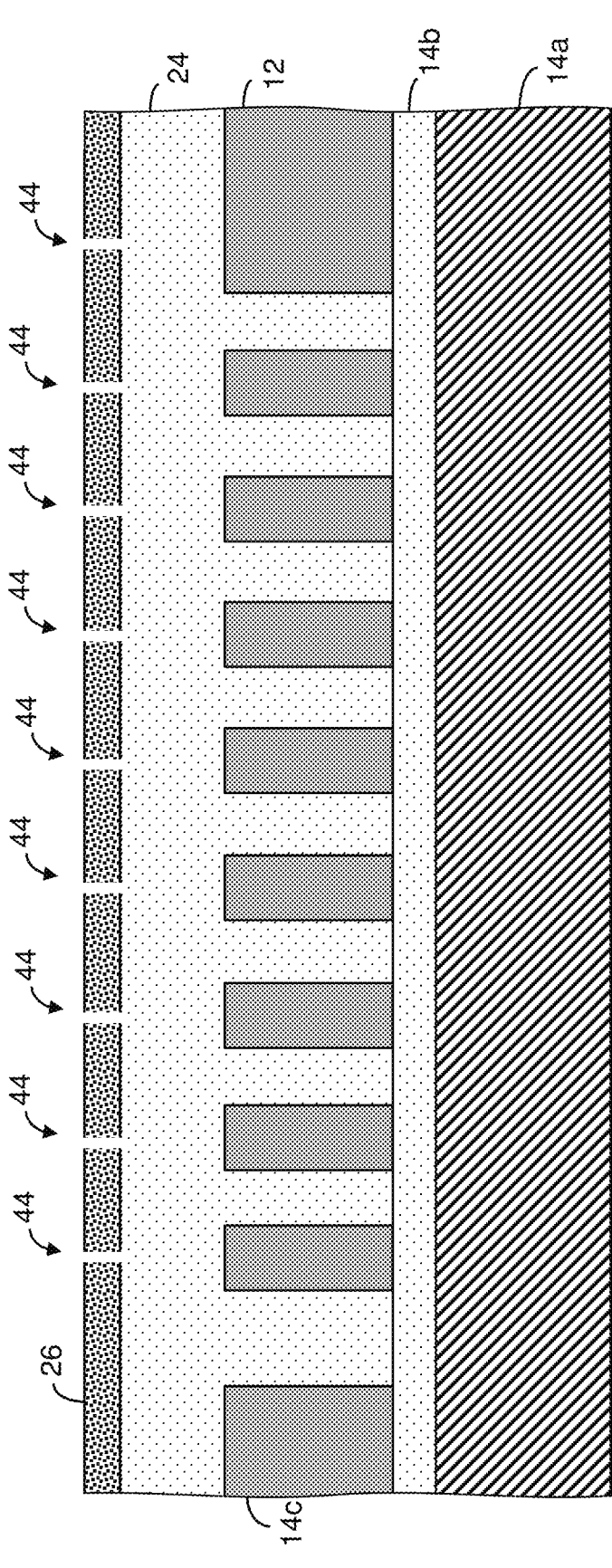
Figure 22E:
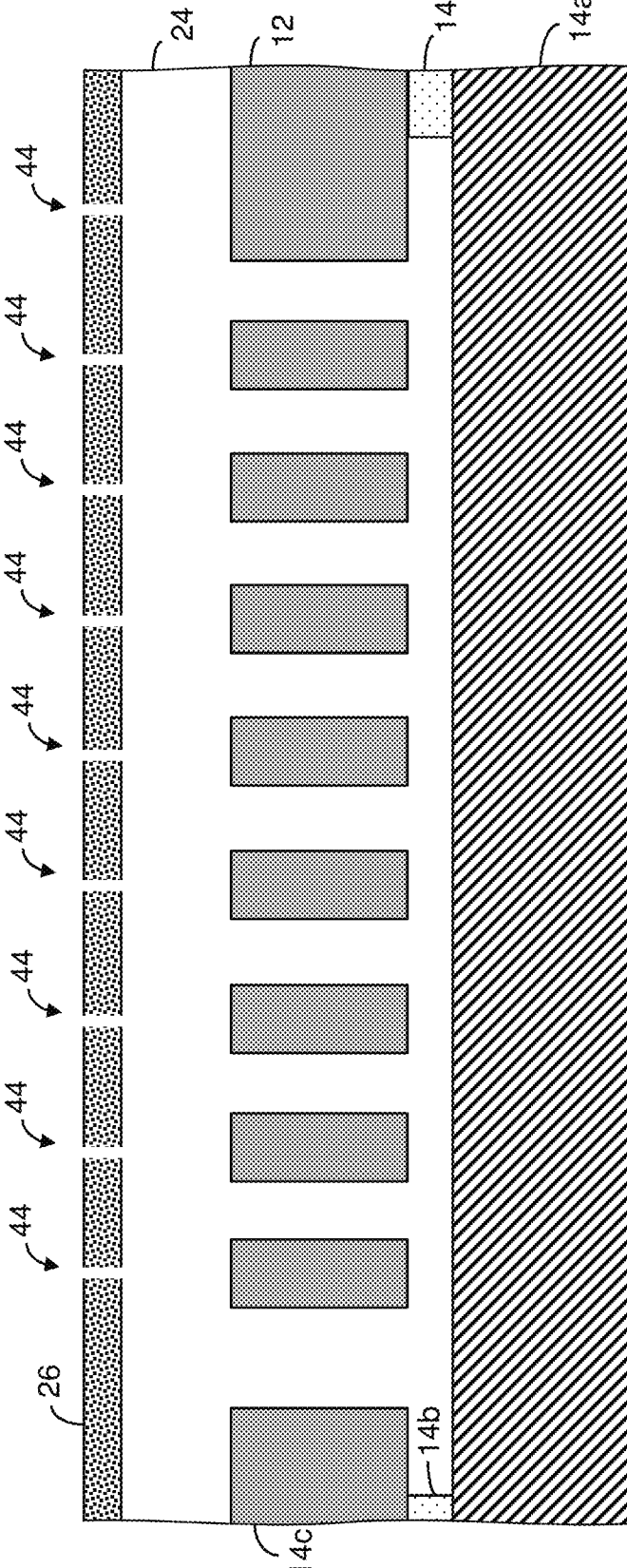
Figure 22F:
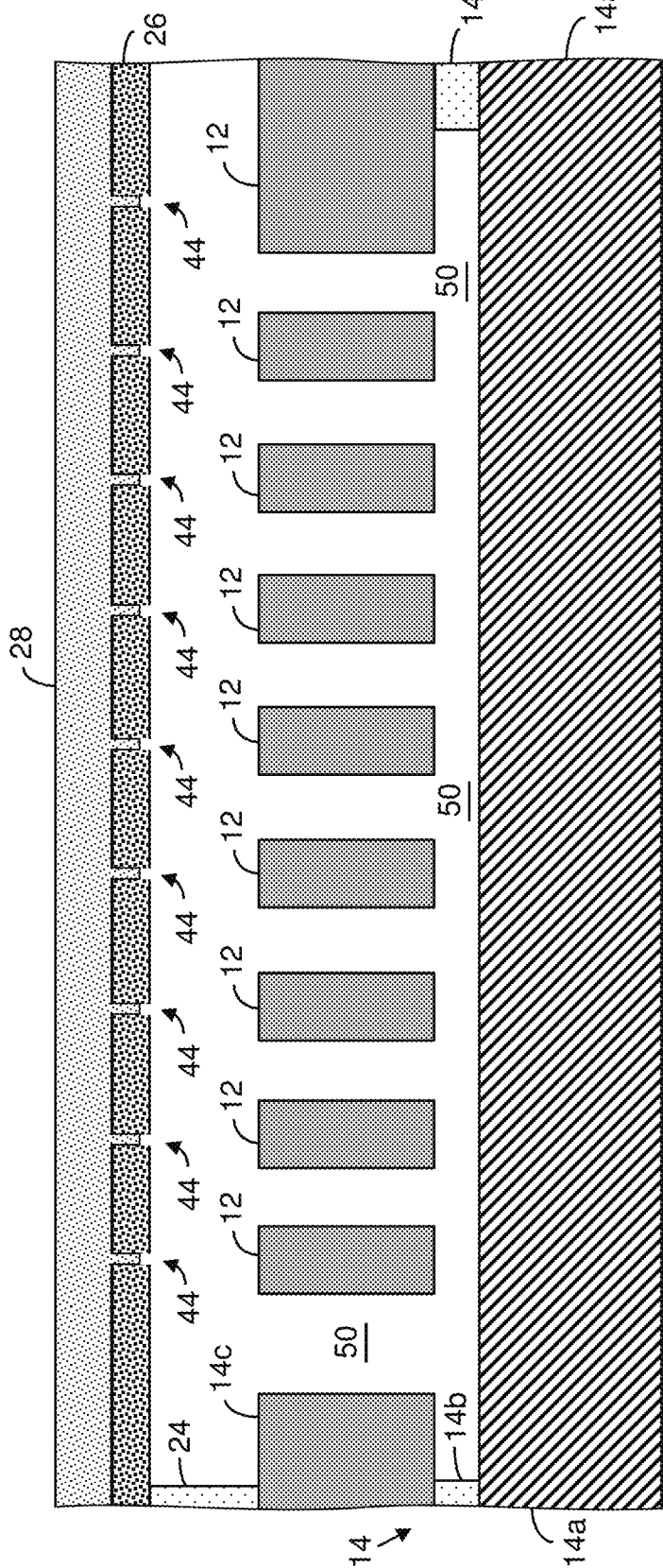
Figure 23A:
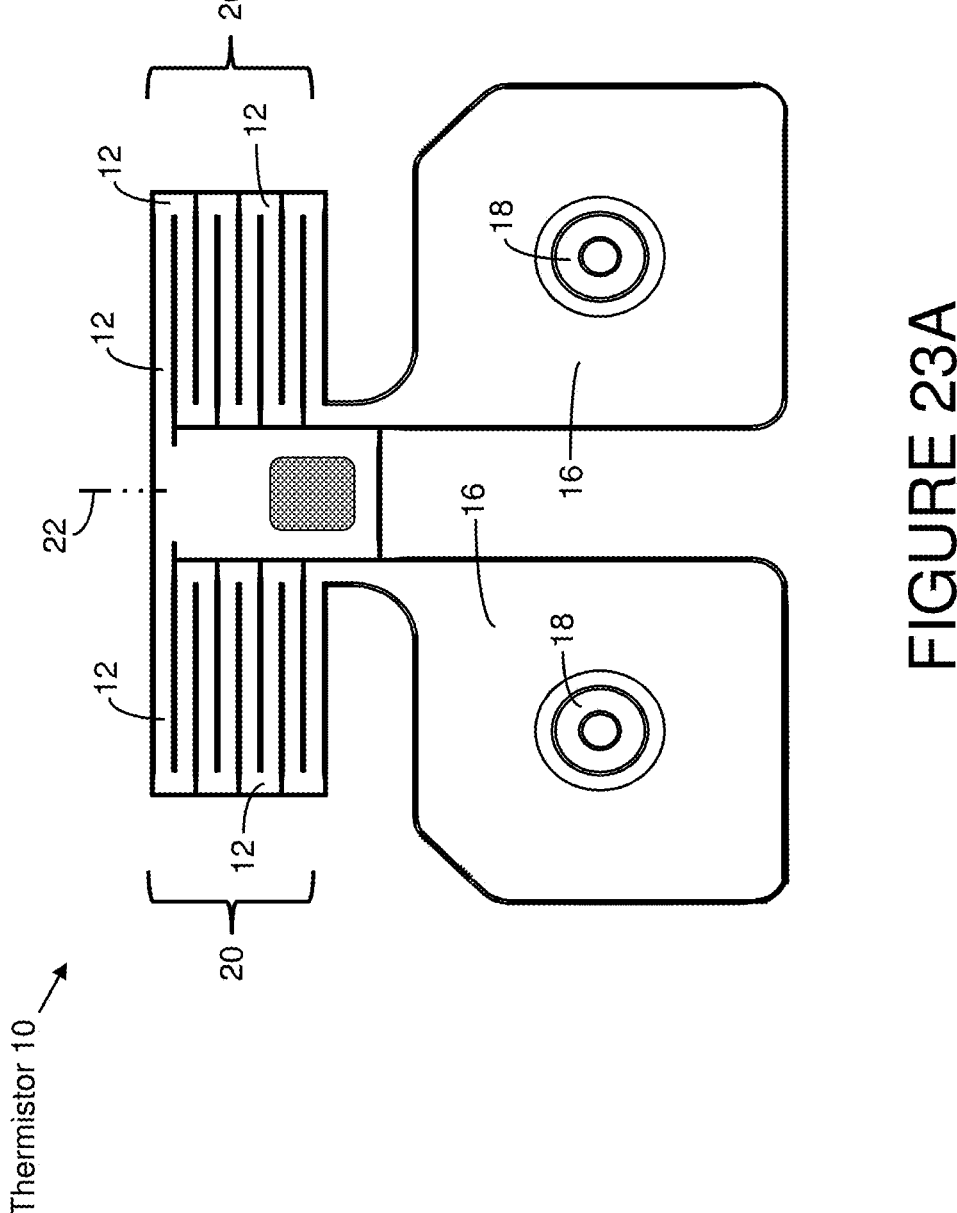
Figure 23B:
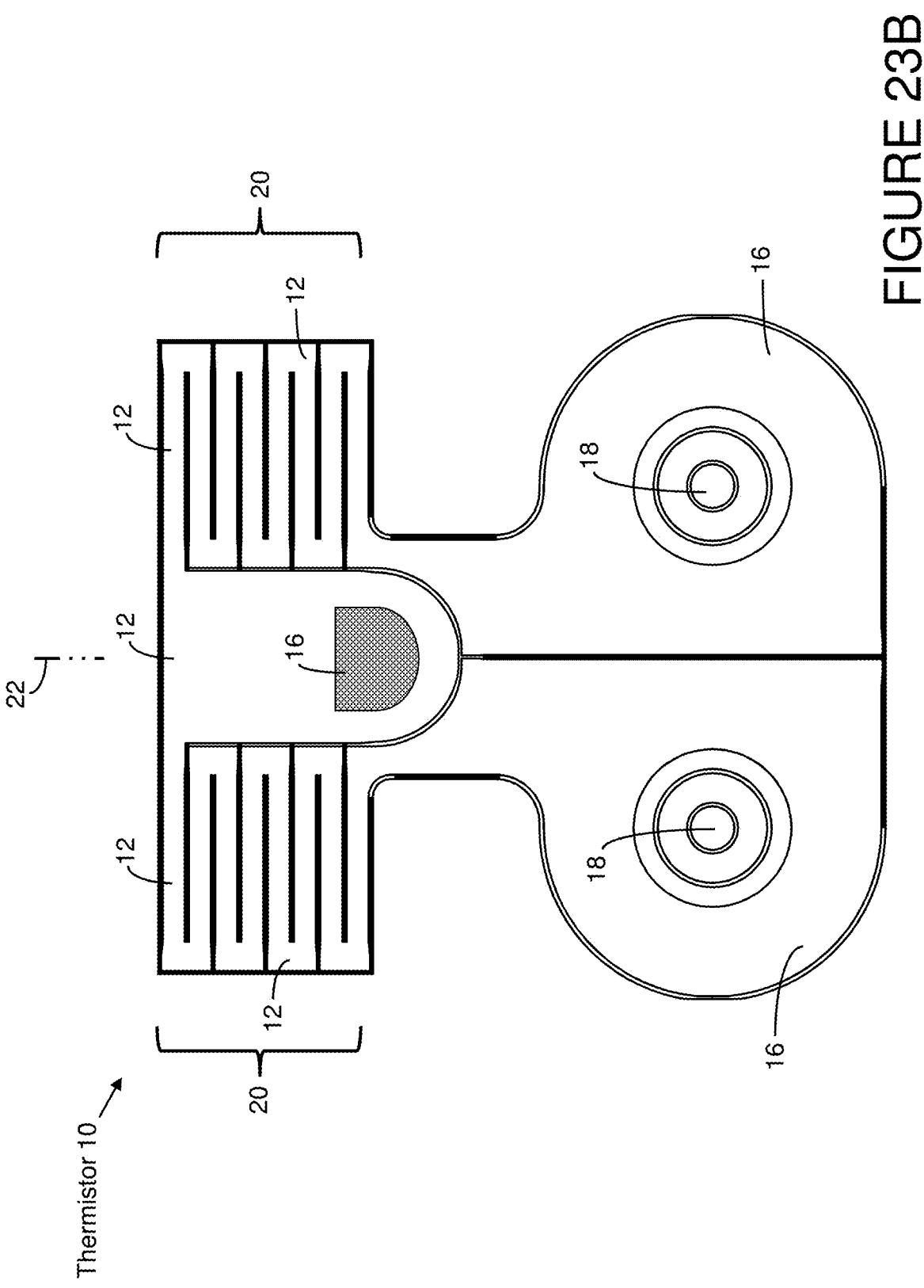
Figure 23C:
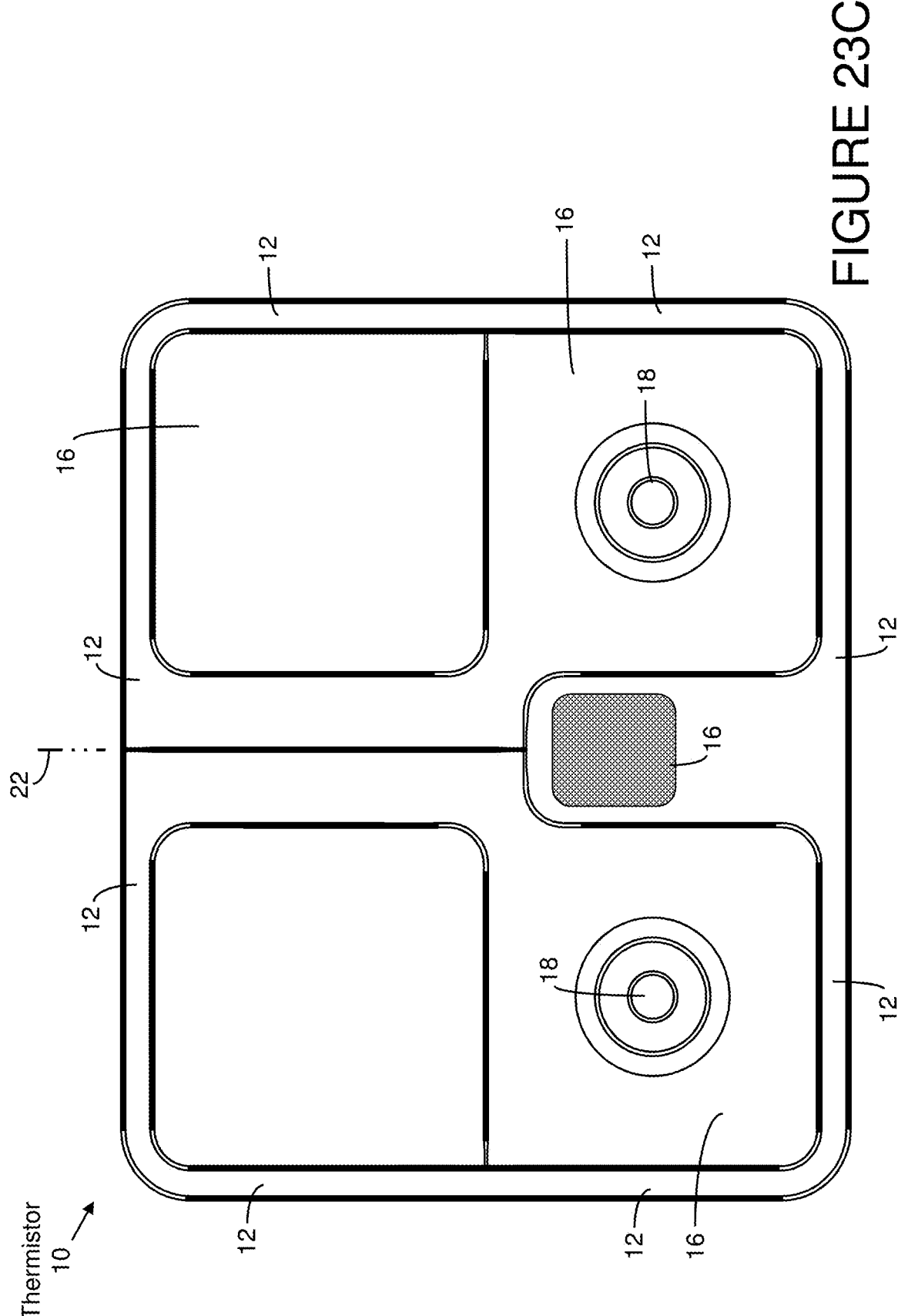
Figure 23D:
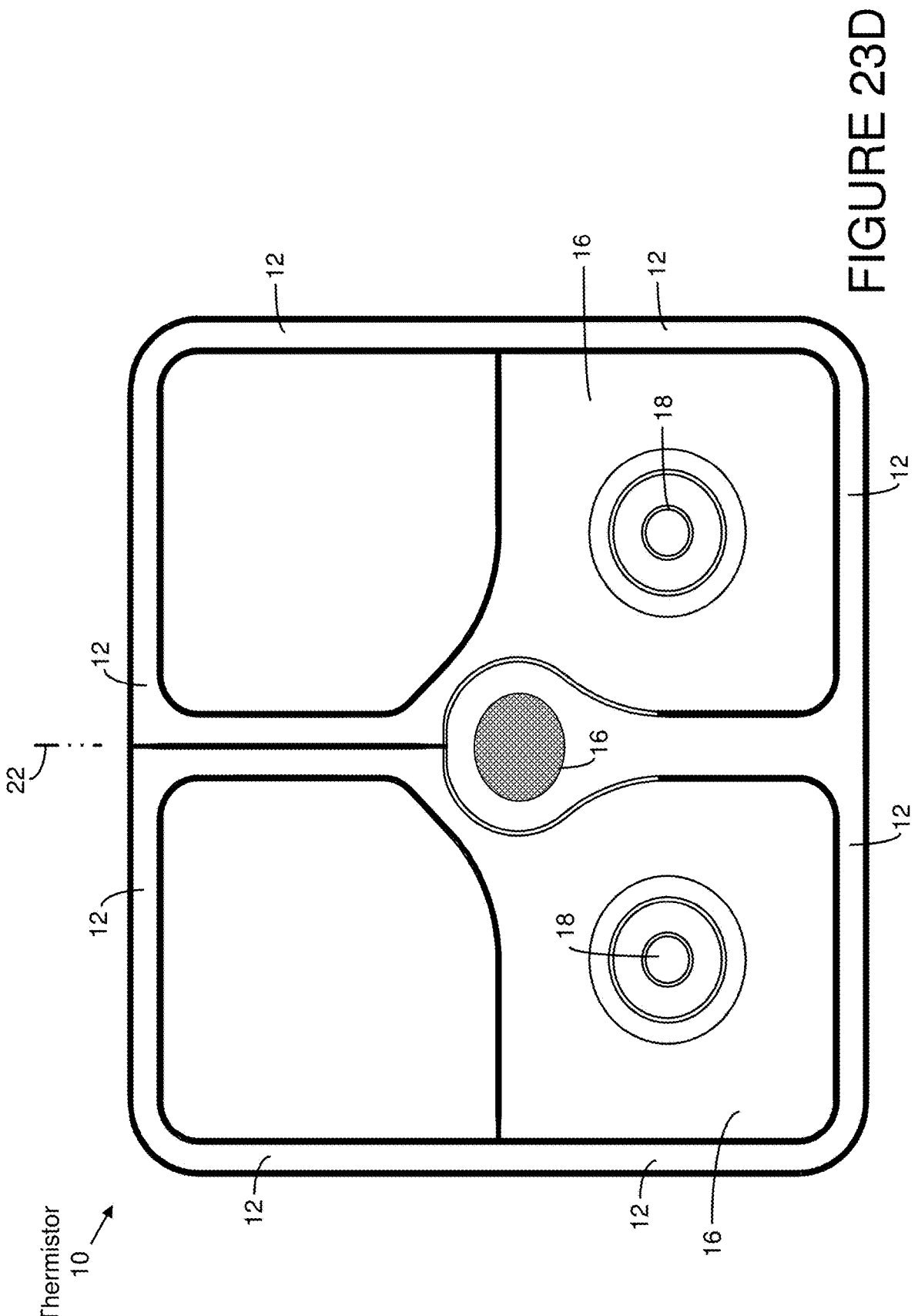
Figure 24A:
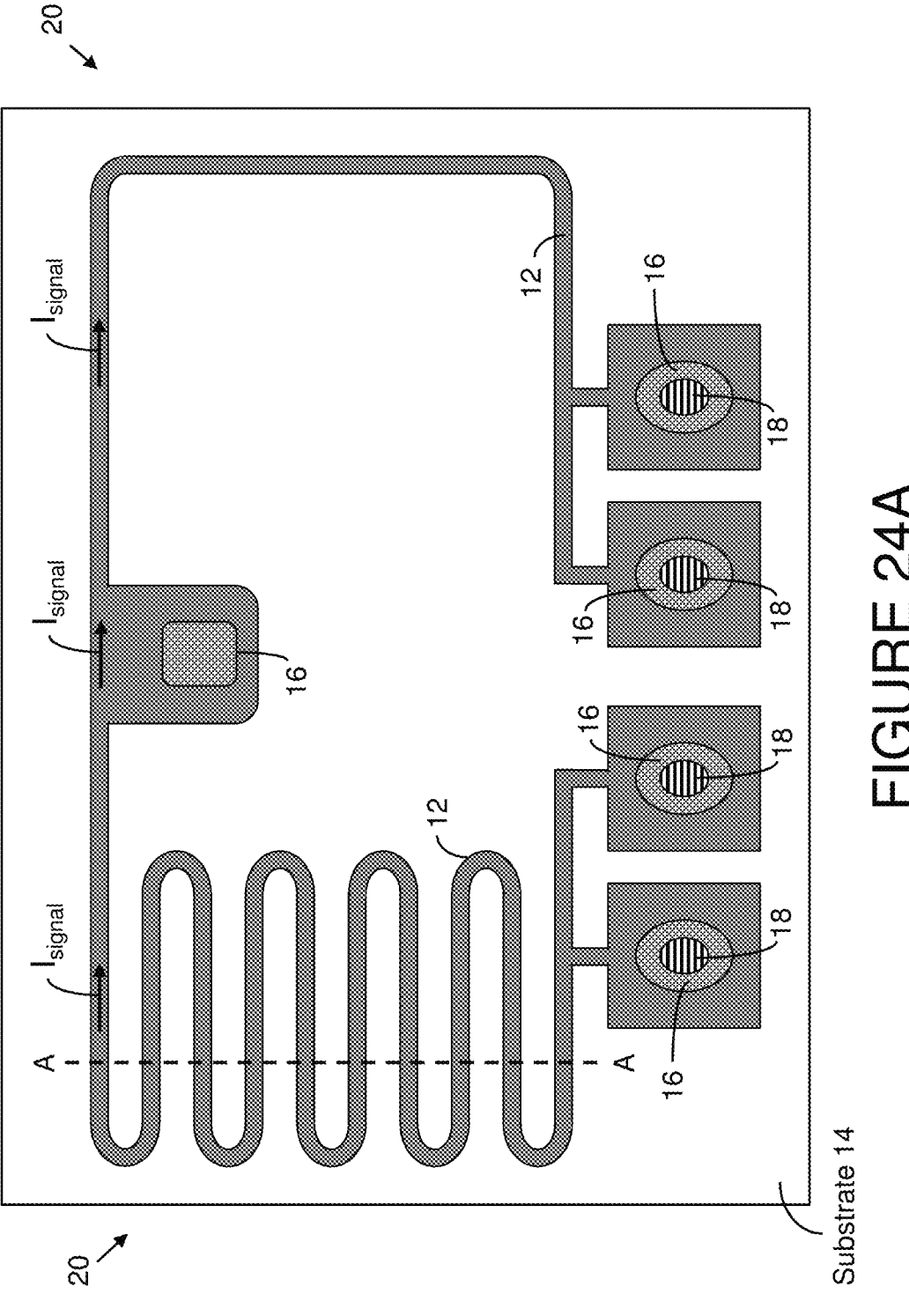
Figure 24B:
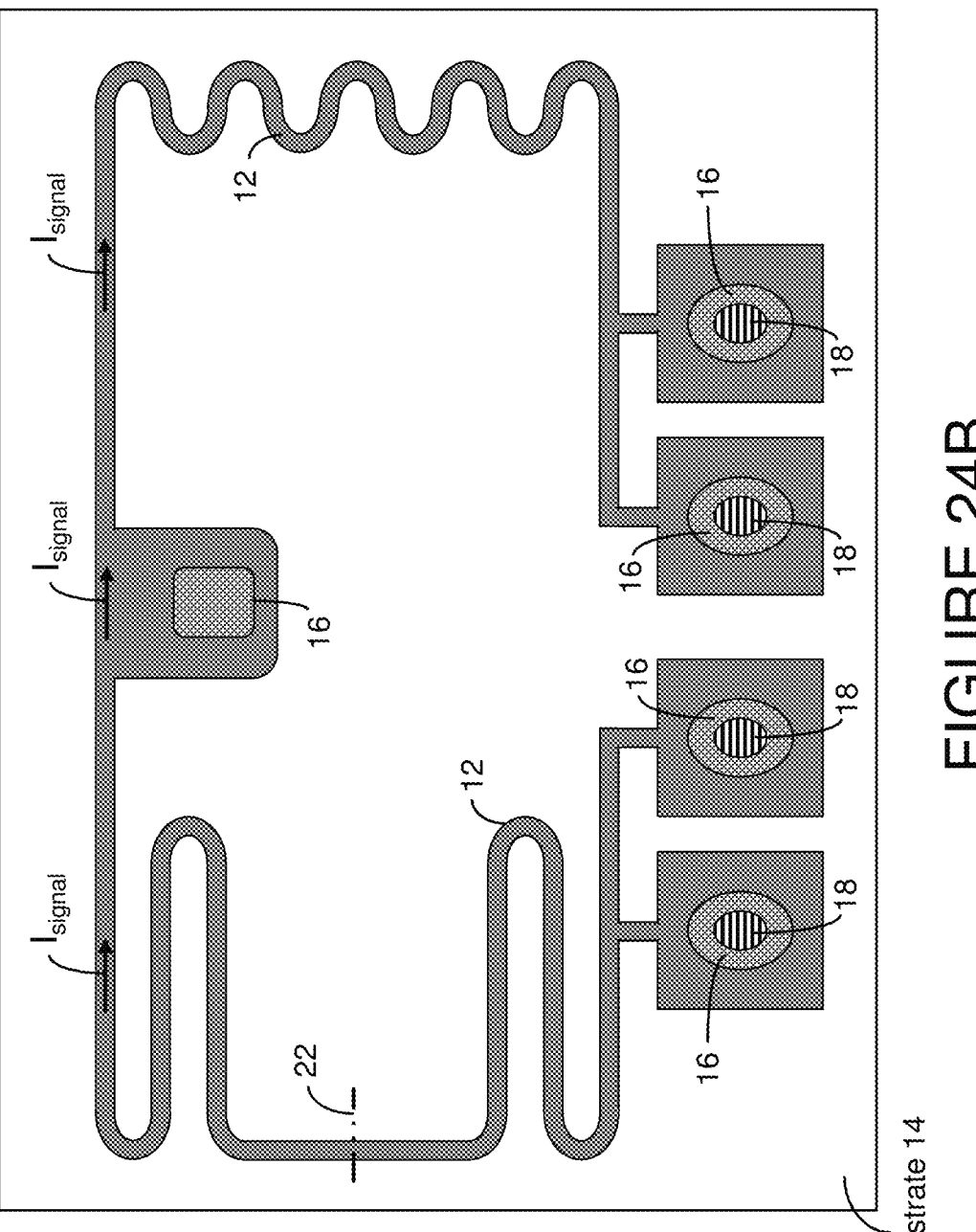
Figures 25A, 25B, 25C:
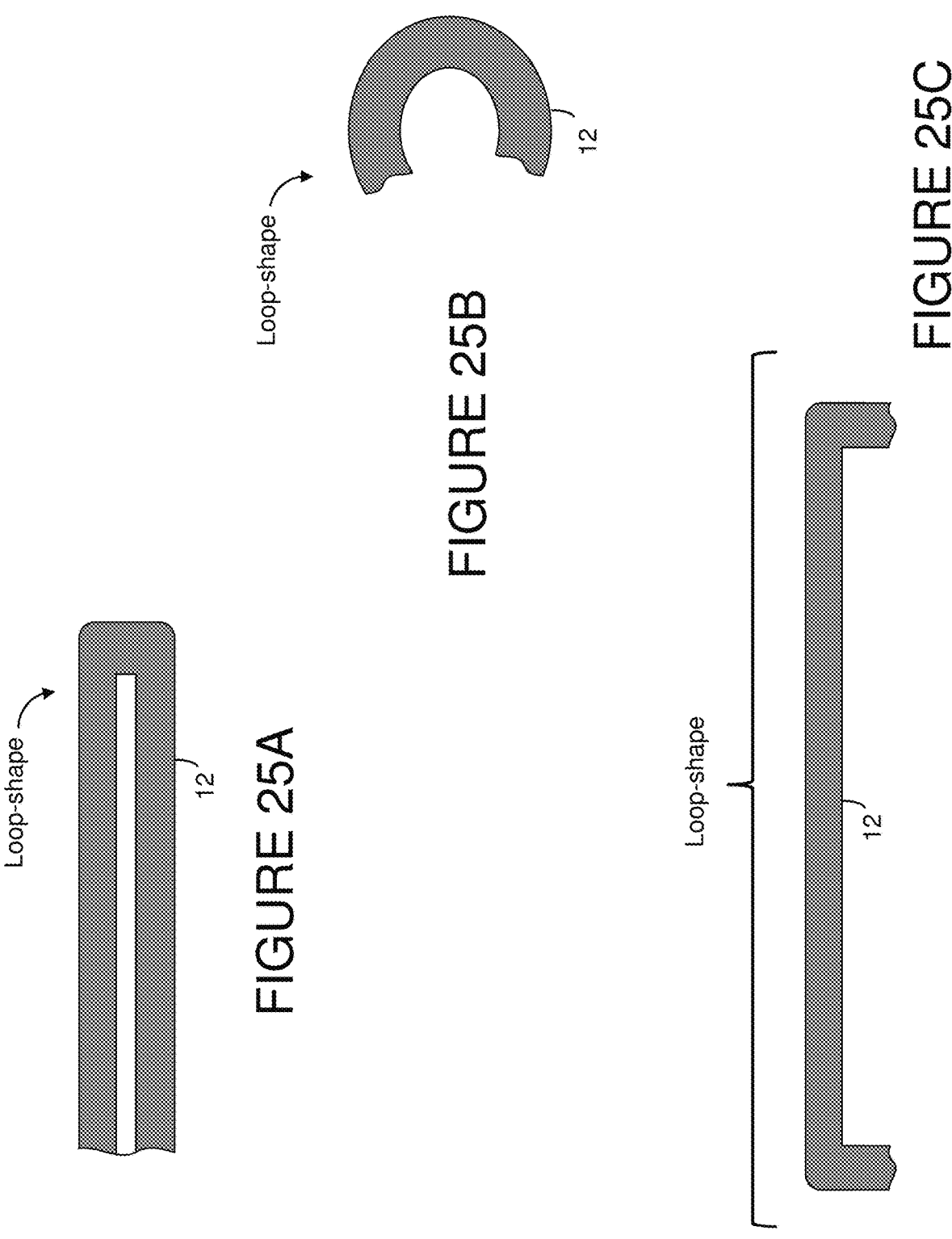

FIGS. 22A-22F illustrate cross-sectional views, along dotted line A-A of the exemplary thermistor illustrated in FIG. 21D, at various stages of manufacturing, wherein FIG. 22A illustrates a cross-sectional view of the micromachined thermistor structure after formation and prior to release from the substrate, FIG. 22B illustrates a cross-sectional view of the micromachined thermistor structure after providing or depositing a sacrificial layer on the micromachined thermistor structure, FIG. 22C illustrates a cross-sectional view after forming, depositing, growing and/or providing an encapsulation layer on and/or over sacrificial layer and prior to release of the micromachined thermistor structure from the substrate (via removal or etching of the sacrificial layer from around the micromachined thermistor structure), FIG. 22D illustrates a cross-sectional view after forming vents in the encapsulation layer, FIG. 22E illustrates a cross-sectional view after releasing of the micromachined thermistor structure from the substrate wherein the sacrificial layer is removed or etched from around micromachined thermistor structure thereby substantially or entirely releasing (vertically and horizontally) micromachined thermistor structure; in one embodiment, the vents are closed and the cavity sealed after releasing micromachined thermistor structure, for example, via deposition forming, depositing, growing and/or providing another encapsulation layer (see FIG. 22F);

FIGS. 23A-23D illustrate top views of exemplary thermistors according to certain aspects and embodiments of the present inventions wherein the exemplary thermistor may include two electrical contacts and a micromachined thermistor structure includes (i) a loop-shape and, in FIGS. 23A and 23B, (ii) a serpentine or undulating shape;

FIGS. 24A and 24B illustrate top views of exemplary thermistors according to certain aspects and embodiments of the present inventions wherein the exemplary micromachined thermistor structure includes (i) a loop-shape and (ii) a serpentine or undulating shape; and FIGS. 25A-25C illustrate micromachined thermistor structures including loop-shapes having different bending radii wherein FIG. 25A includes a sharper bending radius in relation to the bending radius of the loop-shape of FIGS. 25B and 25C; notably, it may be advantageous to increase the bending radius of a loop-shape to facilitate more uniform current flow throughout the micromachined thermistor structure and in particular, through the loop-shape portion of the micromachined thermistor structure.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

There are many inventions described and illustrated herein. In one aspect, the present inventions are directed to a thermistor and the method of manufacturing a thermistor which includes a predetermined and/or high correlation of resistance to ambient temperature and, preferably, limited, minimum and/or reduced stress-resistance dependence. In one embodiment, the thermistor includes a micromachined thermistor structure which is fabricated from a temperature-sensitive crystalline material (for example, doped or undoped semiconductor material(s) such as, for example, monocrystalline, polycrystalline and/or amorphous silicon, germanium, silicon/germanium, silicon carbide (SiC), and gallium arsenide). For example, in one embodiment, the micromachined thermistor structure may be fabricated or formed from a doped monocrystalline or polycrystalline silicon (for example, doped with a p-type impurity (such as, for example, boron, aluminum, or other element in group 13 of the periodic table as well as compounds) or an n-type impurity (such as, for example, phosphorus and/or arsenic) using well-known deposition, lithographic, etching and/or doping techniques.

In addition thereto, or in lieu thereof, in another embodiment, the thermistor may include one or more micromachined thermistor structures which is/are fabricated from a metal material (for example, platinum, aluminum, molybdenum and/or copper (or alloys thereof)). For example, in one embodiment, the micromachined thermistor structure may be fabricated or formed from platinum and/or copper (or alloys thereof) using well-known deposition, lithographic, and/or etching techniques. Indeed, in another embodiment, the thermistor includes a plurality of thermistor structures including a first micromachined thermistor structure fabricated from a doped monocrystalline or polycrystalline semiconductor material and a second micromachined thermistor structure fabricated from a metal material.

With reference to FIGS. 1A, 2A-2C and 3A-3E, in exemplary embodiments, thermistor 10 includes a micromachined thermistor structure 12 which is disposed on, above and/or in substrate 14. In this exemplary illustrated embodiment, micromachined thermistor structure 12 is disposed above substrate 14. In this regard, micromachined thermistor structure 12 is substantially or entirely released (vertically and horizontally), suspended, and/or "free-standing" relative to substrate 14. In this way, the impact of internal or external stress introduced during operation on the temperature dependent characteristics (for example, resistance) of micromachined thermistor structure 12 is limited, reduced and/or minimized (relative to, for example, micromachined thermistor structure 12 that is disposed in substrate 14). That is, the temperature dependent characteristics (for example, resistance) of micromachined thermistor structure 12, which is released (vertically and/or horizontally), suspended, and/or "free-standing" relative to the substrate, are relatively and/or substantially independent of internally or externally induced stresses in substrate 14 and, as such, provide a more accurate and/or reliable representation of the ambient temperature notwithstanding any non-temperature related/dependent ambient operating conditions of thermistor 10 (for example, substrate stress or forces (internal or external) applied thereto).

With reference to FIGS. 2A-2C and 4A, thermistor 10 may be formed in or on substrate 14. The substrate 14 may be, for example, a doped or undoped semiconductor material, a glass material, or an insulator material. For example, substrate 14 may be a portion of a semiconductor-on-insulator wafer or a portion of a standard type wafer having active layer 14c disposed on sacrificial layer 14b (for example, a silicon oxide or silicon nitride) which is disposed on substrate base 14a (which may be a semiconductor, a glass, or an insulator). With reference to FIGS. 2A-2C, 4A and 4B, micromachined thermistor structure 12 may be defined or formed in active layer 14c (for example, a semiconductor or metal) using well-known lithographic and etching techniques. Thereafter, layer 14b (for example, insulator or sacrificial layer of substrate 14) may be removed or etched thereby partially, substantially or entirely releasing (vertically and/or horizontally) micromachined thermistor structure 12 (in whole or in part) from substrate 14 (which, in the illustrated embodiment, includes substrate base 14a). (See, FIG. 4C). Notably, micromachined thermistor structure 12 may be fabricated using any processing or fabrication techniques now known or later developed.

Figures 1A, 1B, 1C, 1D:
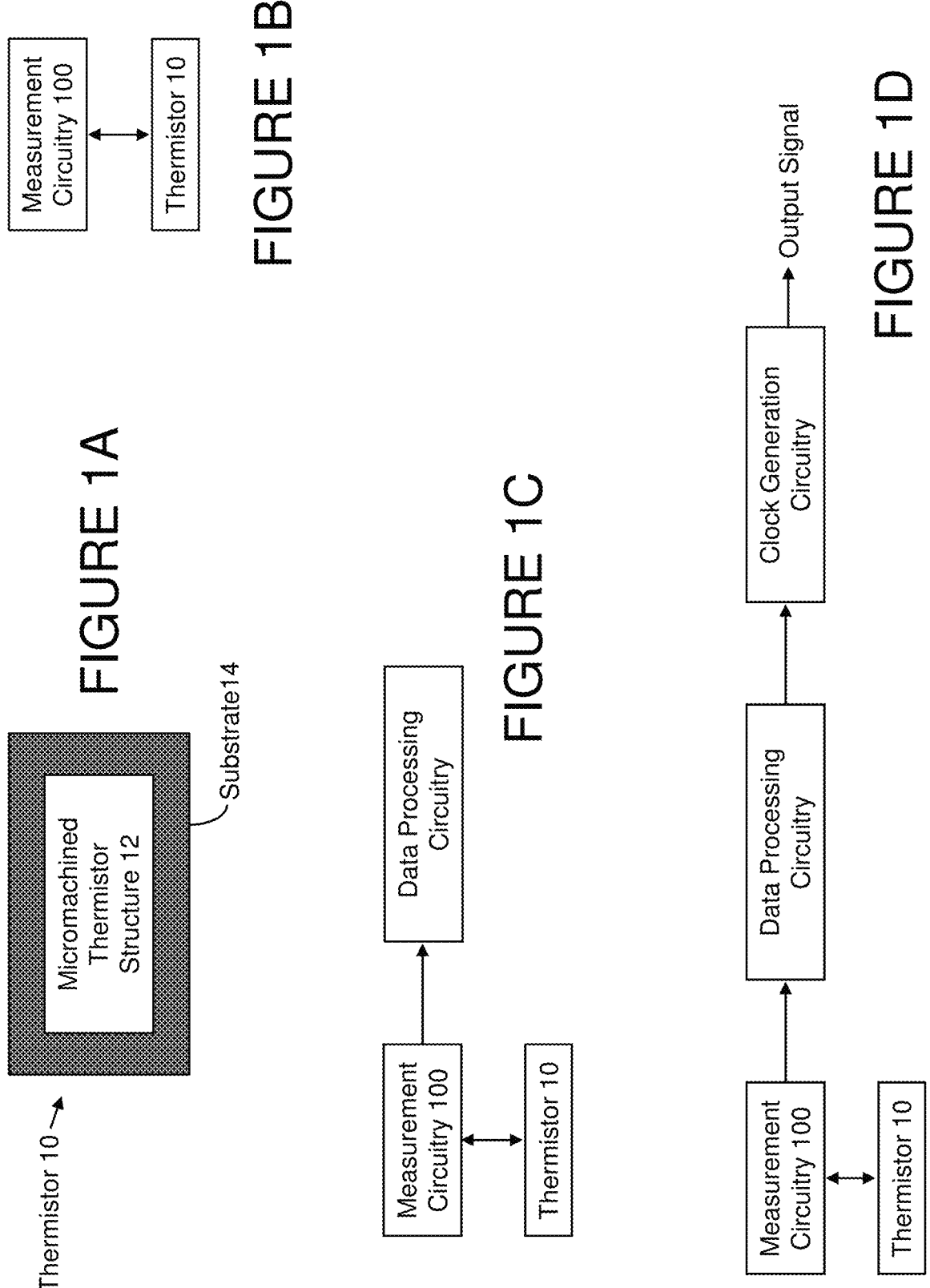
Figure 1E:
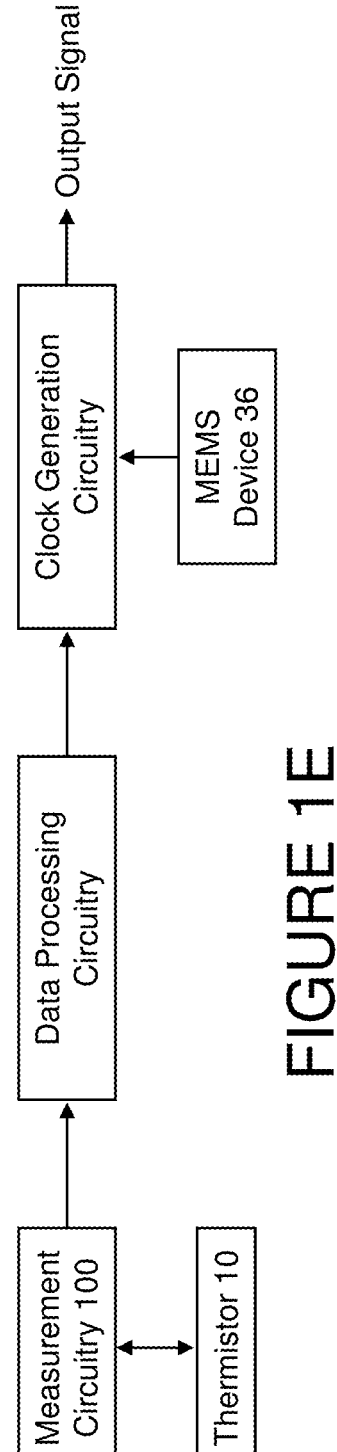
Figure 1F:
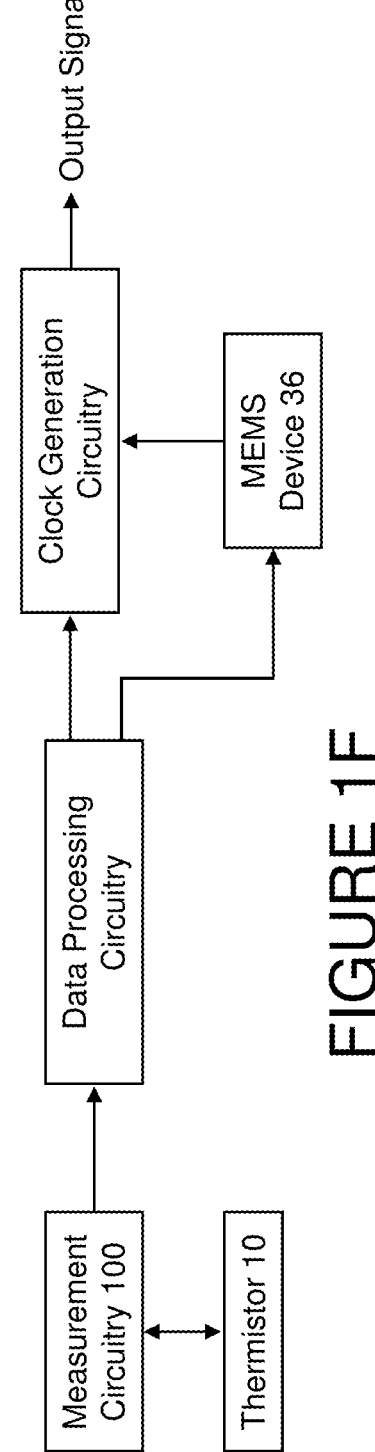
Figure 2A:
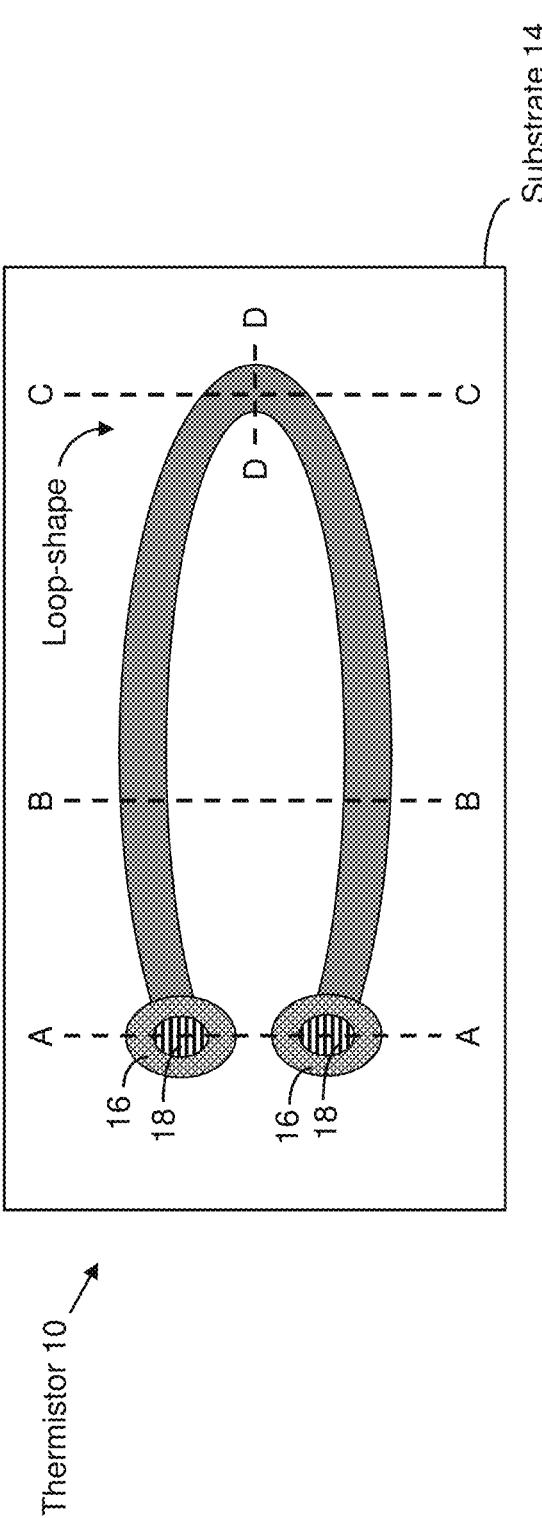
FIGS. 2A-2C illustrate top views of exemplary thermistors according to certain aspects and embodiments of the present inventions wherein the micromachined thermistor structure, in one embodiment, may include a loop-shape wherein the anchors are located in close proximity such that the anchors secure, attach and/or physically couple the thermistor structure to the substrate, (FIG. 2A), may include a generally linear or straight shape such that the anchors are located at distant ends (FIG. 2B), or may include a generally curved and/or undulating shape (FIG. 2C) wherein again the anchors are located at distant ends, or, as discussed in connection with other embodiments, combinations thereof; notably, in these exemplary illustrated embodiments, the electrodes are disposed or integrated in or on the anchors; moreover, the shapes of the micromachined thermistor structure of these embodiments are merely exemplary and the inventions hereof are not limited to any particular shape—but may take any shape now known or later developed.
Figures 2B, 2C:
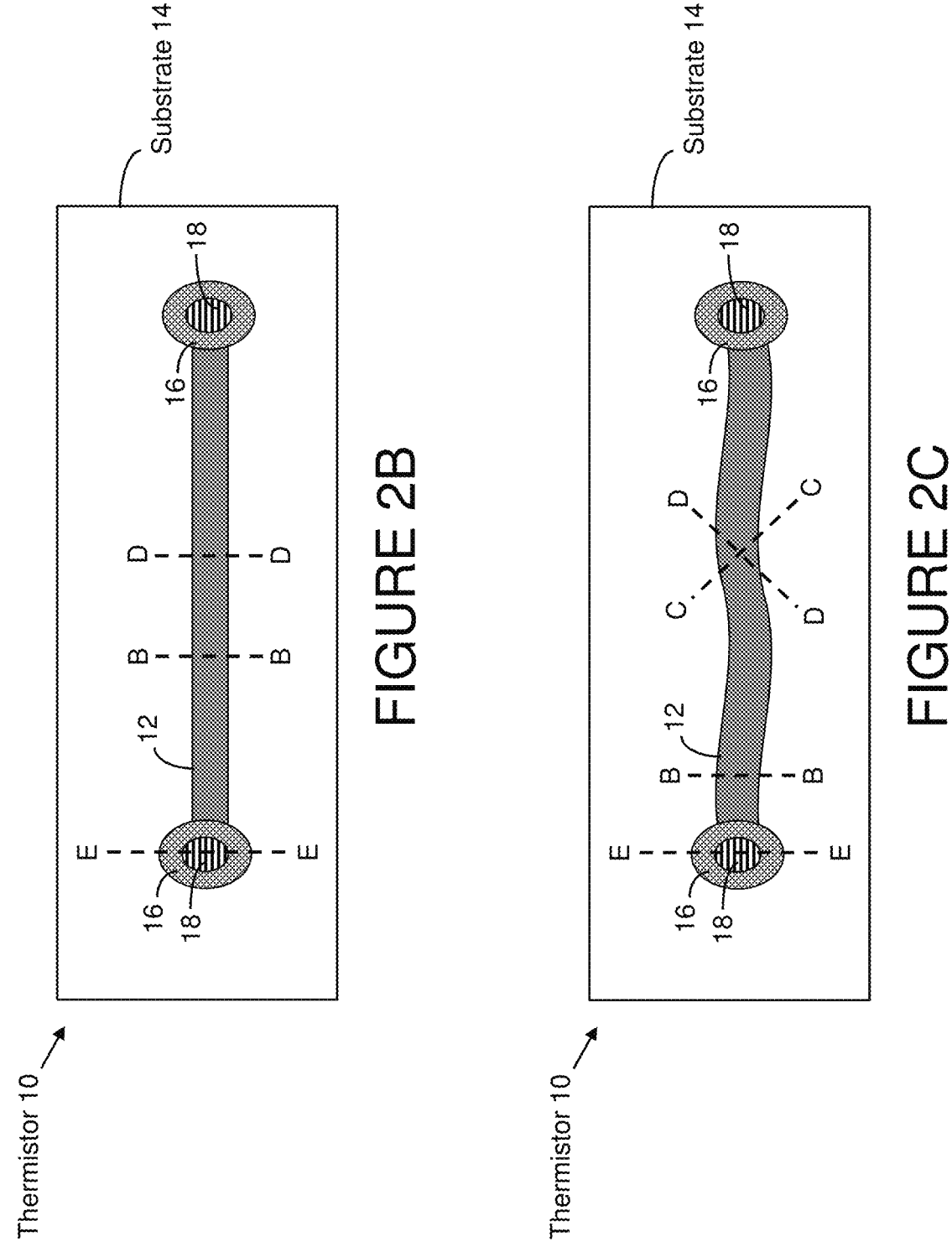
Figure 3A:
Figure 3A:
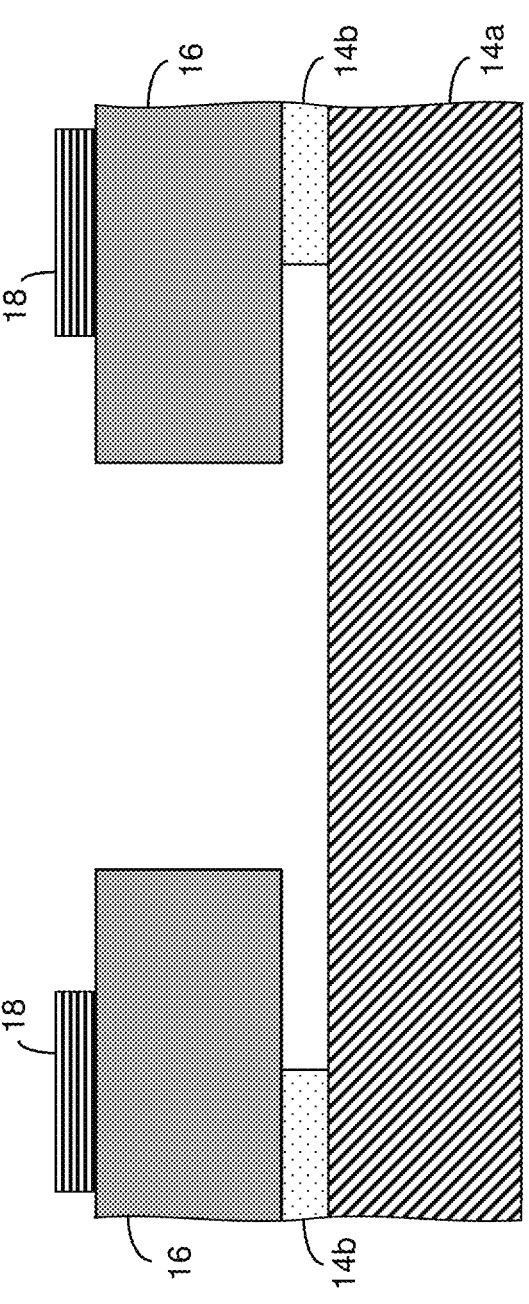
Figures 3B, 3C:
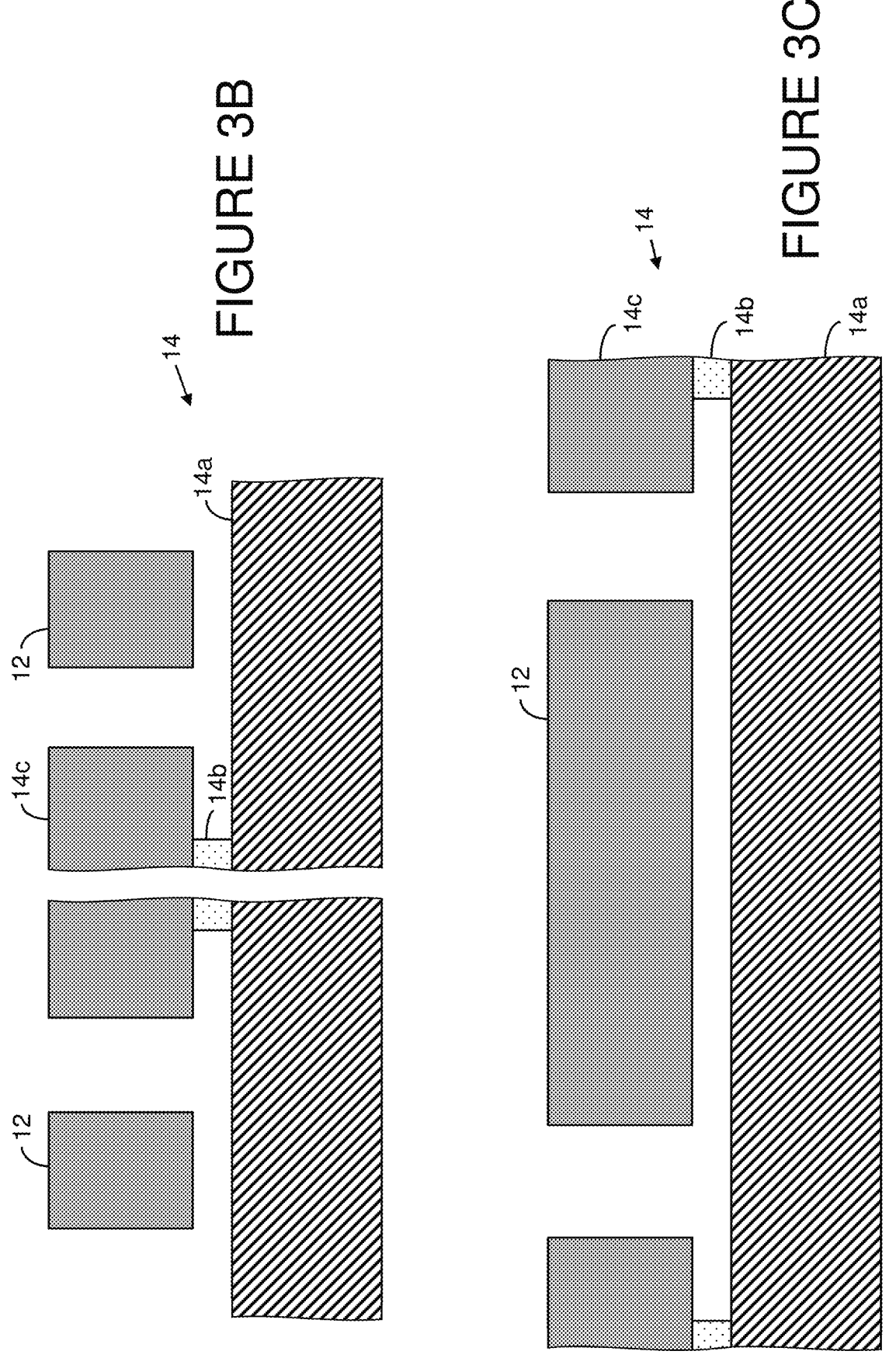
Figure 3D:
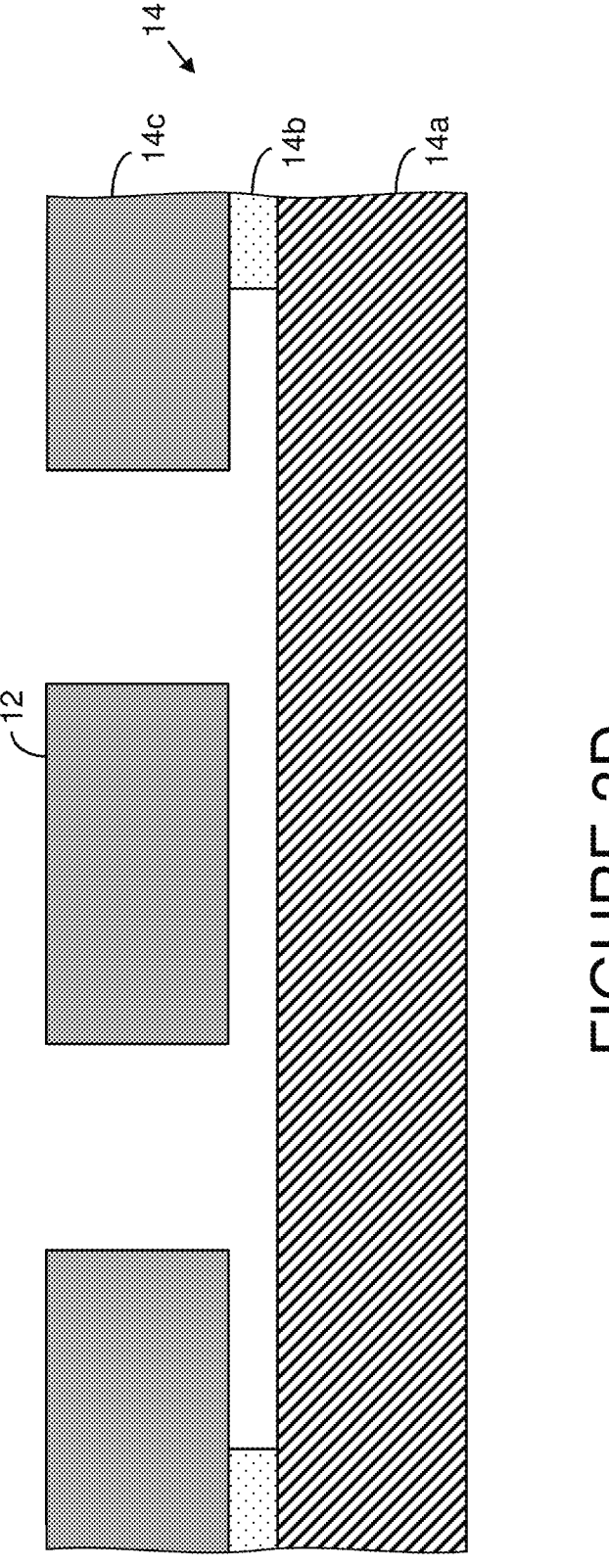
Figure 3E:
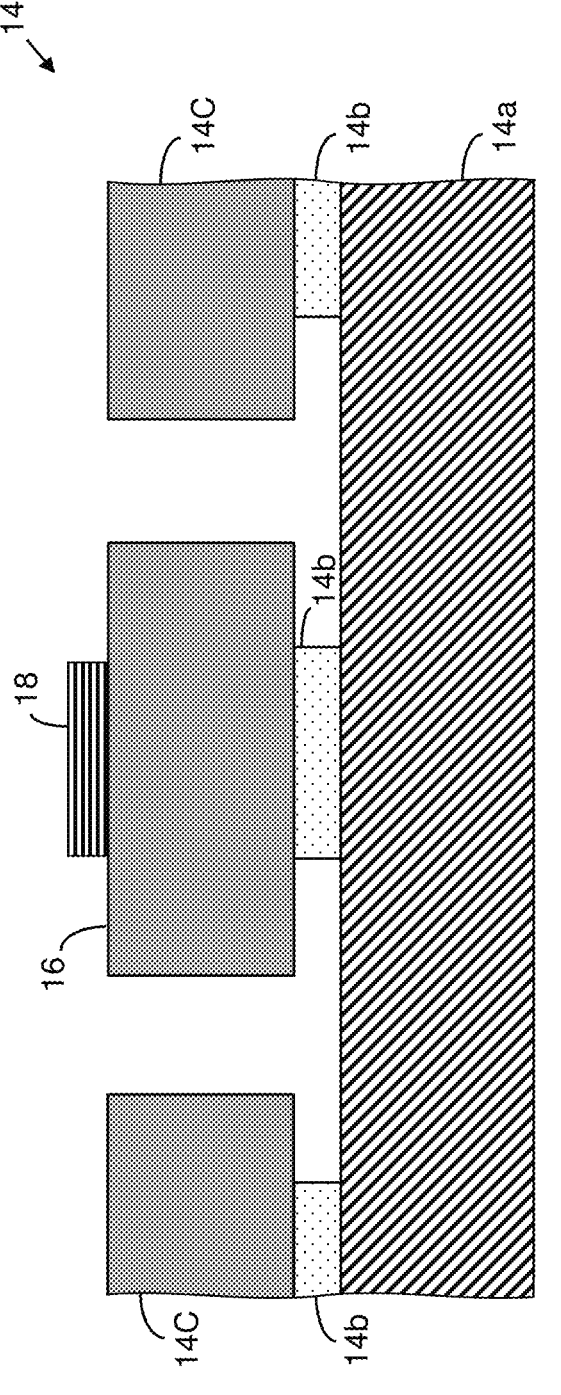
Figure 4C:
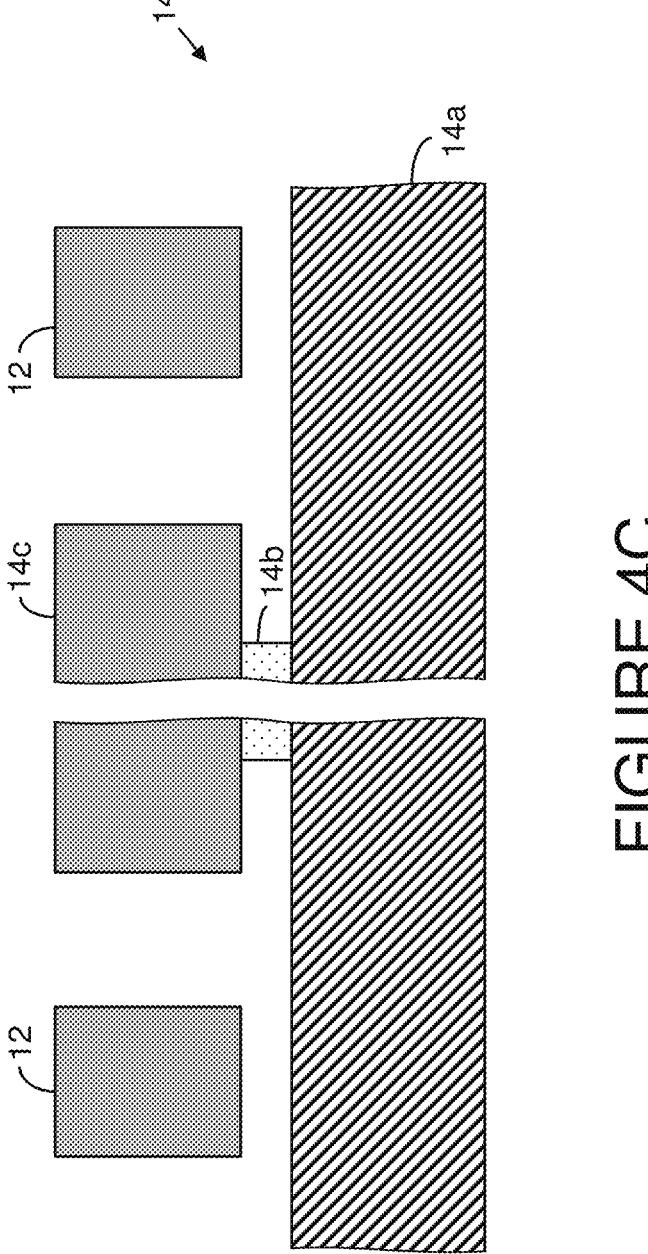

With reference to FIGS. 2A-2C, micromachined thermistor structure 12 may include portions that include one or more loop-shapes, linear or straight, or curved and/or undulating, or, as discussed in connection with other embodiments, combinations thereof. Where micromachined thermistor structure 12 includes loop-shape anchors 16 of thermistor 10 may be located in close proximity. That is, with reference to FIGS. 2A and 3A, in this exemplary illustrated embodiment, micromachined thermistor structure 12 includes a loop-shape wherein anchors 16 are located in close proximity. In this embodiment, anchors 16 secure, attach and/or physically couple the micromachined thermistor structure 12 to substrate 14. In this way, displacement of or impact on micromachined thermistor structure 12 (or portions thereof) due to internal or external stress may be limited, minimized and/or reduced thereby limiting and/or reducing the impact of such forces on the temperature dependent output signal of thermistor 10.

Moreover, a loop-shape (wherein anchors 16 of micromachined thermistor structure 12 are located in close proximity) may increase the rigidity, restoring force and/or resonant frequency of micromachined thermistor structure 12 of the thermistor 10 in response to, for example, internal or external forces applied to substrate 14 (e.g., vibration)— particularly in those embodiments where micromachined thermistor structure 12 is partially, substantially or entirely released (vertically and/or horizontally), suspended, or "free-standing" relative to substrate 14 (which improves the accuracy and/or reliability of the temperature dependent output signal of thermistor 10). In one embodiment, micro- machined thermistor structure 12 includes a resonant fre- quency of greater than 200 kHz, and preferably greater than 500 kHz.

Notably, a higher rigidity, restoring force and/or resonant frequency of micromachined thermistor structure 12 may increase the restoring force and, as such, reduce, minimize and/or eliminate stiction concerns—wherein microma- chined thermistor structure 12 may physically contact and "attach" to a nearby structure/material (for example, active layer 14c, substrate base 14a and/or a cover (in those embodiments where the micromachined thermistor structure of the thermistor is encapsulated or a cover is disposed over the micromachined thermistor structure)). As such, in those embodiments where micromachined thermistor structure 12 is partially, substantially or entirely released (vertically and/or horizontally), suspended, or "free-standing" relative to substrate 14, it may be advantageous to include a physical design of micromachined thermistor structure 12 that the rigidity, restoring force and/or resonant frequency of the micromachined thermistor structure 12 be greater than the impact of estimated or anticipated externally forces to or vibration of thermistor 10. In this way, the restoring force of micromachined thermistor structure 12 of thermistor 10 will reduce or minimize stiction concerns.

With reference to FIGS. 2A-2C. 3A and 3E, thermistor 10 also includes electrical contacts 18 to, for example, couple to measurement circuitry 100. (See, for example, FIGS. 1B-1F). In certain embodiments, electrical contacts 18 are integrated or disposed in or on anchor 16 of thermistor 10. For example, with reference to FIGS. 2A-2C, 3A and 3E, electrical contacts 18 are integrated or disposed in or on anchors 16 of thermistor 10. The thermistor 10 may employ any design, form or type of electrical contact now known or later developed to facilitate acquisition of the temperature dependent output signal of thermistor 10; that is, the output signal which is representative of the ambient temperature of micromachined thermistor structure 12.

With reference to FIGS. 2A-2C, 3A-3E and 4A-4C, the material(s) comprising micromachined thermistor structure 12 may include one or more impurity dopants. The impurity dopant may be acceptor type(s) or donor type(s). Moreover, the impurity dopant(s) may be introduced into active layer 14c during formation of layer 14c and/or at any stage of the fabrication process, including, for example, at stages FIGS. 4A, 4B and/or 4C. Any technique now known or later developed may be employed to incorporate one or more dopants into the material(s) comprising micromachined thermistor structure 12.

The impurity dopant type and/or doping levels thereof (both of which may depend on a given base or substrate material of the structure) may be selected to provide a predetermined, increased, enhanced and/or maximum sen- sitivity of the temperature dependent characteristic of the structure (for example, resistance). In one embodiment, the micromachined thermistor structure is doped with a dopant type and/or at doping levels that provide a predetermined and/or maximum increase in sensitivity of the temperature dependent characteristic of the structure (for example, resis- tance) in relation to or versus a predetermined and/or minimum sensitivity to doping variations (which may also depend on manufacturing controllability and/or tolerances of the doping operation). (See, for example, FIG. 16). Here, although the dopant and/or doping concentrations may not provide a maximum sensitivity and/or linearity of the tem- perature dependent characteristic of the micromachined thermistor structure (see, for example, DC1 in FIG. 16), such dopant and/or levels may provide an increase in the temperature dependent characteristic, relative to other dop- ing concentrations or levels (for example, a lightly or an undoped base material) of the structure, and a sensitivity and/or linearity of the temperature dependent characteristic (for example, resistance) over manufacturing variations or tolerances in doping operations/concentrations is within a predetermined and/or acceptable range or limits (see, for example, DC2 in FIG. 16).

For example, in one embodiment, the micromachined thermistor structure may be fabricated or formed from a doped monocrystalline or polycrystalline silicon (for example, doped with a p-type impurity (such as, for example, boron, aluminum, or other element in group 13 of the periodic table as well as compounds (for example, boron difluoride, $BF_2$) having acceptor type characteristics)) using well-known fabrication techniques (including deposition, lithographic, etching and/or doping techniques). It may be advantageous to implement boron doping levels in a silicon material which provides an impurity concentration of greater than $10^{16}$ $cm^{-3}$ and less than $10^{18}$ $cm^{-3}$. In this way, the sensitivity of the resistance of the micromachined thermistor structure, over a certain temperature range (Ta to Tc), is relatively linear.

Notably, in one embodiment, the doping processes of the micromachined thermistor structure may include a plurality of impurity dopant types and/or a plurality of doping levels, which, in sum, provide a net doping concentration. In one embodiment, the doping processes may include (i) a first impurity dopant type at first doping level and (ii) a second impurity dopant type (which is the same impurity type as the first impurity dopant type—for example, boron, aluminum and gallium) at a second doping level. In another embodi- ment, the doping processes may include counter-doping which includes (i) a first impurity dopant type at first doping level and (ii) a second impurity dopant type (which is opposite the first impurity dopant type—for example, boron and phosphorus) at a second doping level. Here, the domi- nant impurity type and the net doping concentration of the micromachined thermistor structure are dependent on, among other things, the impurity dopant types and the doping levels of such impurities.

In another embodiment, the doping processes of the thermistor may provide a first region of the thermistor (for example, the electrical contacts) having first impurity dopant type(s) and/or first impurity doping level(s), and a second region of the thermistor (for example, the micromachined thermistor structure) having second impurity dopant type(s) and/or second impurity doping level(s). For example, in a region in and/or around the electrical contacts, the doping concentration may be heavier relative to the micromachined thermistor structure which is lightly doped to increase the sensitivity to variations in temperature. Moreover, the heav- ily doped regions (electrical contact and, in certain embodi- ments, the anchors) are less sensitive to local stress and tend to include a greater electrical and thermal conductivity.

Notably, all permutations and combinations of doping properties (for example, implantation strength/energy), impurity dopant types and/or a plurality of doping levels/concentrations are intended to fall within the scope of the present inventions.

Figure 5A:
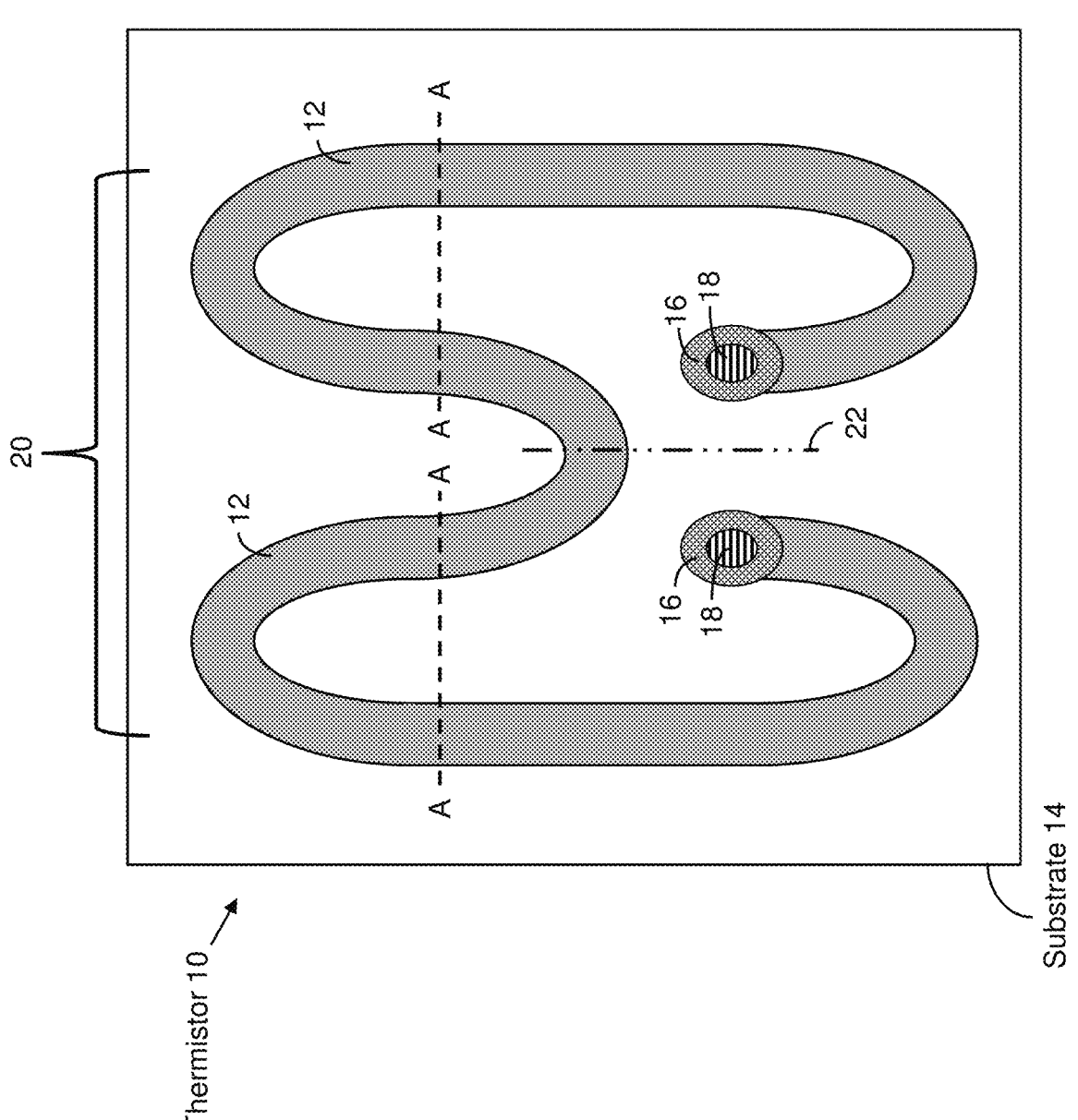
FIG. 5A illustrates a top view of an exemplary thermistor according to certain aspects and embodiments of the present inventions wherein the exemplary thermistor includes two anchors located in close proximity such the anchors secure, attach and/or physically couple the thermistor structure to the substrate, two electrical contacts disposed or integrated in or on the anchors, and a micromachined thermistor structure including (i) a loop-shape and (ii) a serpentine or undulating shape in a center section or portion of the micromachined thermistor structure wherein the serpentine or undulating shape, among other things, may increase the temperature dependent characteristics of the micromachined thermistor structure, increases resistance of the overall structure and/or limits and/or reduces the impact on the micromachined thermistor structure (or portions thereof) of internal or external stress.
Figure 6A:
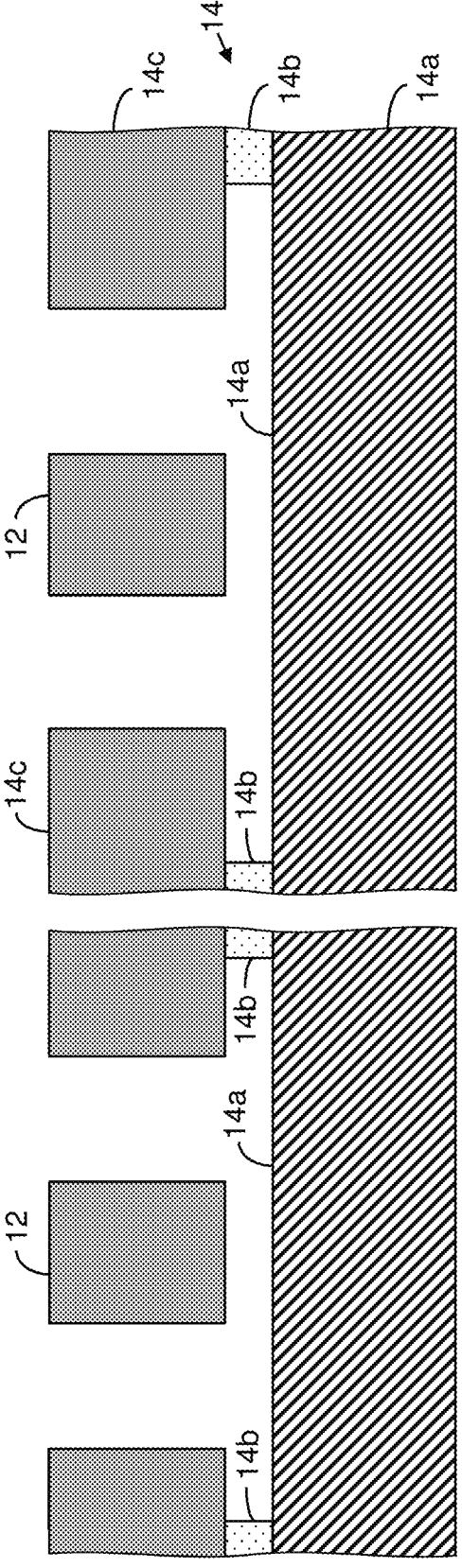
FIGS. 6A and 6B illustrate a cross-sectional view, along dotted line A-A, of the exemplary thermistor illustrated in FIG. 5A, wherein the micromachined thermistor structure is (i) disposed and suspended over (for example, in a cantilever-like manner) and/or (ii) vertically and horizontally released from the substrate, in accordance with certain aspects and/or embodiments of the present inventions; notably, the exemplary thermistor of FIG. 6B includes a passivation layer (for example, grown and/or deposited silicon oxide and/or silicon nitride materials) on the thermistor structure to, among other things, improve the long term stability of the thermistor (wherein the temperature dependent characteristics of the thermistor may be more stable over time (for example, less change in resistance over time); notably, a passivation layer may be comprised of a plurality of layers each having one or more different materials (for example, a silicon nitride layer disposed on a silicon oxide layer)

With reference to FIG. 5A, in one embodiment, micromachined thermistor structure 12 of thermistor 10 may include (in whole or in part) a serpentine or undulating shape (see area 20). For example, where micromachined thermistor structure 12 includes a loop-shape, one or more of the legs or portions of the loop-shape of the micromachined thermistor structure may include a serpentine or undulating shape or portion 20 to, among other things, increase the sensitivity of the signal corresponding to the temperature dependent characteristics of micromachined thermistor structure 12, increase resistance of micromachined thermistor structure 12, and/or limit and/or reduce the impact on micromachined thermistor structure 12 (or portions thereof) of internal or external forces (for example, stress and/or vibration). The serpentine or undulating portion 20 of micromachined thermistor structure 12 may be substantially or entirely released (vertically and horizontally), suspended, and/or "free-standing" relative to substrate 14. (See, FIG. 6A wherein portion 20 of micromachined thermistor structure 12 is vertically and horizontally released from the substrate). The serpentine or undulating portion 20 of micromachined thermistor structure 12 may limit, reduce and/or minimize the impact of internal or external stresses introduced during operation of micromachined thermistor structure 12 (for example, the stiction attributes or characteristics of micromachined thermistor structure 12).

With continued reference to FIG. 5A, in one embodiment, micromachined thermistor structure 12 includes symmetry of one or more major portions of the loop-shape of the micromachined thermistor structure (for example, in relation to an axis of the structure-symmetry axis 20 in FIG. 5A). Here, the major portions of the loop-shape include symmetrical or substantially symmetrical serpentine or undulating shapes.

Figure 5B:
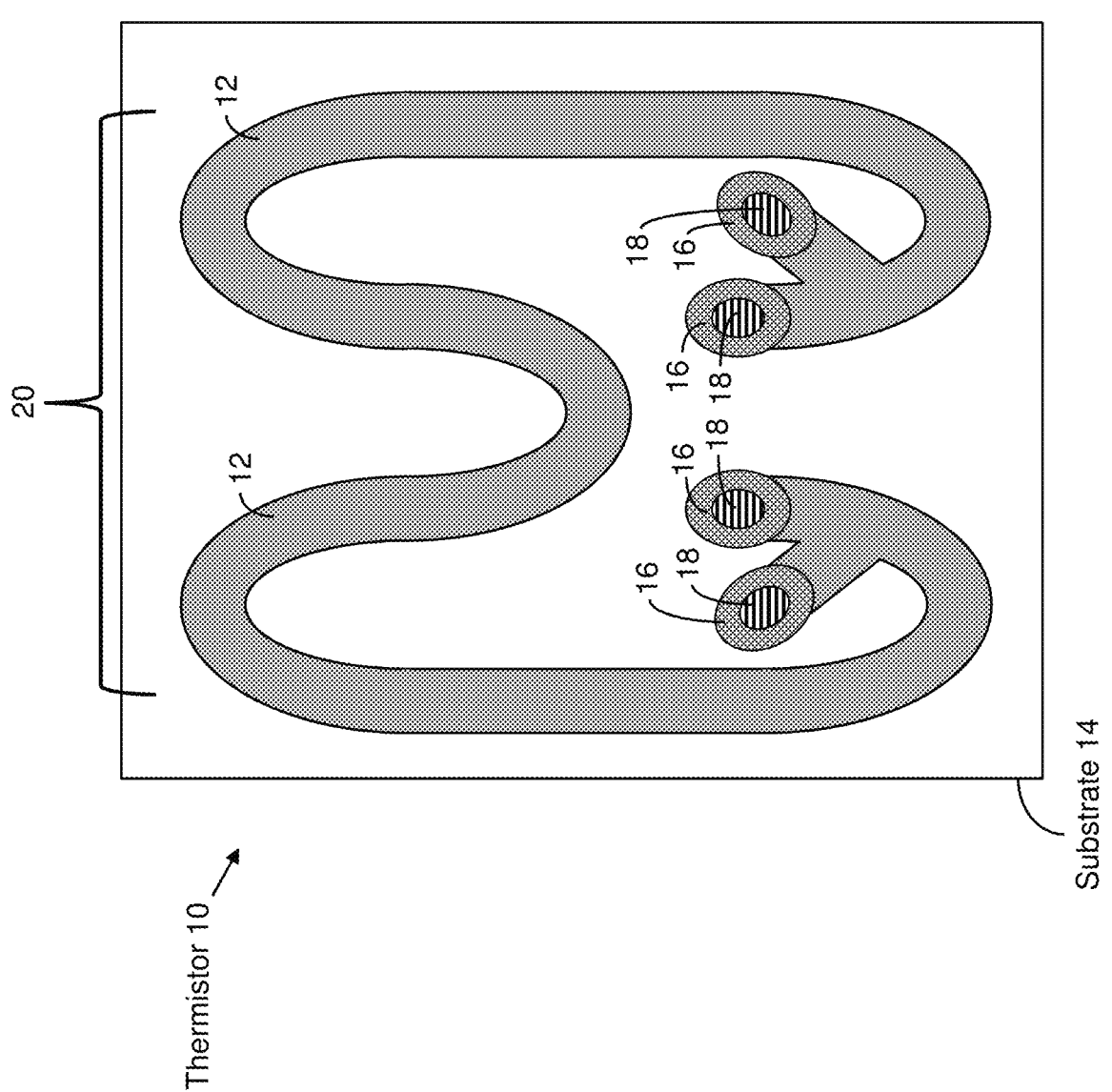
FIG. 5B illustrates a top view of an exemplary thermistor according to certain aspects and embodiments of the present inventions wherein the exemplary thermistor includes four electrical contacts disposed or integrated in or on the anchors, which are located in close proximity such the anchors secure, attach and/or physically couple the thermistor structure to the substrate; notably, the shape of micro-machined thermistor structure is substantially similar to that of FIG. 5A.
Figure 5C:
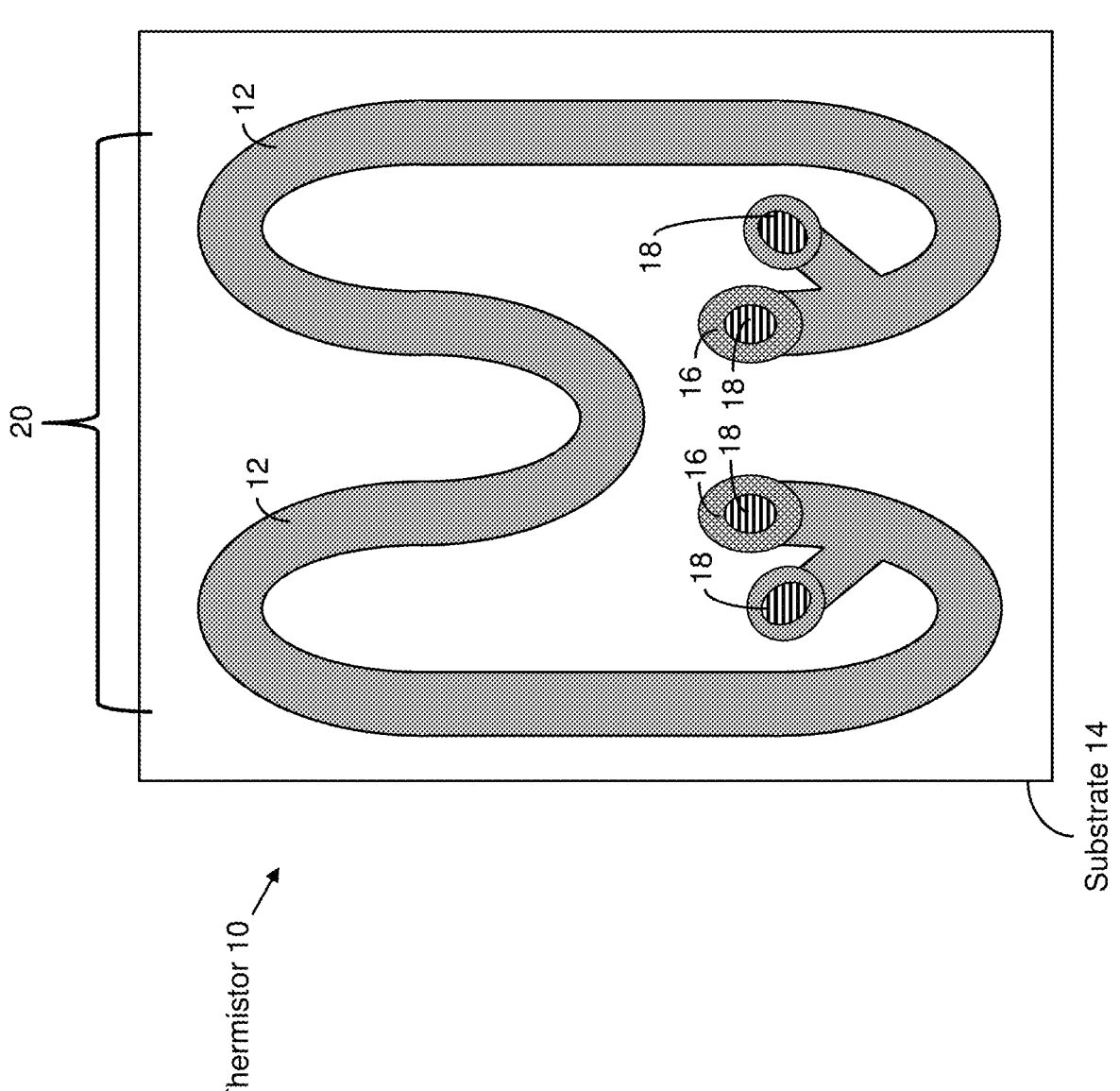
FIG. 5C illustrates a top view of an exemplary thermistor according to certain aspects and embodiments of the present inventions wherein the exemplary thermistor includes four electrical contacts—two electrical contacts are disposed or integrated in or on associated anchors (which are located in close proximity such the anchors secure, attach and/or physically couple the thermistor structure to the substrate) and two electrical contacts are free-standing above/over the substrate and not disposed or integrated in or on anchors; notably, the shape of micromachined thermistor structure is substantially similar to that of FIGS. 5A and 5B.

The thermistor 10 may include two or more electrical contacts 18 to input and/or output signals from the thermistor. (See, FIGS. 2A-2C and 5A-5C). The electrical contacts 18 facilitate measurement of a temperature dependent characteristics of the micromachined thermistor structure (and/or change therein) of thermistor 10. In one embodiment, thermistor 10 includes two electrical contacts 18 (see, for example, FIGS. 2A-2C and 5A) to facilitate a 2-point sensing configuration/architecture where measurement circuitry samples, detects and/or measures the temperature dependent characteristics (and/or changes therein) of the micromachined thermistor structure 12 (for example, resistance or change in resistance of micromachined thermistor structure 12). (See, FIG. 7A). In another embodiment, thermistor 10 includes four electrical contacts 18 (see FIGS. 5B and 5C) to facilitate implementation of 2-point or 4-point sensing configurations/architectures wherein a 4-point sensing configuration/architecture may facilitate more accurate measurement of the temperature dependent characteristics (for example, resistance), and/or change therein, of thermistor 10 with minimal, reduced, little or no contribution to the overall or measured resistance due to, for example, (i) the electrical contacts or signal path to the measurement circuitry and/or (ii) non-idealities of the measurement circuitry. (See, for example, FIG. 7B). In one embodiment, a current (I) is applied to thermistor 10 through F+/F− electrical contacts (via the current source), and the resulting voltage is sensed at the S+/S− electrical contacts (via the voltage measurement circuitry). The voltage measurement circuit may be designed to include a large or high input impedance so that little to no current flows in/out of the S+/S− or electrical contacts thereby facilitating a highly accurate measurement of the resistance (or change therein) of thermistor 10.

Figure 5D:
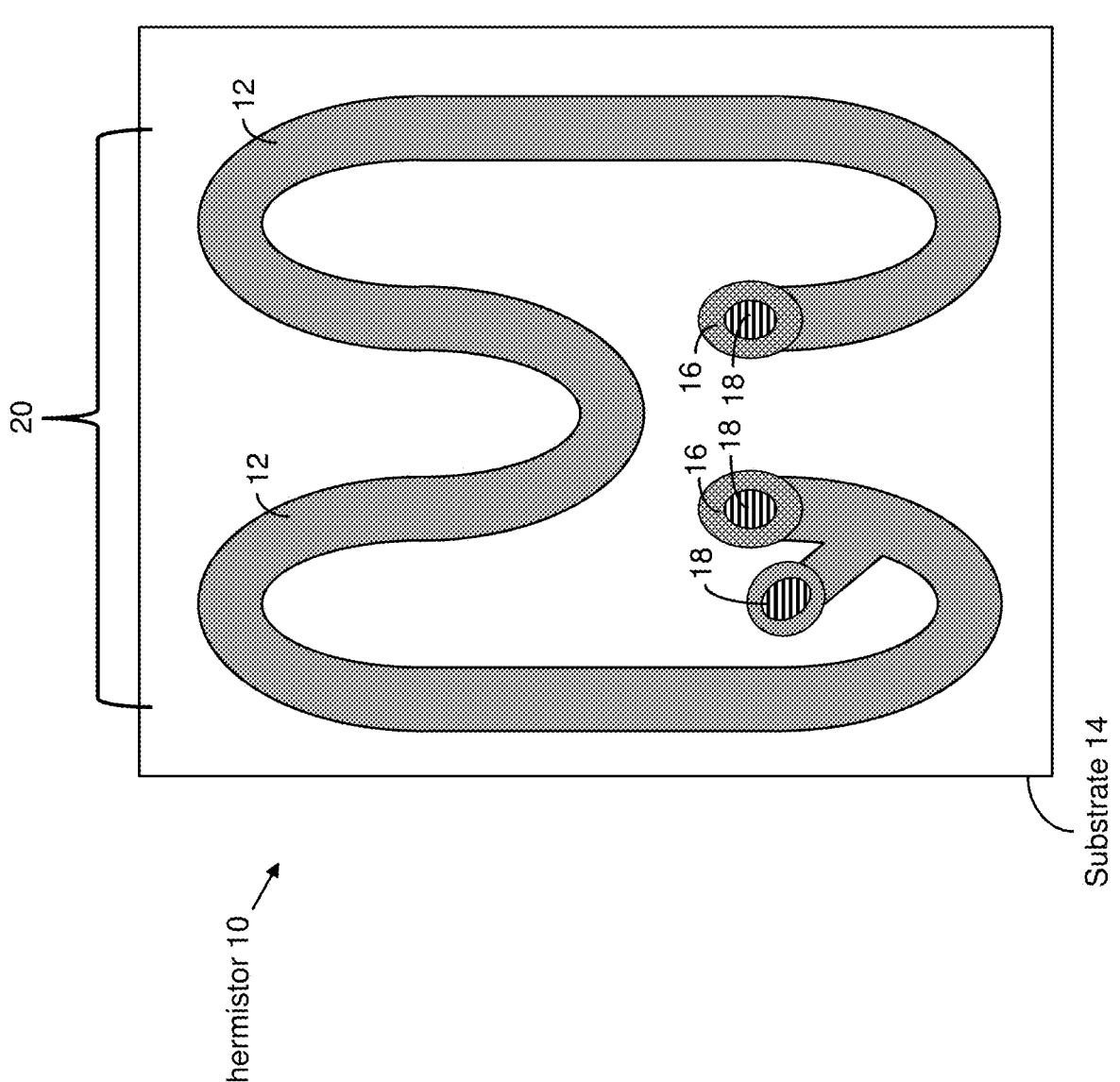
FIG. 5D illustrates a top view of an exemplary thermistor according to certain aspects and embodiments of the present inventions wherein the exemplary thermistor includes three electrical contacts—two electrical contacts are disposed or integrated in or on associated anchors (which are located in close proximity such the anchors secure, attach and/or physically couple the thermistor structure to the substrate) and one electrical contacts are free-standing above/over the substrate and not disposed or integrated in or on anchors; notably, the shape of micromachined thermistor structure is substantially similar to that of FIGS. 5A and 5B.
Figures 7A, 7B, 7C:
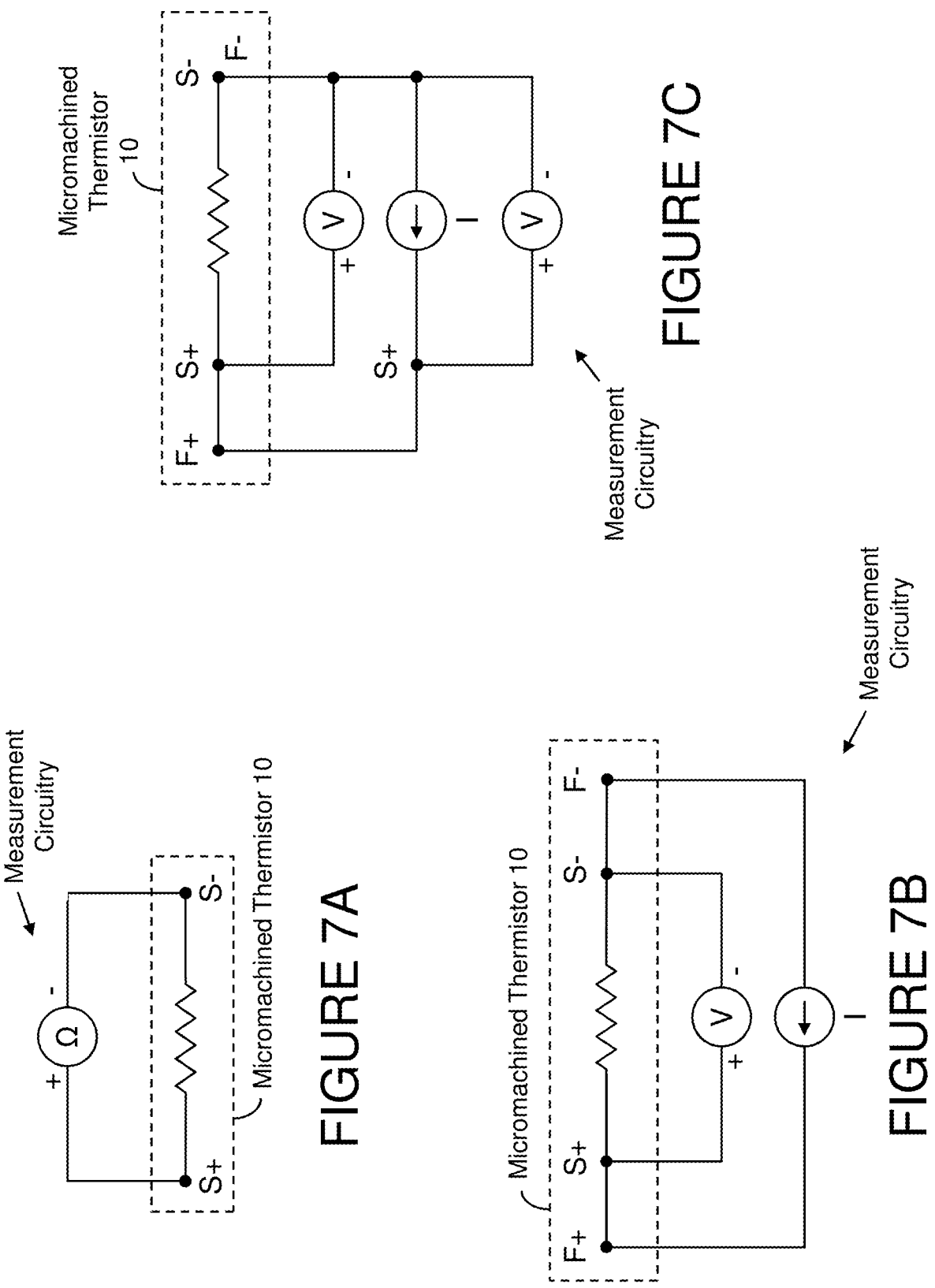
FIGS. 7A-7C illustrate exemplary measuring techniques and architectures to determine the temperature dependent characteristics of the micromachined thermistor structure and/or change therein (for example, resistance), wherein, in FIG. 7A, ohm meter type circuitry may be coupled to the thermistor, in a 2-point measurement architecture/configuration, to measure a resistance or changes in resistance of the thermistor in response to the ambient temperature of the micromachined thermistor structure.

In yet another embodiment, thermistor 10 includes three electrical contacts 18 (see, FIG. 5D) to facilitate implementation of 2-point or 3-point sensing configurations/architectures wherein in a 3-point measurement architecture/configuration, the measuring circuitry measures a resistance or changes in resistance of the thermistor wherein the resistance of the thermistor is determined by applying/forcing a current, I, across the F+/F− terminals, and sensing a voltage, V, across the S+/S− terminals (see, for example, FIG. 7C). Like a 4-point sensing configuration/architecture, a 3-point sensing configuration/architecture may facilitate more accurate measurement of the temperature dependent characteristics (for example, resistance), and/or change therein, of thermistor 10 with minimal, reduced, little or no contribution to the overall or measured resistance due to, for example, (i) the electrical contacts or signal path to the measurement circuitry and/or (ii) non-idealities of the measurement circuitry. Here again, the voltage measurement circuit may be designed to include a large or high input impedance so that little to no current flows in/out of the S+/S− or electrical contacts thereby facilitating a highly accurate measurement of the resistance (or change therein) of thermistor 10.

Figure 7D:
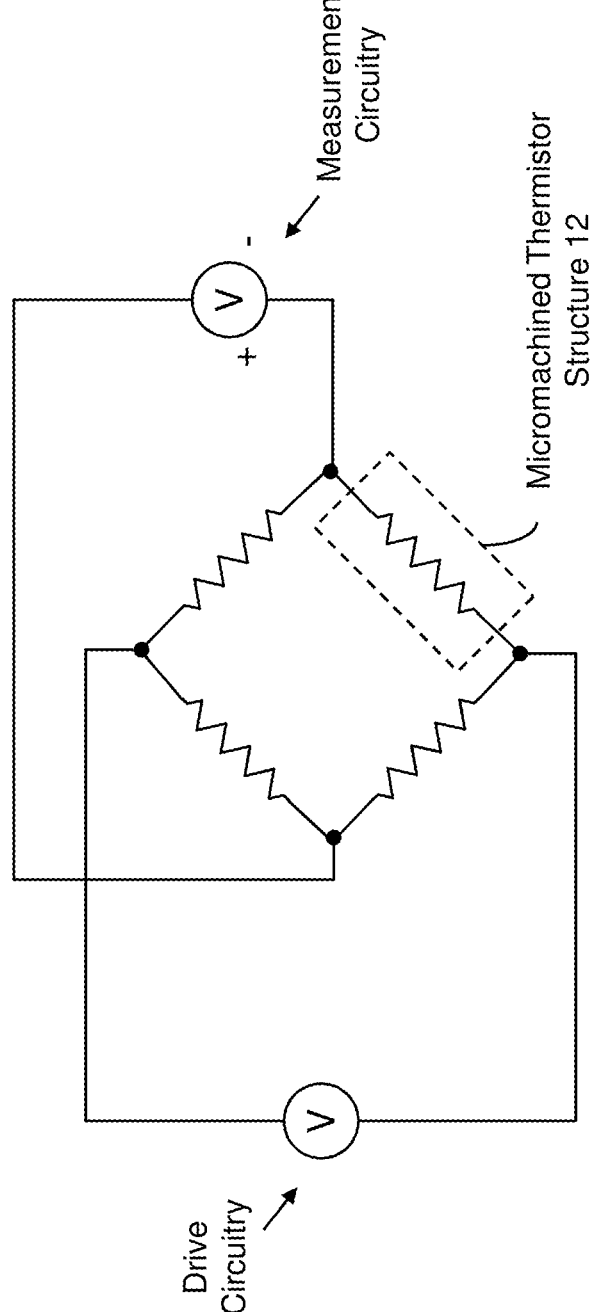
FIG. 7D illustrates exemplary measuring technique and architecture employing a bridge-type circuit to determine the temperature dependent characteristics of the micromachined thermistor structure and/or change therein (for example, resistance), in accordance with certain aspects and/or embodiments of the present inventions wherein at least one portion of the bridge corresponds to the temperature dependent parameter of the micromachined thermistor structure.

Notably, the present inventions may employ any measuring technique or architecture now known or later developed. For example, a bridge-type circuit (See, for example, FIG. 7D) may be employed to determine the temperature dependent characteristics of the micromachined thermistor structure and/or change therein (for example, resistance) wherein at least one portion of the bridge corresponds to the temperature dependent parameter of the micromachined thermistor structure.

In one embodiment, one or more of the electrical contacts 18 of thermistor 10 are physically integrated or disposed in one or more of anchors 16 of thermistor 10. (See, FIGS. 2A-2C, 3A, 3E, 5A and 5B). However, in other embodiment, one or more (or all) of the electrical contacts 18 are not physically integrated or disposed in one or more of anchors 16 of thermistor 10. (See, FIGS. 5C and 5D). The anchors 16 and electrical contacts 18 may be fabricated using any technique and/or material now known or later developed; in one embodiment, such anchors and contacts are fabricated using the techniques and/or materials described and/or illustrated in U.S. Pat. No. 6,936,491.

The micromachined thermistor structure 12 may be sealed or encapsulated in a chamber—thereby protecting micromachined thermistor structure 12 from the external environment and/or controlling the environment/conditions (for example, pressure) in which micromachined thermistor structure 12 operates/resides. Indeed, prior to, during and/or after sealing the chamber, the environment within the chamber may be defined, for example, via materials and processing techniques that provide predetermined characteristics of the environment in the chamber, for example, predetermined pressure and/or fluid (for example, an inert gas or anti-stiction fluid). (See, for example, U.S. Pat. Nos. 6,930,367, 7,449,355 and 7,514,283). Such a configuration reduces the likelihood of contamination of the components of thermistor 10, including micromachined thermistor structure 12, which may improve stability and reliability of thermistor 10. Notably, the environment within the chamber may be defined using any technique now known or later developed.

Figure 8A:
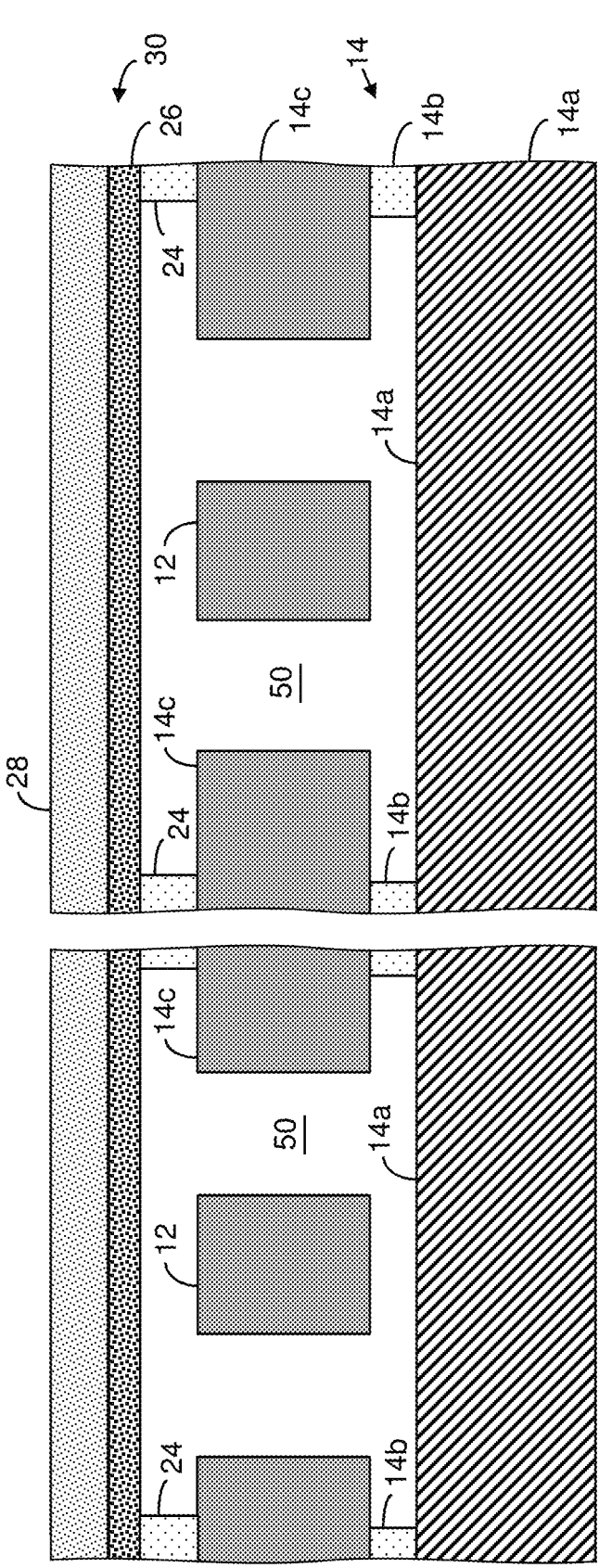
FIG. 8A illustrates a cross-sectional view, along dotted line A-A, of the exemplary thermistor illustrated in FIG. 5A wherein the exemplary thermistor is disposed in a cavity via thin-film encapsulation structure, in accordance with certain aspects and/or embodiments of the present inventions.
Figure 9A:
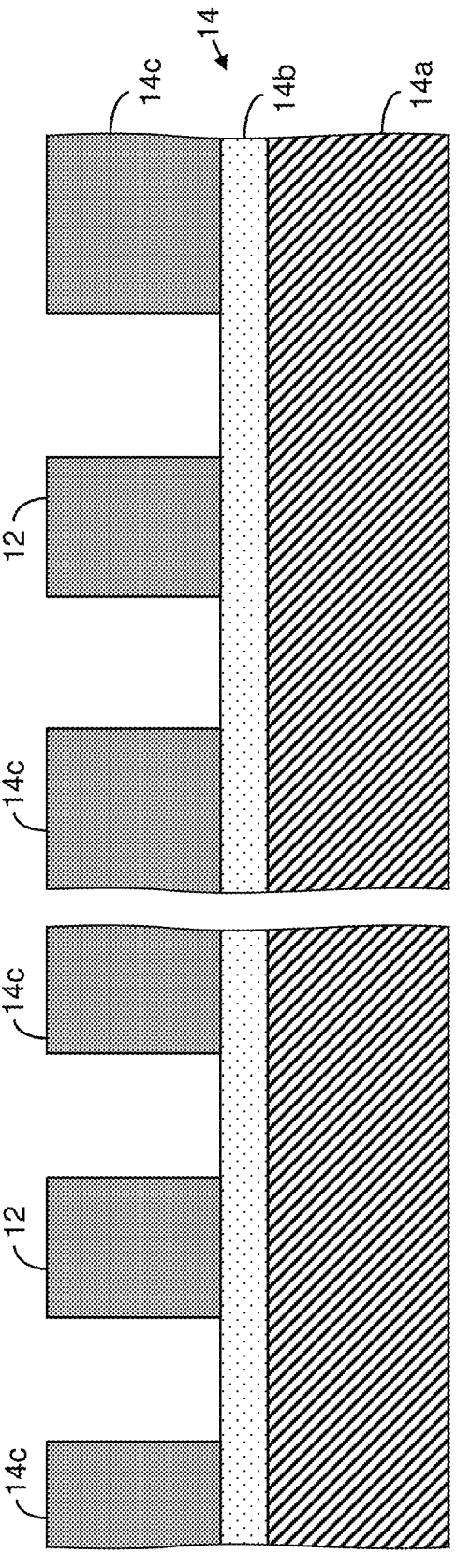
Figure 9B:
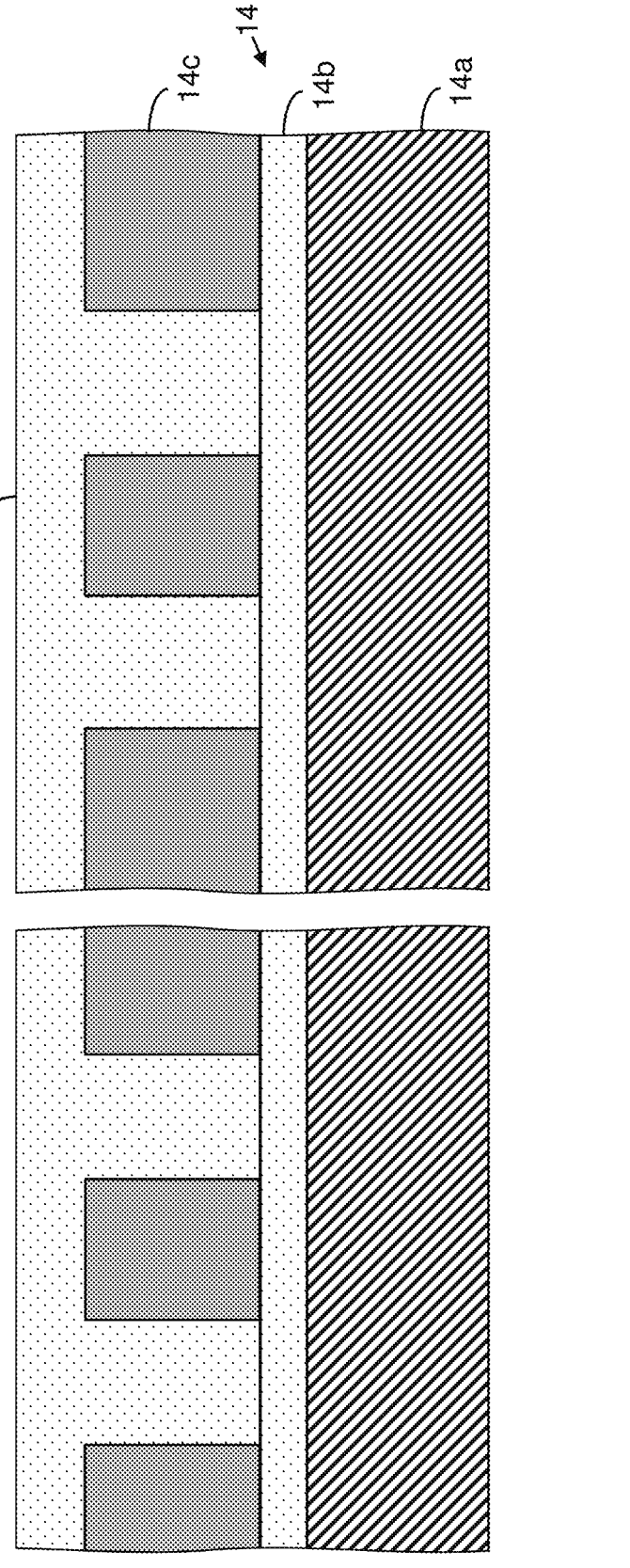
Figure 9C:
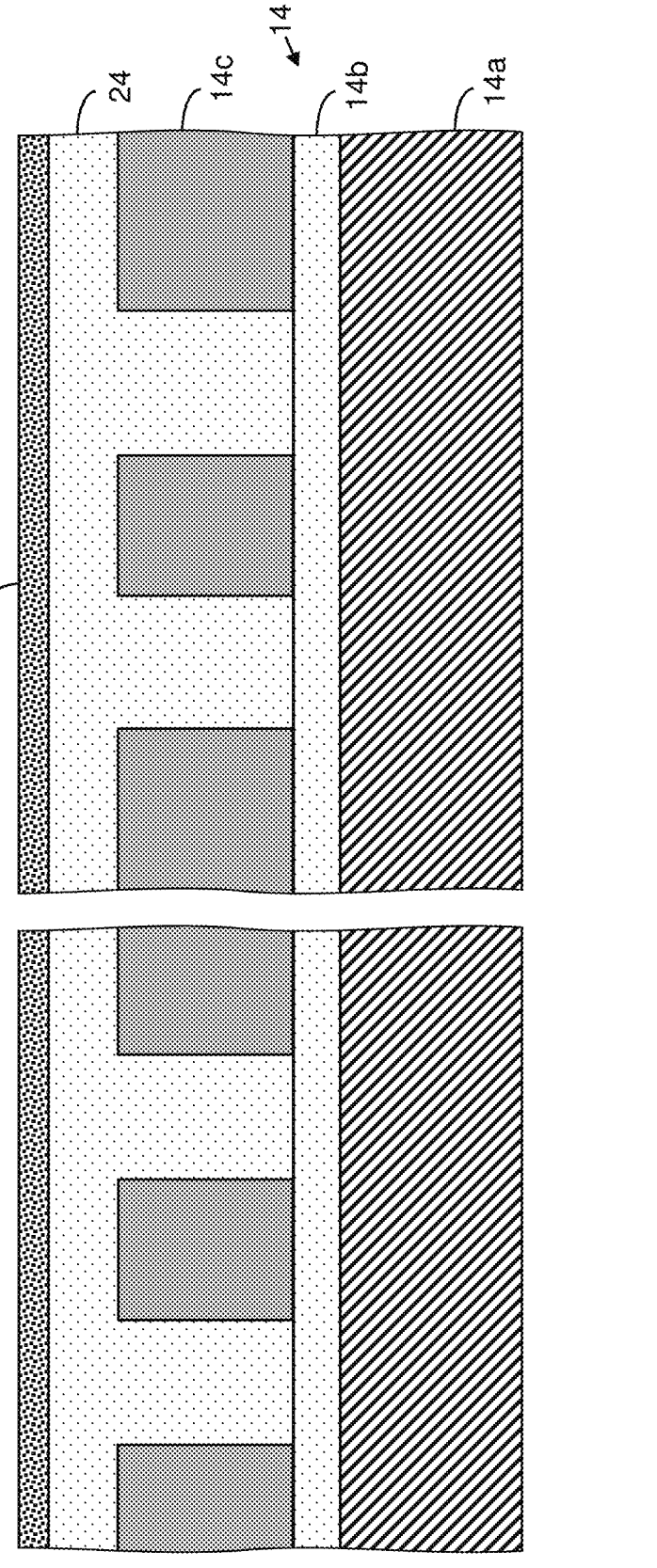
Figure 9D:
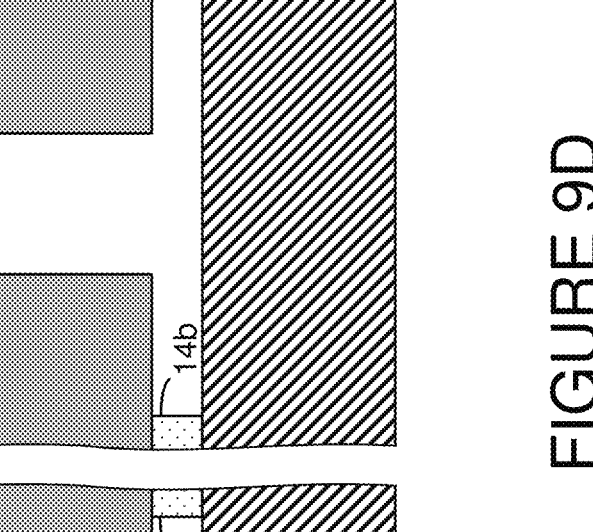

In one embodiment, micromachined thermistor structure 12 may be sealed in a cavity via thin-film encapsulation process and structure. (See, FIG. 8A). Briefly, in one exemplary embodiment, after defining micromachined thermistor structure 12 (see FIGS. 5A and 9A), a process of fabricating a thin-film encapsulation structure starts with depositing or providing sacrificial layer 24 over micromachined thermistor structure 12 (see FIG. 9B). Thereafter, layer 26 is provided, for example, formed, deposited and/or grown (see FIG. 9C). Vents (not illustrated in this series of figures) are then formed in encapsulation layer 26 and the sacrificial layer 24 is removed or etched around micromachined thermistor structure 12 thereby substantially or entirely releasing (vertically and horizontally) micromachined thermistor structure 12. (See, FIG. 9D). As noted above, in this way, the impact of internal or external stresses introduced during operation on the temperature dependent characteristics (for example, resistance) of micromachined thermistor structure 12 is limited, reduced and/or minimized (relative to, for example, micromachined thermistor structure 12 that is disposed in substrate 14). That is, the temperature dependent characteristics (for example, resistance) of micromachined thermistor structure 12, which is released (vertically and/or horizontally), suspended, and/or "free-standing", are relatively and/or substantially independent of internally or externally induced stresses in substrate 14 and, as such, provide a more accurate and/or reliable representation of the ambient temperature notwithstanding any non-temperature related/dependent ambient operating conditions of thermistor 10 (for example, substrate stress or forces (internal or external) applied thereto).

Figure 9E:
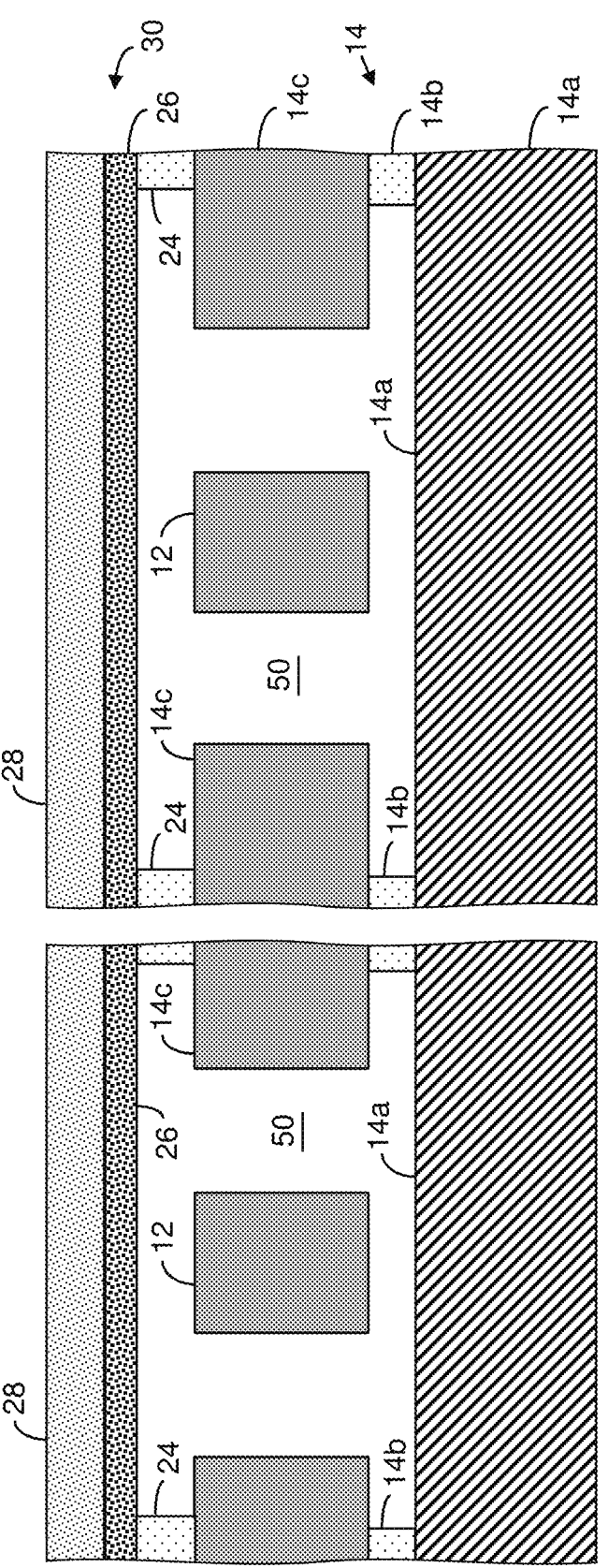

After releasing micromachined thermistor structure 12, in one embodiment, the vents may be closed and the cavity sealed via another deposition of a layer 28. (See, FIG. 9E). A detailed discussion of an exemplary thin film encapsulation technique is described and illustrated in U.S. Pat. Nos. 6,936,491, 7,075,160, and 7,514,283. Notably, the micromachined thermistor structure may be sealed or encapsulated using any technique now known or later developed. In one embodiment, the vents may be sealed via attaching a die, wafer or glass substrate (which may include other structures or integrated circuitry thereon) to encapsulation layer 26.

Figure 6B:
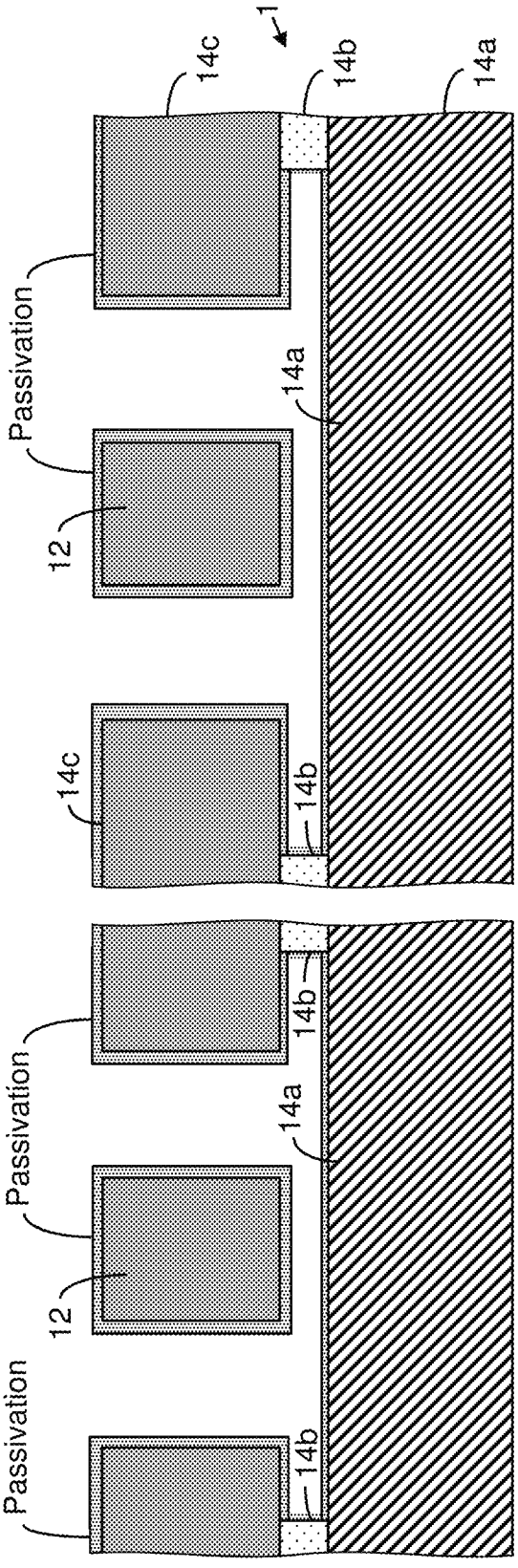

In one embodiment, micromachined thermistor structure 12 is unsealed or not encapsulated and thereby directly exposed to the external atmosphere/environment. Indeed, in those embodiments where micromachined thermistor structure 12 is unsealed or not encapsulated, it may be advantageous to include a passivation layer on micromachined thermistor structure 12. (See, FIG. 6B). In one embodiment, the passivation layer is a silicon oxide and/or a silicon nitride material which is deposited or thermally grown. Such a passivation layer may improve long term stability of the thermistor wherein the relationship between temperature and resistance is more stable over the life of the thermistor.

Figure 6C:
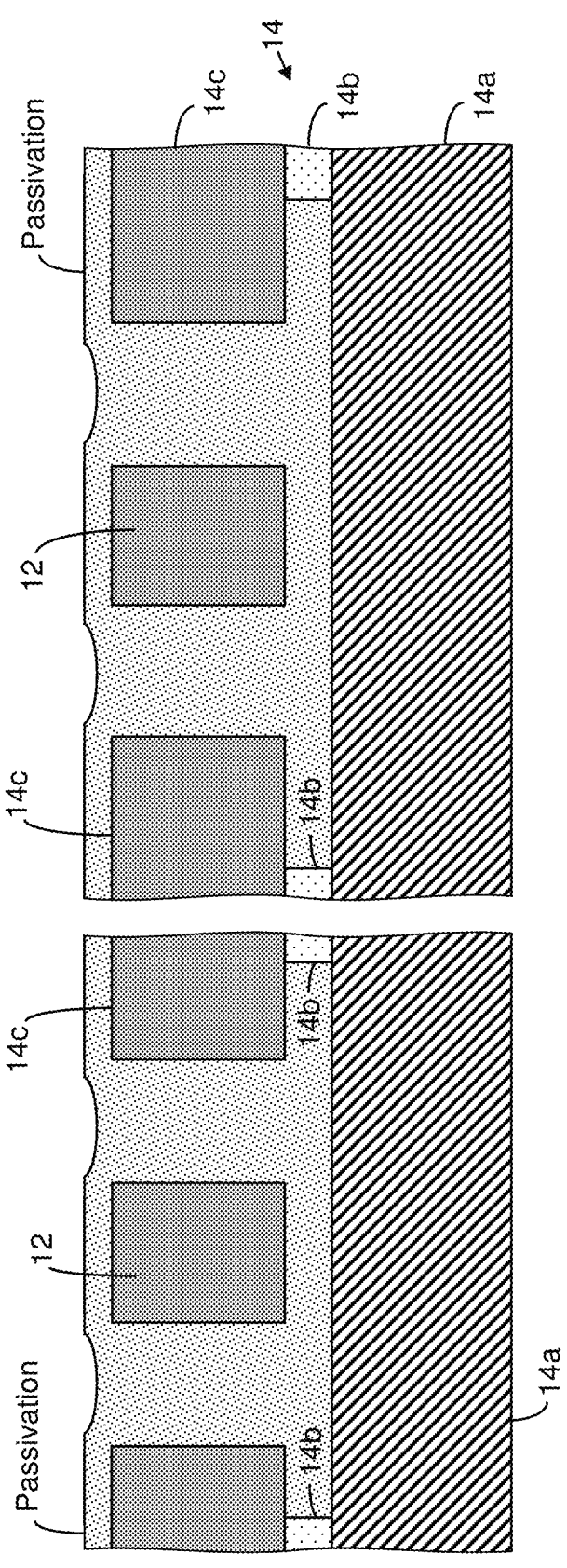
FIG. 6C illustrates a cross-sectional view, along dotted line A-A, of the exemplary thermistor illustrated in FIG. 5A, wherein the thermistor includes a material (for example, a compliant like material such as a gel, soft plastic or rubber (for example, silicon rubber) like material) that does not communicate appreciable stress to the micromachined thermistor structure but protects the thermistor structure to, among other things, improve the long term stability of the thermistor (wherein the temperature dependent characteristics of the thermistor may be more stable over time (for example, less change in resistance over time)

With reference to FIG. 6C, in another embodiment, a passivation material (for example, a compliant like material such as a gel, soft plastic or rubber-like material (for example, silicon rubber)) may be employed to protect micromachined thermistor structure 12 and improve long term stability of thermistor 10 (wherein the temperature dependent characteristics of the thermistor may be more stable over time (for example, less change in resistance over time). The passivation material of this embodiment is selected and/or applied in such a manner as to not communicate appreciable stress to the micromachined thermistor structure. In this way, the impact of internal or external stress introduced into micromachined thermistor structure 12 as a result of the passivation is limited and/or managed in relation to the temperature dependent output signal.

Figure 8B:
FIG. 8B illustrates a cross-sectional view, along dotted line A-A, of the exemplary thermistor illustrated in FIG. 5A wherein the exemplary thermistor is sealed, for example, in a TO-8 "can" (or like structure) and/or in a cavity via a wafer or glass substrate bonded to the thermistor die or substrate, in accordance with certain aspects and/or embodiments of the present inventions.

In another embodiment, micromachined thermistor structure 12 may be sealed, for example, in a TO-8 "can" (or like structure) and/or in a cavity via a wafer or glass substrate 30 bonded to the thermistor die or substrate. (See, FIG. 8B). In this regard, micromachined thermistor structure 12 may be sealed in a chamber, for example, a hermetically sealed metal container (see, for example, U.S. Pat. No. 6,307,815) or bonded to a semiconductor, metal or glass-like substrate having a chamber to house, accommodate or cover micromachined thermistor structure 12 (see, for example, U.S. Pat. Nos. 6,146,917, 6,352,935, 6,477,901, and 6,507,082). In the context of the hermetically sealed metal container, the substrate on, or in which, the resistive structure would reside may be disposed in and affixed to the metal container. The hermetically sealed metal container typically serves as a primary package as well.

Notably, as intimated above, after or during sealing of the chamber, an anti-stiction fluid may be incorporated into the chamber. (See, for example, U.S. Pat. Nos. 6,930,367 and 7,449,355). In this way, the anti-stiction characteristics of the micromachined thermistor structure of the thermistor may be enhanced. Indeed, gases (for example, argon, nitrogen and/or helium) may be trapped within the chamber With reference to FIGS. 10A and 10B, the serpentine or undulating shape of micromachined thermistor structure 12 may be symmetrical about axis 22. In this embodiment, micromachined thermistor structure 12 includes a loop-shape, wherein both legs or portions of the loop-shape of the micromachined thermistor structure include a serpentine or undulating shape or portion 20 to, among other things, increase the sensitivity of the signal corresponding to the temperature dependent characteristics of micromachined thermistor structure 12, increase resistance of micromachined thermistor structure 12, and/or limit and/or reduce the impact on micromachined thermistor structure 12 (or portions thereof) of internal or external forces (for example, stress and/or vibration). In this embodiment, the serpentine or undulating portion 20 of micromachined thermistor structure 12 are substantially or entirely released (vertically and horizontally), suspended, and/or "free-standing" relative to substrate 14. (See, FIG. 11A wherein portion 20 of micromachined thermistor structure 12 is vertically and horizontally released from substrate). It should be noted that micromachined thermistor structure 12 may include any shape or configuration now known or later developed.

Figure 10A:
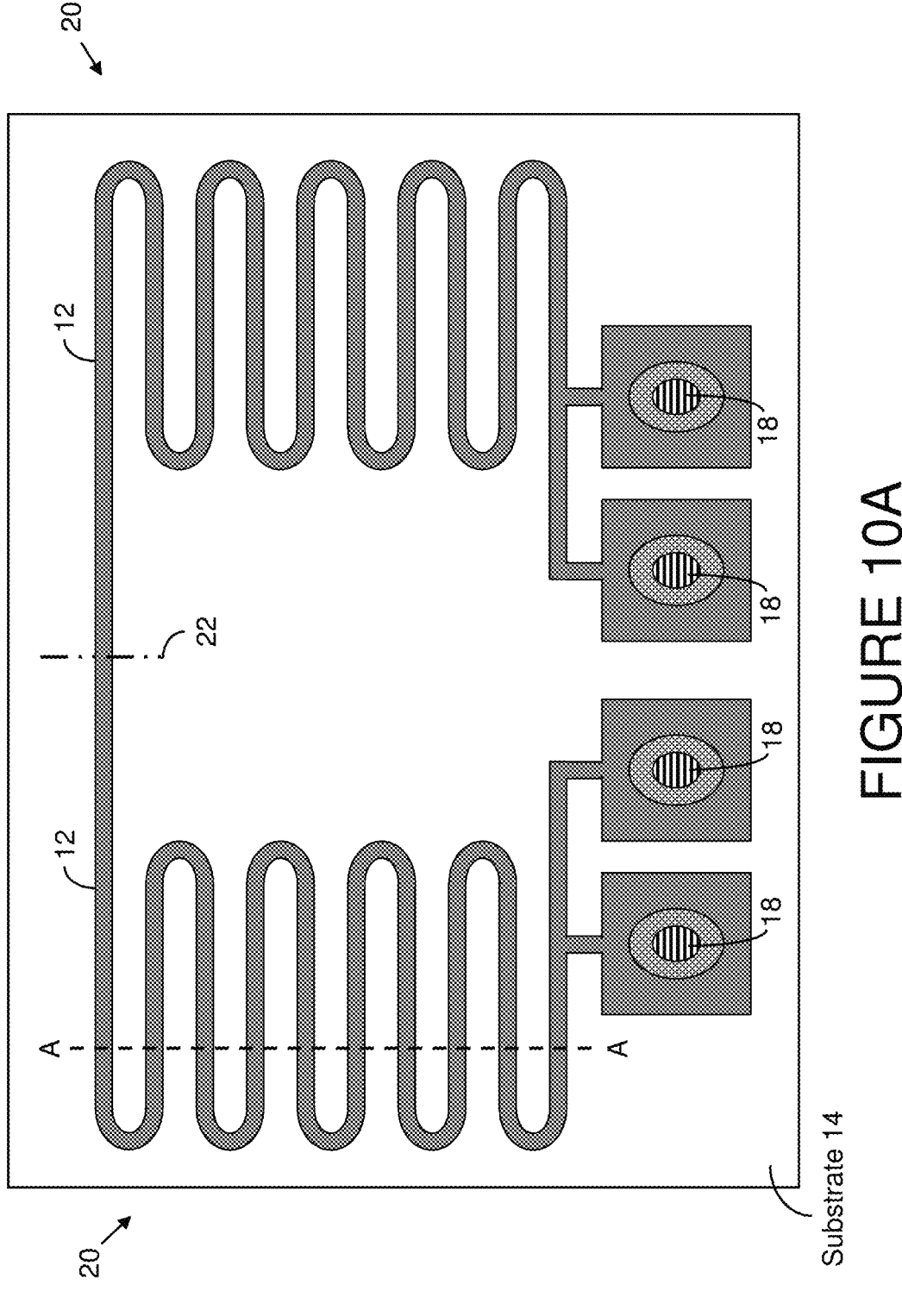
FIGS. 10A and 10B illustrate top views of an exemplary thermistors according to certain aspects and embodiments of the present inventions wherein the micromachined thermistor structure includes (i) a loop-shape and (ii) a serpentine or undulating shape in a plurality of portions of the micromachined thermistor structure wherein the serpentine or undulating shape, among other things, increases the temperature dependent characteristics of the micromachined thermistor structure, increases resistance of the overall structure and/or limits and/or reduces the impact on the micromachined thermistor structure (or portions thereof) of internal or external stress; notably, exemplary thermistors illustrated in FIG. 10B includes an anchor which is offset or displaced from signal (for example, current flow $I_{signal}$) through or in the micromachined thermistor structure such that the impact of internal or external stress introduced into the micromachined thermistor structure via the offset or displaced anchor may be limited, minimized and/or reduced in relation to the temperature dependent output signal.
Figure 10B:
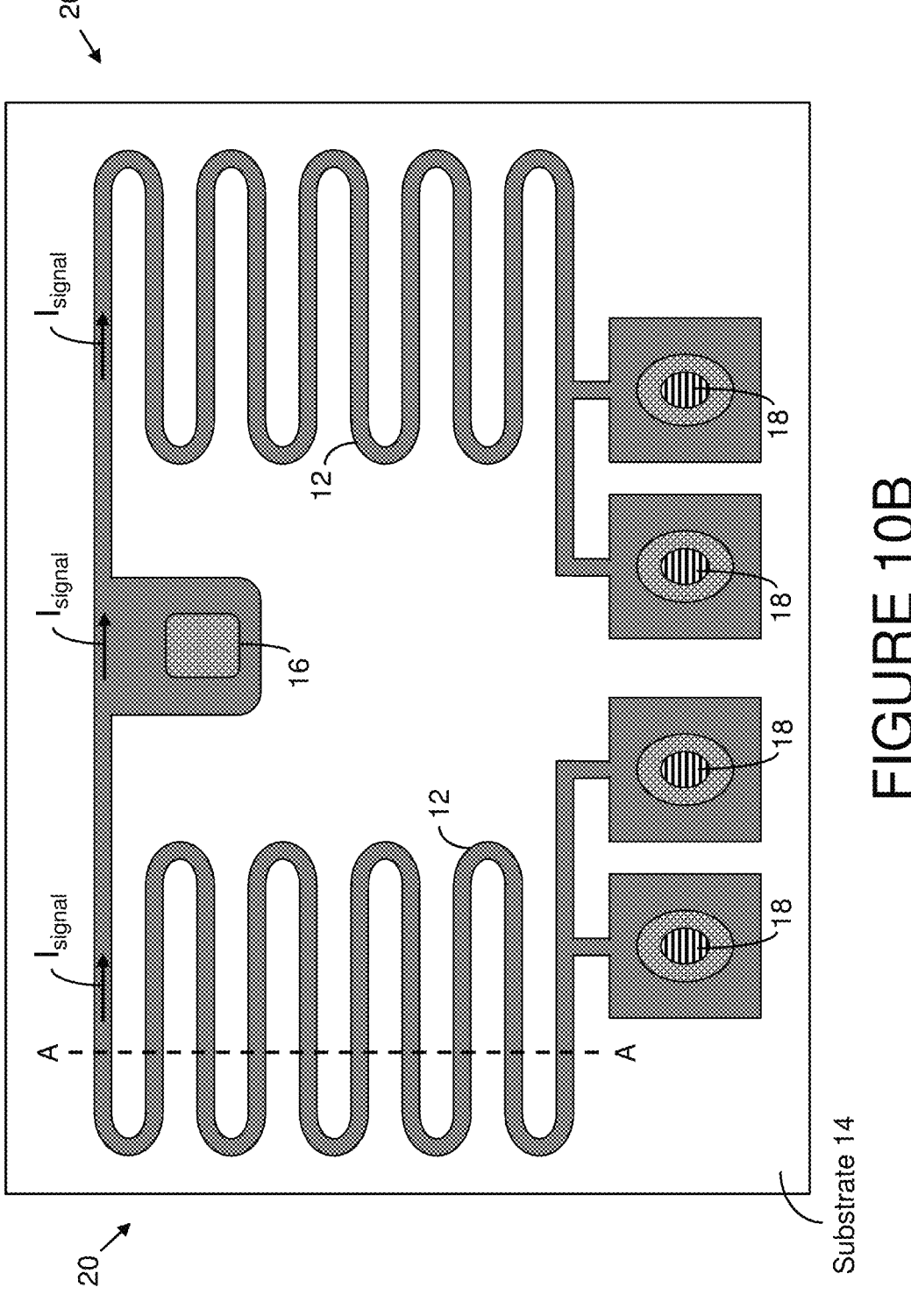
Figure 10C:
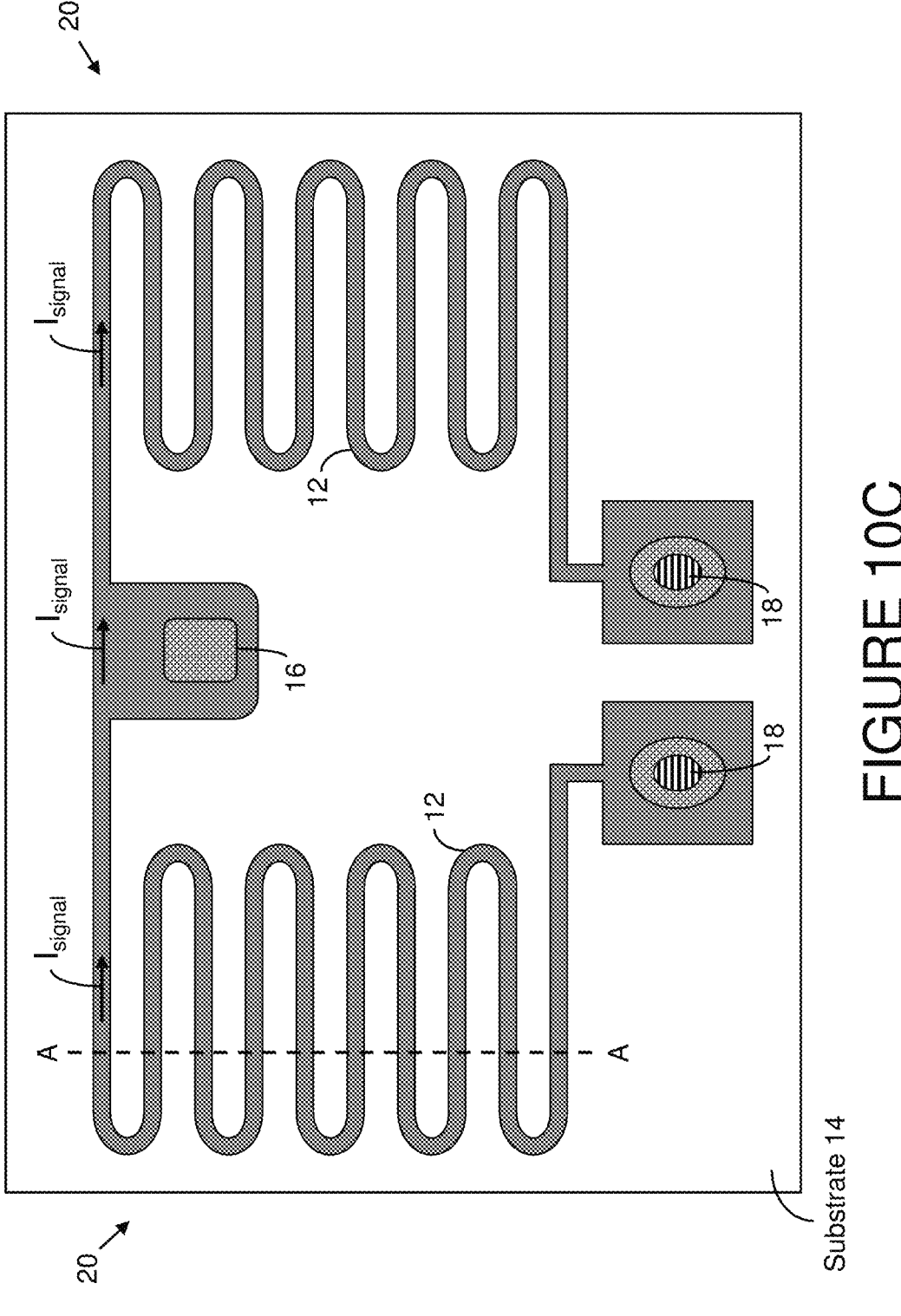
FIG. 10C illustrates a top view of an exemplary thermistor according to certain aspects and embodiments of the present inventions wherein the micromachined thermistor structure includes the shape and attributes of FIG. 10B, however, in this exemplary illustrated embodiment, the thermistor includes two electrical contacts to be implemented in a 2-point measurement architecture/configuration, wherein, for example, ohm meter type circuitry may measure a resistance or changes in resistance of the thermistor in response to the ambient temperature (see, for example, FIG. 7B)
Figure 10D:
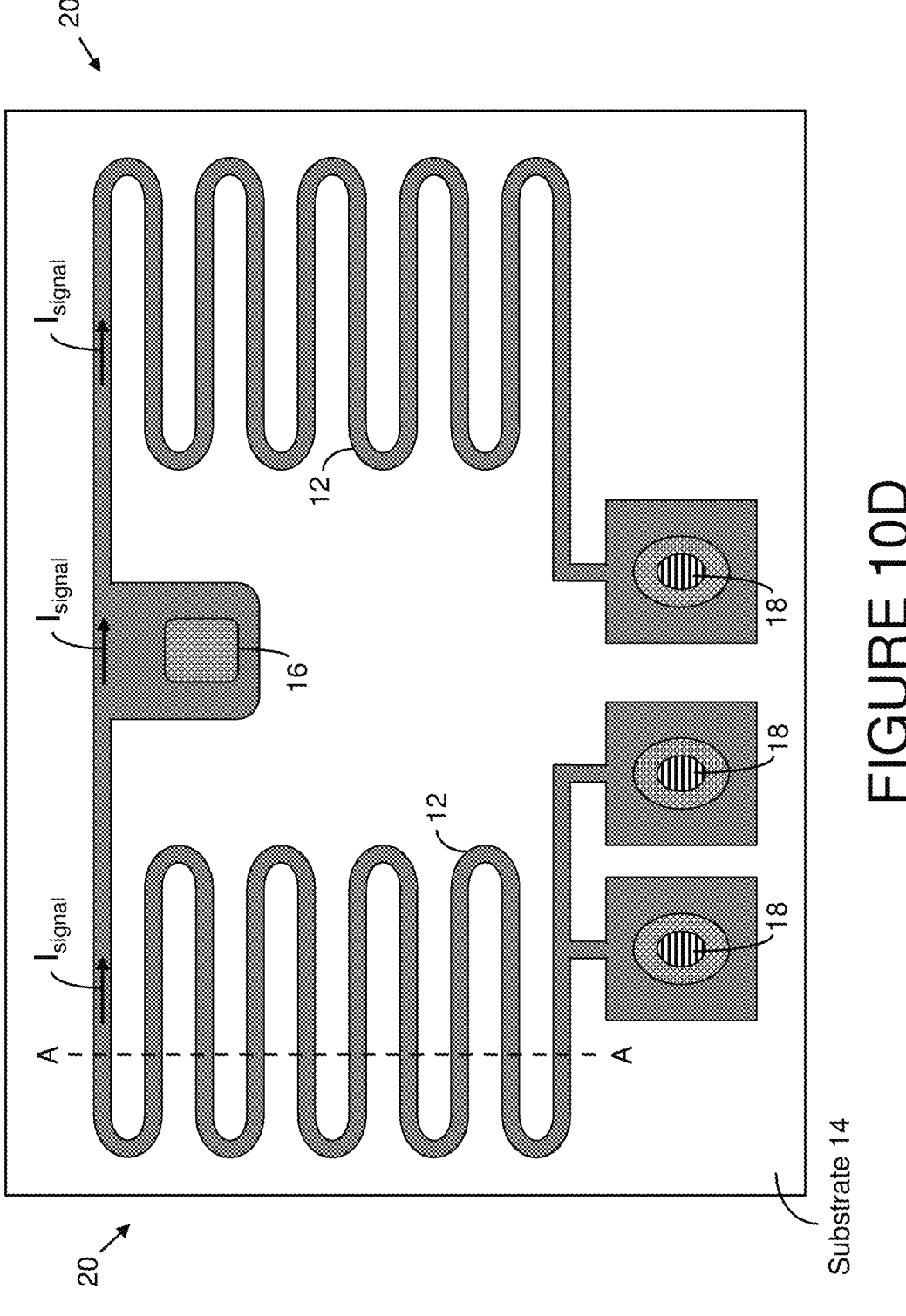
FIG. 10D illustrates a top view of an exemplary thermistor according to certain aspects and embodiments of the present inventions wherein the micromachined thermistor structure includes the shape and attributes of FIGS. 10B and 10C, however, in this exemplary illustrated embodiment, the thermistor includes three electrical contacts to be implemented in a 3-point measurement architecture/configuration, wherein, for example, current meter and voltmeter type circuitry may be coupled to the thermistor of FIG. 10D, in a 3-point measurement architecture/configuration, to measure a resistance or changes in resistance of the thermistor wherein the resistance of the thermistor is determined by applying/forcing a current, I, across the F+/F− terminals, and sensing a voltage, V, across the S+/S− terminals (see, for example, FIG. 7C)
Figure 11A:
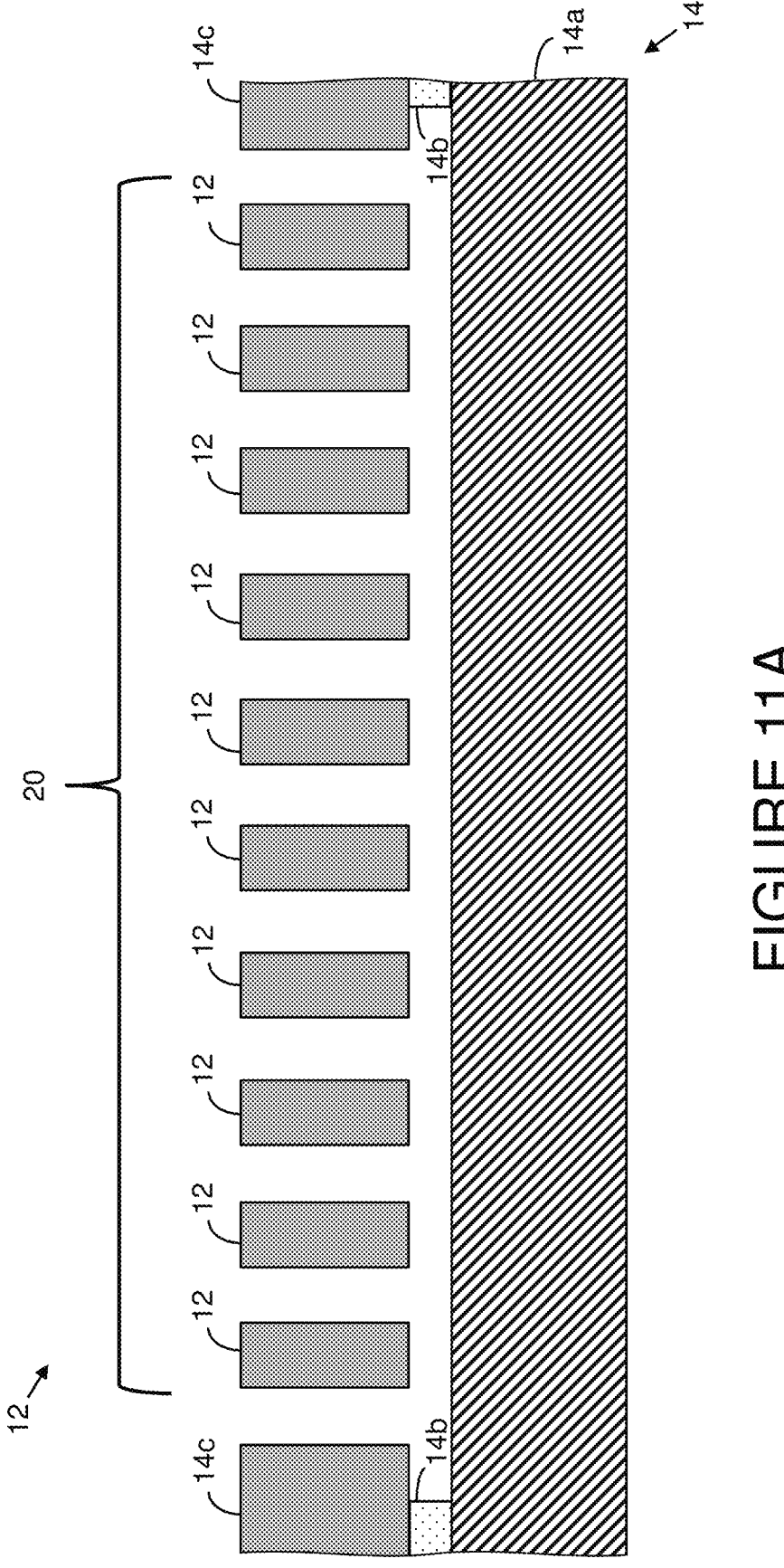
FIGS. 11A-11C illustrate cross-sectional views, along dotted line A-A, of the exemplary thermistor illustrated in FIGS. 10A-10D, in accordance with certain aspects and/or embodiments of the present inventions, wherein the exemplary thermistor of FIG. 11B is disposed in a cavity via thin-film encapsulation structure, in accordance with certain aspects and/or embodiments of the present inventions, and the exemplary thermistor of FIG. 11C is sealed, for example, in a TO-8 "can" (or like structure) and/or in a cavity via a wafer or glass substrate bonded to the thermistor die or substrate, in accordance with certain aspects and/or embodiments of the present inventions.

With reference to FIG. 10A, thermistor 10 may include one or more anchors that are displaced relative to the signal flow (for example, current flow) through or in the micromachined thermistor structure. (See, anchor 16 and signal $I_{signal}$) In this way, the impact of internal or external stress introduced into the micromachined thermistor structure via anchor 16 are limited, minimized and/or reduced in relation to the temperature dependent output signal ($I_{signal}$). That is, locating the anchors distant from the path of the signal flow used in connection with the measurement of the temperature dependent characteristics (for example, resistance) of micromachined thermistor structure 12, the output of micromachined thermistor structure 12 provides a more accurate and/or a more reliable representation of the ambient temperature regardless of the non-temperature related/dependent ambient operating conditions of thermistor 10 (for example, substrate stress or forces (internal or external) applied thereto).

Figures 13A, 13B:
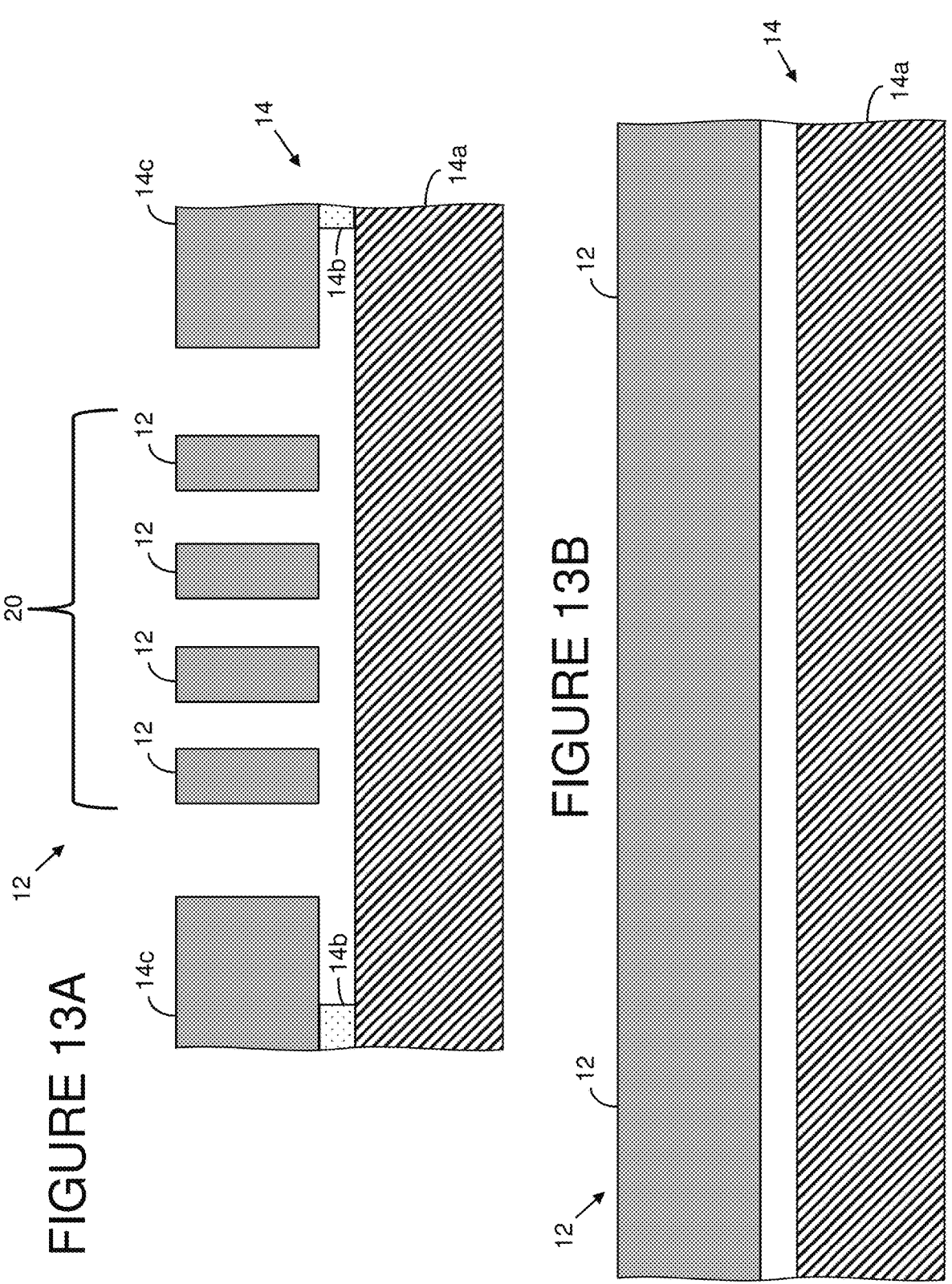
FIGS. 13A and 13B illustrate cross-sectional views, along dotted line A-A, of the exemplary thermistor illustrated in (i) FIGS. 12A and 12B and (ii) FIGS. 12C and 12D, respectively, in accordance with certain aspects and/or embodiments of the present inventions.

As indicated above, micromachined thermistor structure 12 may include any shape now known or later developed including a shape which is not a loop-shape. (See, for example, FIGS. 12A-12E). Here, anchors 16 of thermistor 10 (which secure, attach and/or physically couple the micromachined thermistor structure 12 to substrate 14) are not located in close proximity so as to form a loop-shape. In these embodiment, micromachined thermistor structure 12 is substantially or entirely released (vertically and horizontally), suspended, and/or "free-standing" relative to substrate 14. (See, the cross-sectional view of FIGS. 13A and 13B). In this way, the impact of internal or external stresses introduced during operation on the temperature dependent characteristics (for example, resistance) of micromachined thermistor structure 12 is limited, reduced and/or minimized (relative to, for example, micromachined thermistor structure 12 that is disposed in substrate 14). That is, the temperature dependent characteristics (for example, resistance) of micromachined thermistor structure 12, which is released (vertically and/or horizontally), suspended, and/or "free-standing" relative to the substrate, are relatively and/or substantially independent of internally or externally induced stresses in substrate 14 and, as such, provide a more accurate and/or reliable representation of the ambient temperature notwithstanding any non-temperature related/dependent ambient operating conditions of thermistor 10 (for example, substrate stress or forces (internal or external) applied thereto).

Figure 11B:
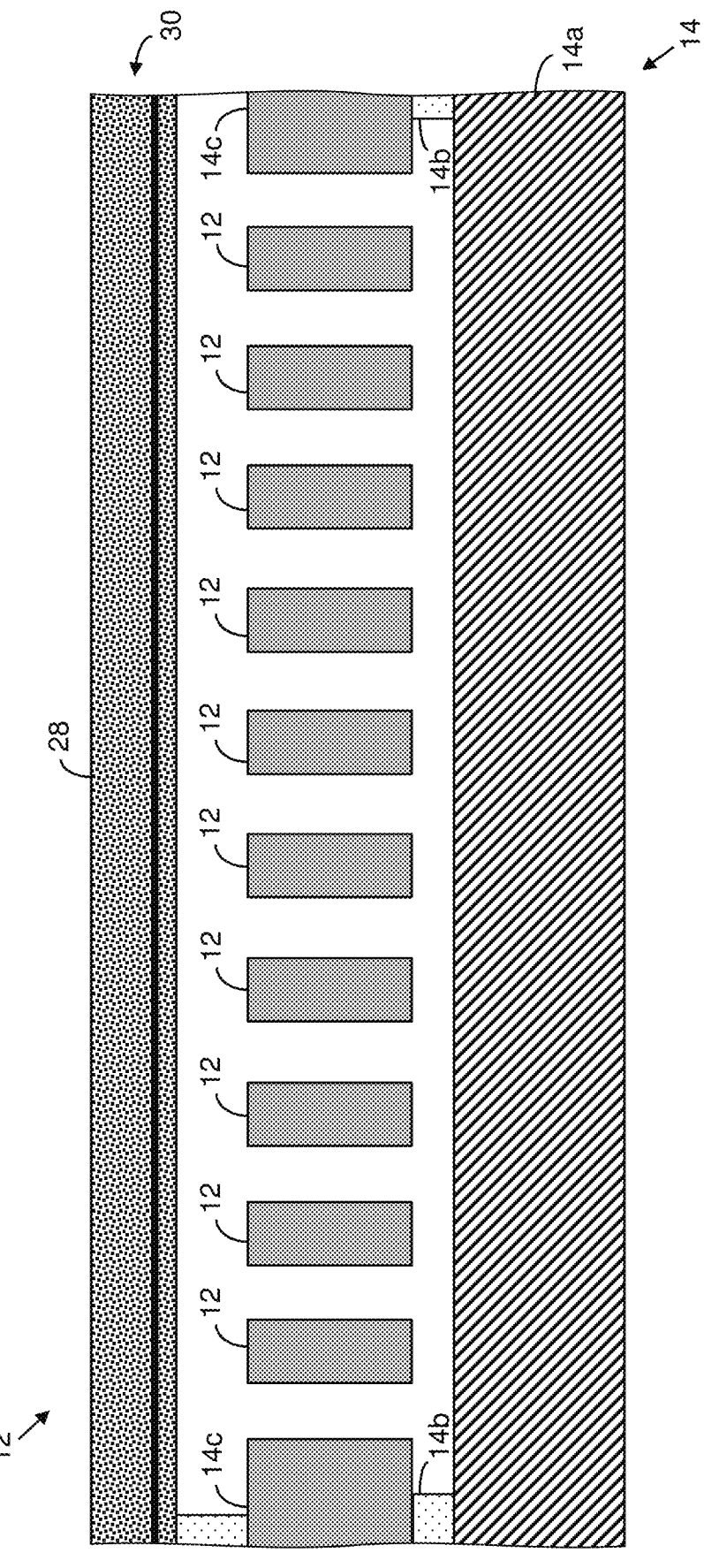
Figure 11C:
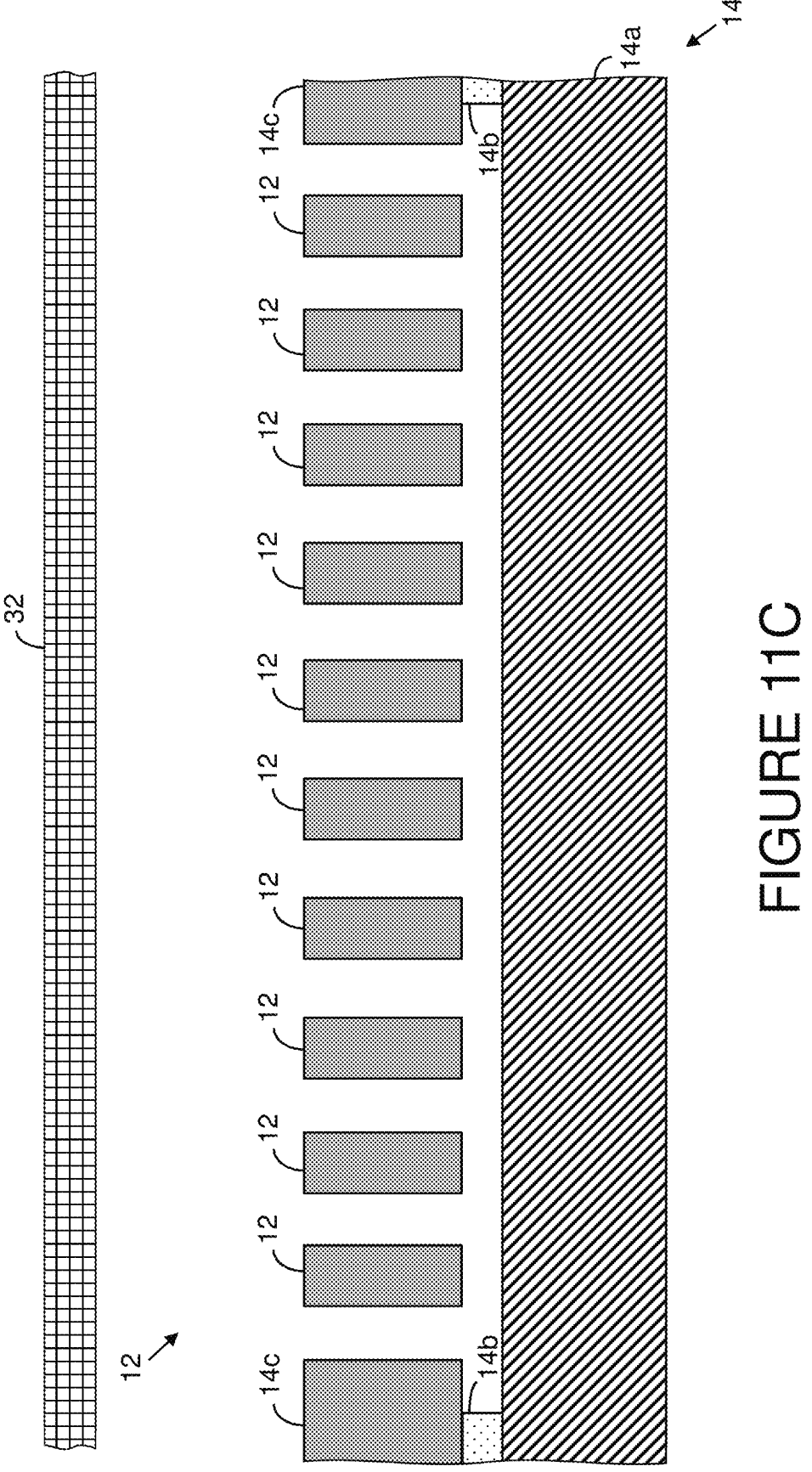
Figure 12A:
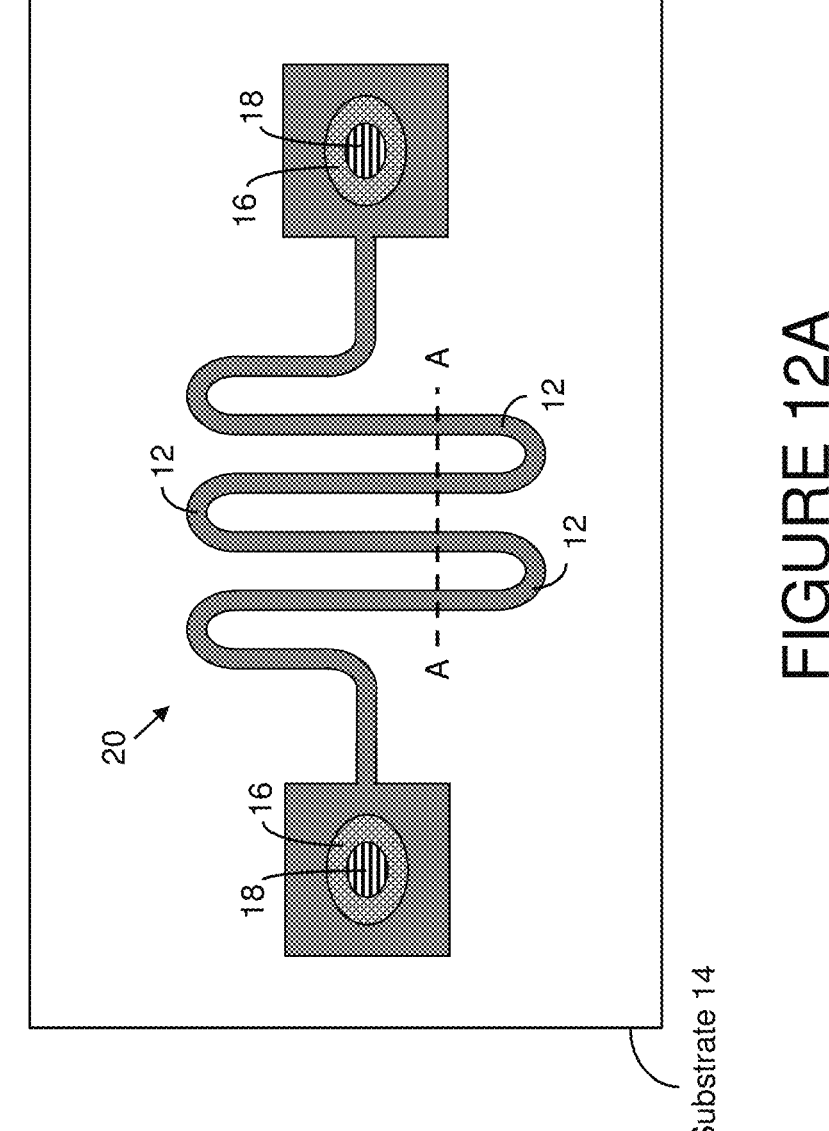
FIGS. 12A and 12B illustrate a top view of an exemplary thermistor according to certain aspects and embodiments of the present inventions wherein the micromachined thermistor structure (i) is substantially or entirely released (vertically and/or horizontally), suspended over, and/or "free-standing" relative to the substrate, and is substantially independent of internally or externally induced stresses in the substrate, and (ii) includes a serpentine or undulating shape which, among other things, increases the temperature dependent characteristics of the micromachined thermistor structure, increases resistance of the overall structure and limits and/or reduces the impact on the micromachined thermistor structure (or portions thereof) of internal or external stress.
Figure 12B:
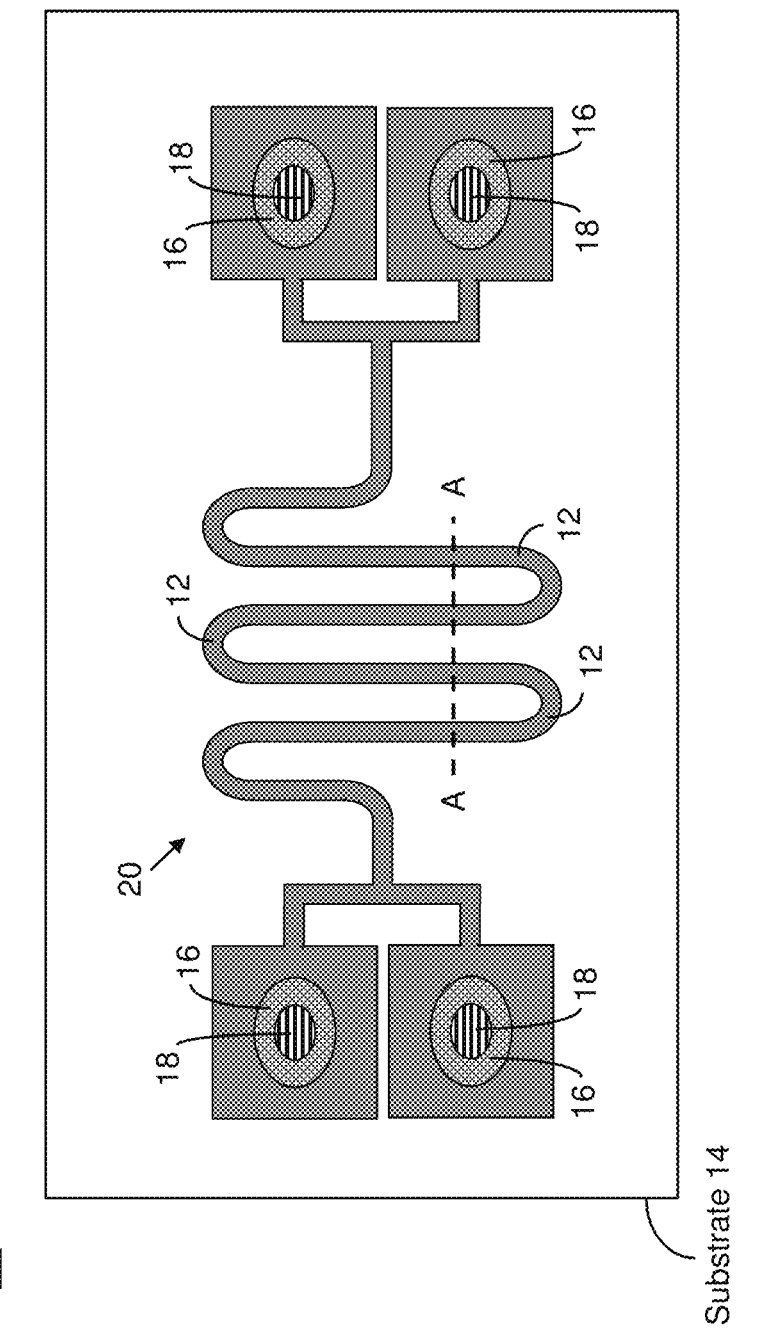
Figure 12C:
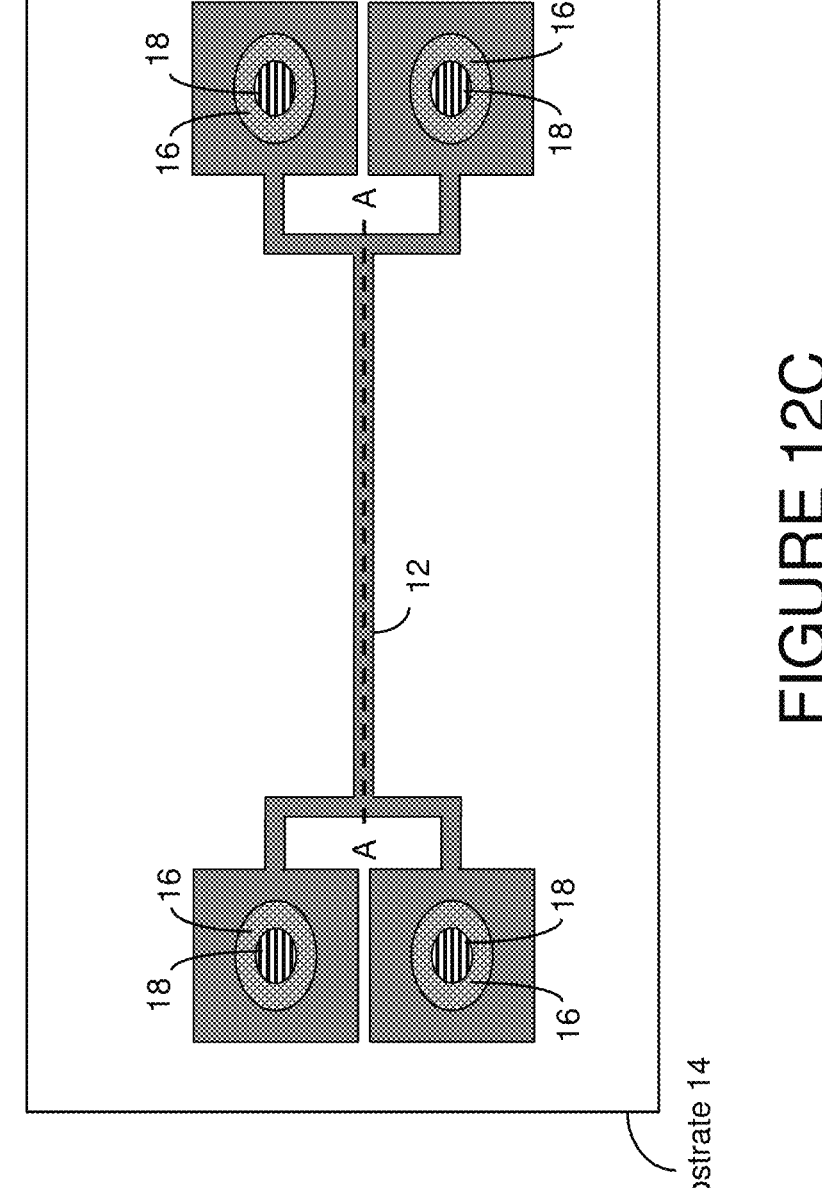
FIGS. 12C and 12D illustrate a top view of an exemplary thermistor according to certain aspects and embodiments of the present inventions wherein the micromachined thermistor structure is substantially or entirely released (vertically and/or horizontally), suspended over, and/or "free-standing" relative to the substrate, and is substantially independent of internally or externally induced stresses in the substrate.
Figure 12D:
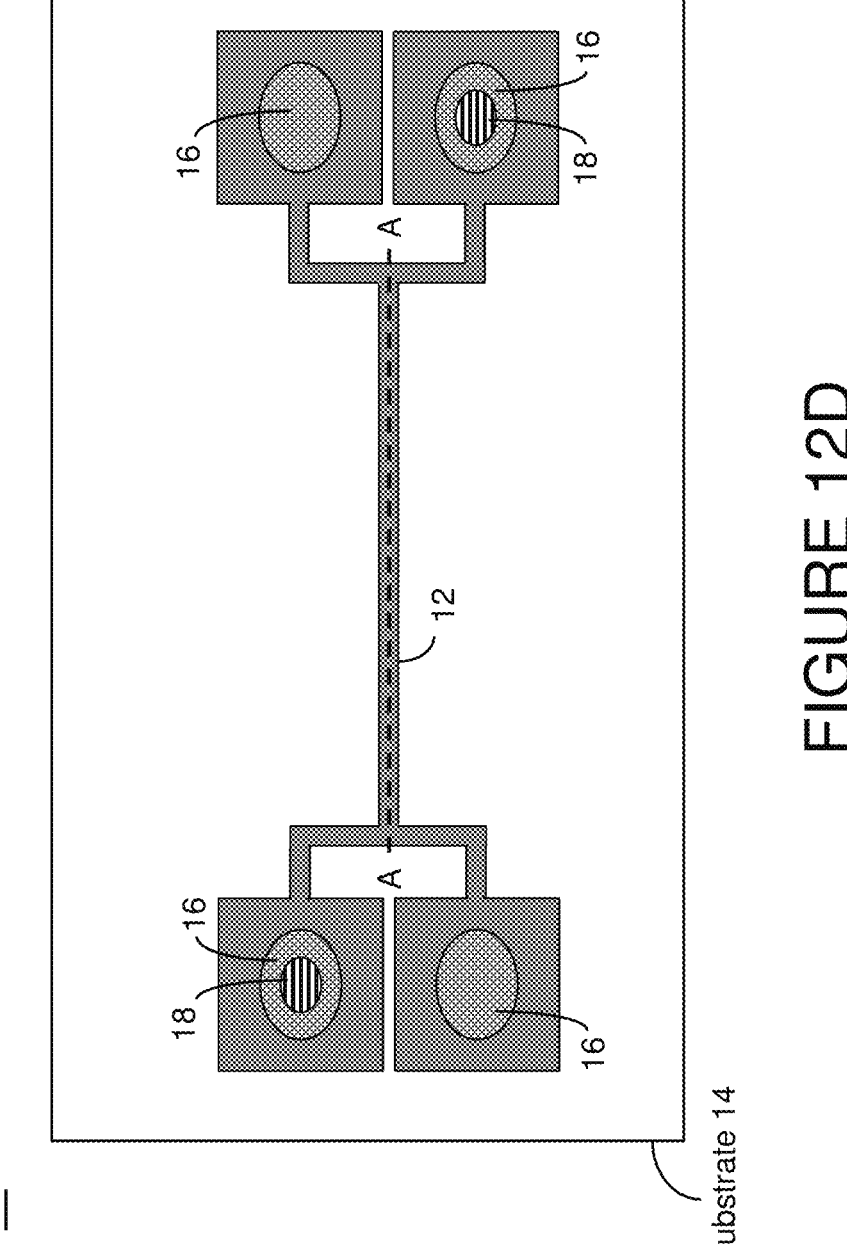
Figure 12E:
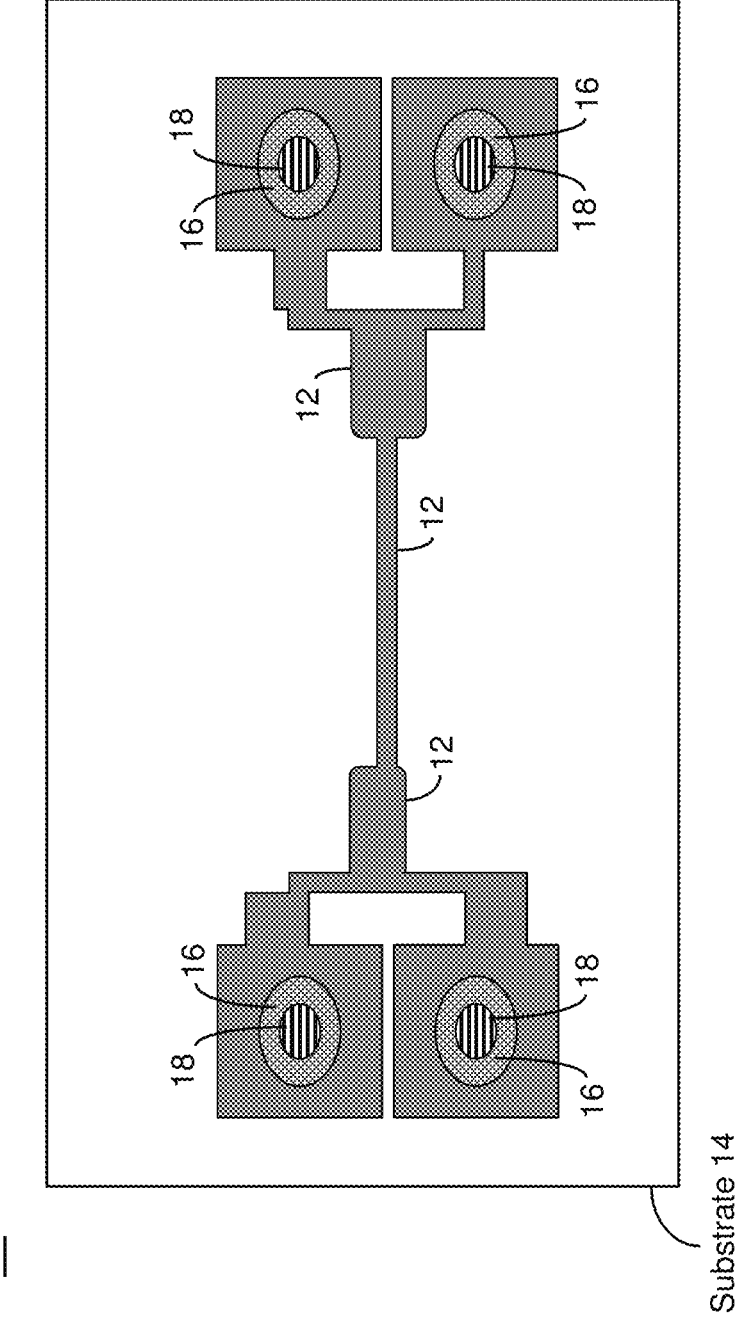
FIG. 12E illustrates a top view of an exemplary thermistor according to certain aspects and embodiments of the present inventions wherein the micromachined thermistor structure includes a beam, having varying widths, which is substantially or entirely released (vertically and/or horizontally), suspended over, and/or "free-standing" relative to the substrate, and is substantially independent of internally or externally induced stresses in the substrate.

Notably, micromachined thermistor structure 12, regardless of shape, configuration and/or architecture, may be sealed or encapsulated in a chamber-thereby protecting micromachined thermistor structure 12 from the external environment and/or controlling the environment/conditions (for example, fluid and pressure) in which micromachined thermistor structure 12 operates/resides. Any encapsulation technique, now known or later developed, may be employed. (See, for example, the cross-sectional view of an exemplary thin film encapsulation technique in FIG. 11B the cross-sectional view of a "can" (or like structure) and/or in wafer, die or glass substrate bonded to the thermistor die or substrate in FIG. 11C, each being in relation to the exemplary illustrated embodiment of micromachined thermistor structure 12 of FIG. 10).

Figures 14A, 14B, 14C:
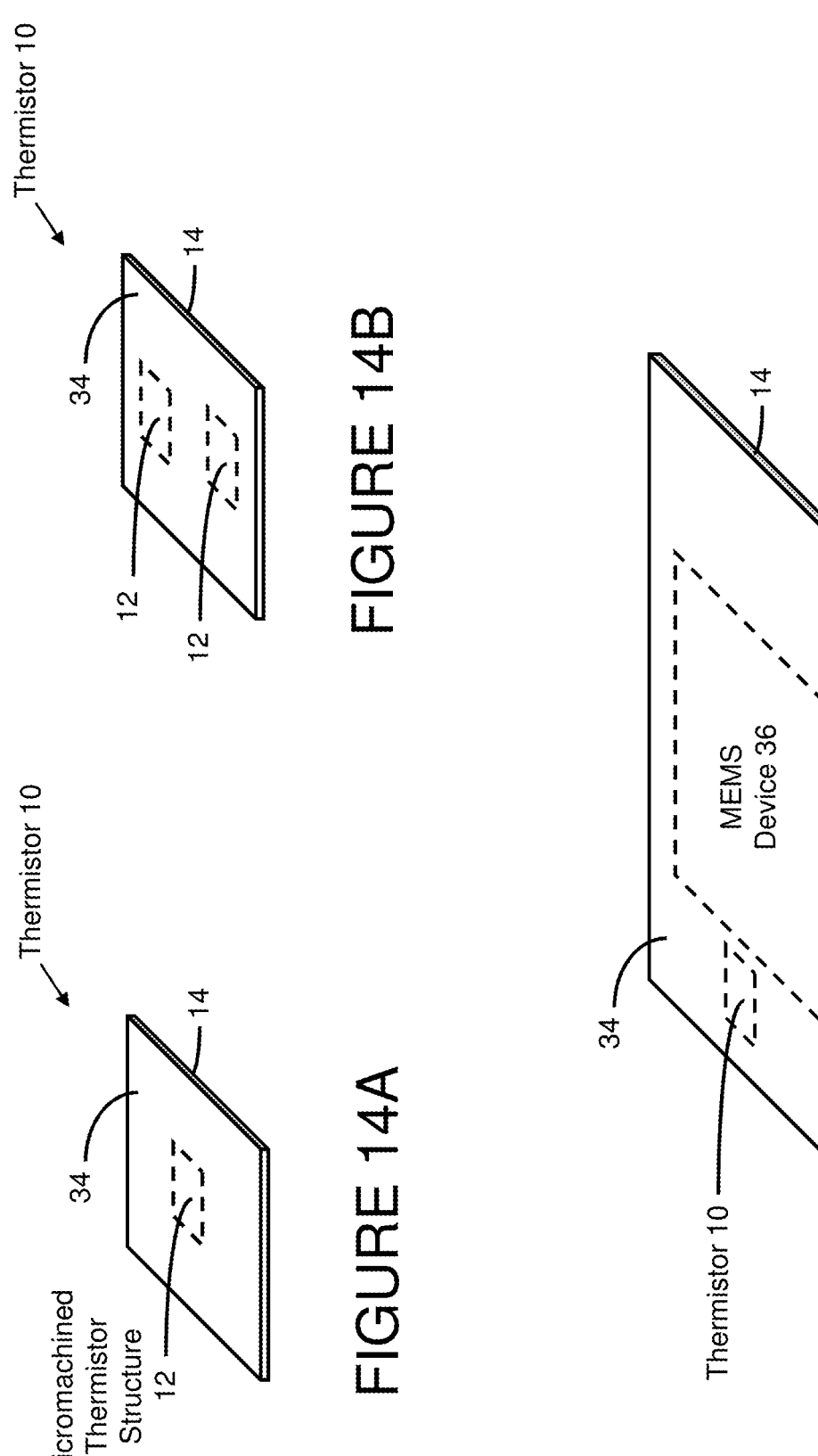
FIGS. 14A and 14B illustrate discrete thermistor devices, in accordance with aspects and/or embodiments of the present inventions, wherein the thermistor of FIG. 14A includes one micromachined thermistor structure and FIG. 14B includes more than one micromachined thermistor structure (in this exemplary illustrated embodiment, the thermistor includes two micromachined thermistor structures—although the thermistor may include more than two micromachined thermistor structures)
FIG. 14C illustrates a thermistor (in accordance with aspects and/or embodiments of the present inventions) fabricated, manufactured or integrated on a die with a MEMS device, wherein the MEMS device includes one or more MEMS structures and may be, for example, one or more gyroscopes, resonators, pressure sensors, micro-channel and/or accelerometers.

The thermistor of the present inventions may be a discrete device. For example, thermistor 10 may be formed in and/or on die 34 (for example, any of the embodiments described and/or illustrated herein, including any combinations and permutations thereof). (See, for example, FIG. 14A). The thermistor 10 may include one or more micromachined thermistor structures 12. (See, for example, FIGS. 14A and 14B). Where the thermistor includes a plurality of micromachined thermistor structures, the circuitry (for example, data processing circuitry) may calculate, assess and/or determine (i) a temperature gradient in/on die 34, (ii) hot spots in/on die 34, and/or (iii) an average temperature across/in portions of die 34. In this regard, the circuitry may receive a plurality of data samples which are indicative or representative of temperature and which correspond to a plurality of different spatial regions in/on die 34 and, in response thereto, calculate and/or determine a temperature gradient in/on die 34, identify hot spots in/on die 34, and/or calculate and/or determine an average temperature across/in portions of die 34, for example, a given time.

Notably, techniques and/or circuitry of the present inventions may implement any form of averaging. For example, the techniques and/or circuitry of the present inventions may spatially average the temperature dependent data from the micromachined thermistor structures. In addition thereto, or in lieu thereof, the techniques and/or circuitry may temporally average the temperature dependent data from the micromachined thermistor structures. The temporal averaging may be implemented via low-pass filtering including multi-order filters such as, for example, one or more second-order Butterworth-type filters).

In another embodiment, one or more micromachined thermistor structures 12 may be integrated in, on and/or above a substrate 14 which includes one or more other structures (for example, one or more mechanical structures of a micro- or nano-electromechanical device (MEMS or NEMS device, respectively, hereinafter collectively "MEMS device")). Here, both MEMS device 36 (which includes a MEMS structure 38 and, in certain embodiments, drive and/or sense electrodes 40) and thermistor 10 (having one or more micromachined thermistor structures) are disposed in, on and/or above substrate 14 and formed in, on and/or from (for example, as described herein) active layer 14*c* and in and/or on die 34. (See, FIGS. 14C-14E and 15A). In one embodiment, MEMS structure 38 and micromachined thermistor structure 12 are fabricated, formed and/or disposed in or from, in whole or in part, in active layer 14*c*, and, as such, MEMS structure 38 and micromachined thermistor structure 12 may be considered "coplanar configuration". (See, FIG. 15A). In another embodiment, MEMS structure 38 is fabricated, formed and/or disposed in or from a first active layer and micromachined thermistor structure 12 is fabricated, formed and/or disposed in or from a second active layer (which, relative to the substrate base, may be above or below the first active layer). (See, FIG. 15B). In this way, thermistor 10 and MEMS device 36 are fabricated and/or arranged in a "stacked configuration" on die 34 such that MEMS structure 38 and micromachined thermistor structure 12 are fabricated, formed and/or disposed in or from different active layers.

Figure 14D:
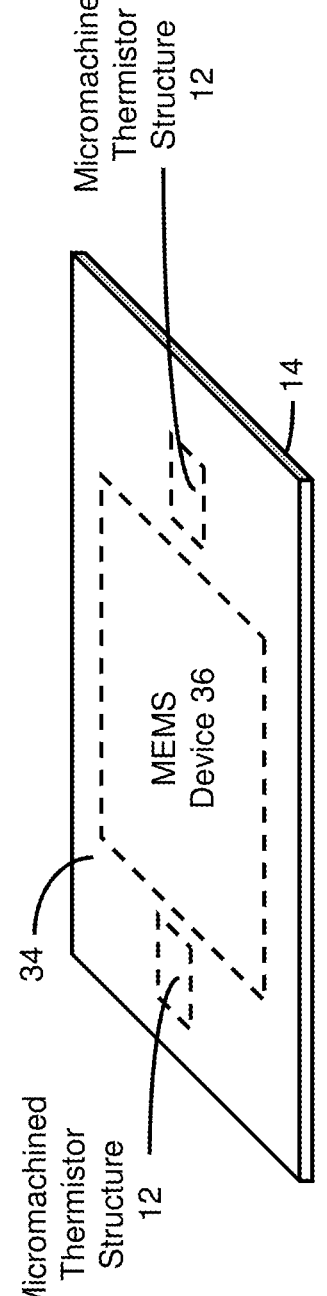
FIGS. 14D and 14E illustrate a thermistor having a plurality of micromachined thermistor structures (in accordance with aspects and/or embodiments of the present inventions) fabricated, manufactured or integrated on a die with a MEMS device, wherein data from the thermistors may provide, for example, information which is representative of (i) a temperature gradient in/on the die, (ii) hot spots in/on the die, and/or (iii) an average temperature across/in portions of the die, in accordance with certain aspects and/or embodiments of the present inventions; notably, the multiple thermistors may be implemented in any of the embodiments described and illustrated herein including any of the embodiments of FIG. 14; moreover, although two or four thermistor structures are illustrated, three or more than four thermistor structures may also be implemented to provide, for example, additional or more granular temperature dependent data of more than two or four regions of the die.
Figure 14E:
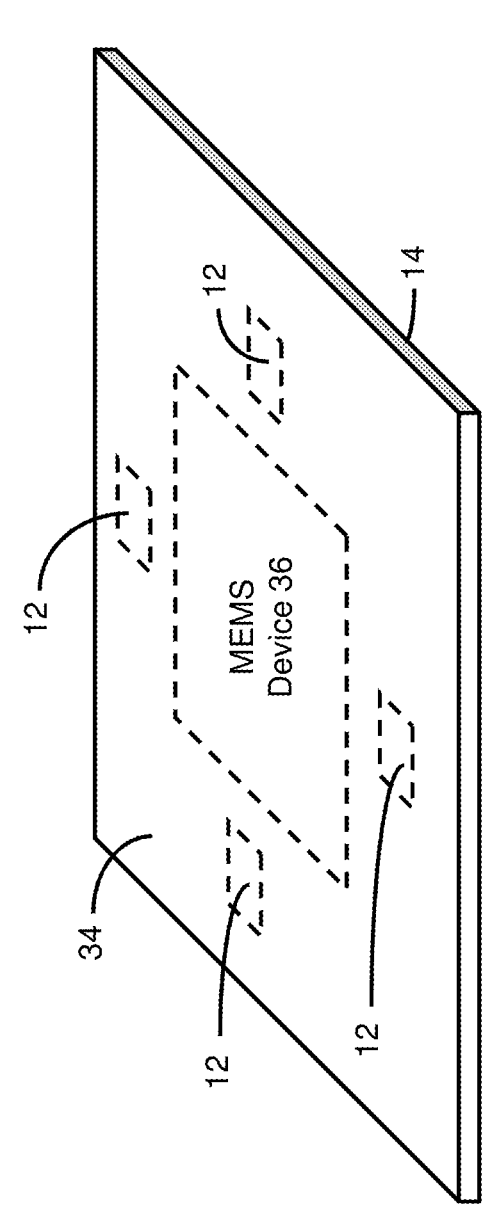

With reference to FIGS. 14D and 14E, thermistor 10 includes a plurality of micromachined thermistor structures 12 and, as such, the circuitry (for example, data processing circuitry) may calculate, assess and/or determine (i) a temperature gradient in/on die 34 (including across MEMS structure 38 of MEMS device 36), (ii) hot spots in/on die 34, and/or (iii) an average temperature across/in portions of die 34 (including in relation to MEMS structure 38 of MEMS device 36). Here, circuitry may receive a plurality of data samples which are indicative or representative of temperature and correspond to a plurality of different spatial regions in/on die 34 and calculate and/or determine temperature related data (for example, the gradient in/on die 34, hot spots in/on die 34 and/or an average temperature across/in portions of die 34). In response, the circuitry may control or adjust the control of other circuitry (for example, the clock generation circuitry-see, for example, FIGS. 1D-1F).

In yet another embodiment, thermistor 10 and MEMS device 36 are fabricated in a coplanar configuration and a stacked configuration. In this regard, a first thermistor structure 12*a* and MEMS structure 38 are fabricated, formed and/or disposed in or from active layer 14*c*, and a second thermistor structure 12*b* is fabricated, formed and/or disposed in a different active layer (which, relative to the substrate base, may be above or below the first active layer). (See, for example, FIG. 15C).

With continued reference to FIG. 15A-15C, micromachined thermistor structure 12, regardless of shape, configuration, architecture, integration and/or packaging, may be scaled or encapsulated in a chamber-thereby protecting micromachined thermistor structure 12 from the external environment and/or controlling the environment/conditions (for example, fluid and pressure) in which micromachined thermistor structure 12 operates/resides. Any encapsulation technique, now known or later developed, may be employed. (See, for example, the cross-sectional view of an exemplary thin film encapsulation technique in FIG. 11B the cross-sectional view of a "can" (or like structure) and/or in wafer, die or glass substrate bonded to the thermistor die or substrate in FIG. 11C).

Notably, where micromachined thermistor structure 12 is integrated with a MEMS structure 38, in one embodiment, the dopant type and/or doping concentrations employed in connection with fabricating micromachined thermistor structure 12 may be different from the dopant type and/or doping concentrations employed in connection with the MEMS structure 38. For example, in one embodiment, micromachined thermistor structure 12 may include a first doping type or dopant (for example, a p-type impurity (such as, for example, boron) and MEMS structure 38 may include a second doping type or dopant (for example, an n-type impurity (such as, for example, phosphorus and/or arsenic). In another embodiment, micromachined thermistor structure 12 may include a first doping type (for example, a p-type impurity (such as, for example, boron) and at a first doping concentration, and MEMS structure 38 may include the same doping type (for example, p-type impurity) but at a second doping concentration. That is, with reference to FIG. 16, the doping concentration of micromachined thermistor structure 12 may be at a first range or level (for example, see DC1 or DC2) and the doping concentration of MEMS structure 38 may be at a second range or level (for example, see, DC4).

The different doping types and/or concentrations of the micromachined thermistor structure and the MEMS structure may be implemented using conventional processing techniques. For example, during doping of the micromachined thermistor structure or MEMS structure, the other is protected via a mask. All techniques for controlling the dopant type and/or doping concentrations in connection with micromachined thermistor structure and the MEMS structure are intended to fall within the scope of the present inventions.

It should be noted that MEMS device 36 may include one or more MEMS structures and may be, for example, one or more gyroscopes, resonators, pressure sensors and/or accelerometers, made in accordance with well-known fabrication techniques, such as lithographic and other precision fabrication techniques, which form mechanical components to a scale that is generally comparable to microelectronics. Indeed, MEMS device 36 may be or may include any MEMS structure now known or later developed.

Figures 14F, 14G:
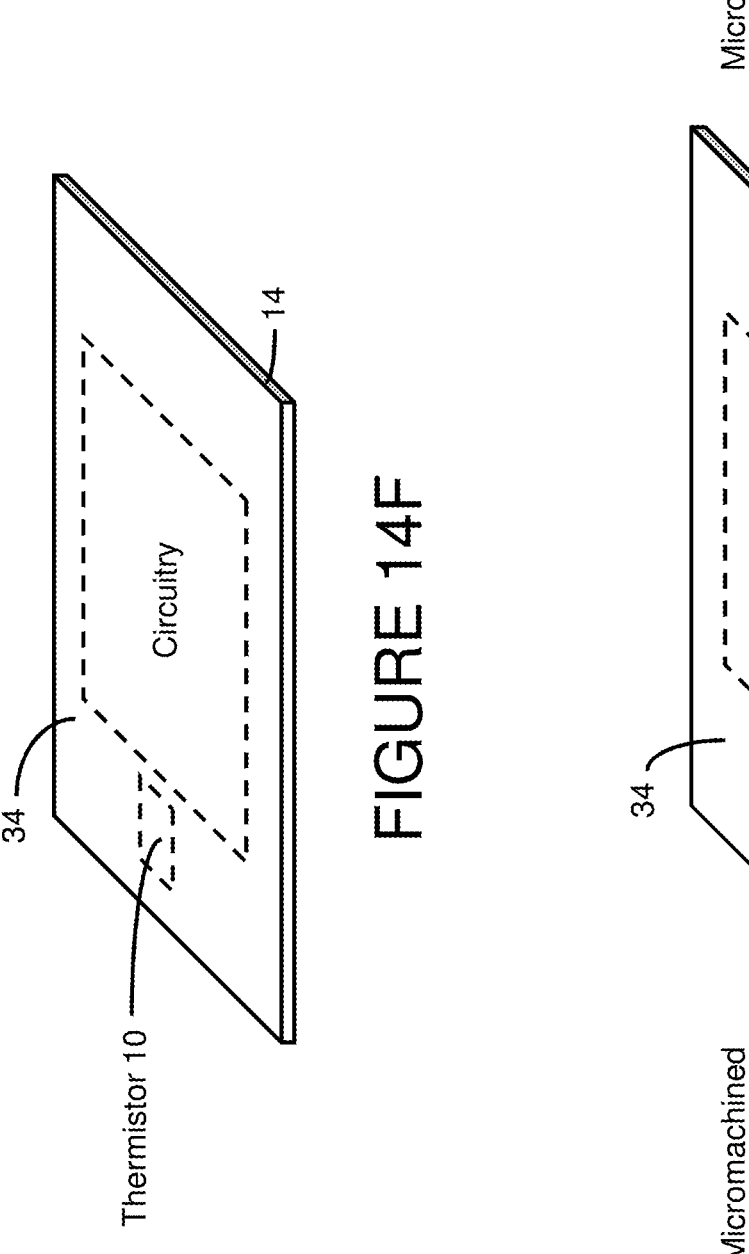
FIGS. 14F and 14G illustrate a thermistor (in accordance with aspects and/or embodiments of the present inventions-which may include one or more micromachined thermistor structures) fabricated, manufactured or integrated on a die with integrated circuitry, for example, circuitry of or associated with measuring the temperature dependent data of the thermistor, in accordance with certain aspects and/or embodiments of the present inventions; notably, as mentioned above, although two thermistor structures are illustrated, more than two thermistor structures may be implemented to provide additional or more granular temperature dependent data (for example, data which is reflective (i) a temperature gradient in/on the die, (ii) hot spots in/on the die, and/or (iii) an average temperature across/in portions of the die) of more than two regions of the die.

With reference to FIGS. 14F and 14G, thermistor 10 (which, in FIG. 14F includes one thermistor structure and in FIG. 14G includes two thermistor structures; as noted above, thermistor 10 may include more than two structures) may be integrated with circuitry 42 as an integrated circuit type device. In this regard, thermistor 10 of any one or more embodiments of the present inventions may be integrated on die 34 including integrated circuitry 42. The integrated circuitry 34 may be any circuitry now known or later developed. Indeed, the integrated circuitry may be measurement circuitry, data processing circuitry and/or clock generation circuitry. (See, for example, FIGS. 1B-1F).

Briefly, with continued reference to FIGS. 1B-1F, the measurement circuitry receives the output(s) of thermistor 10 and generates data which is representative of the temperature of the micromachined thermistor structure. The data processing circuitry receives the output of the measurement circuitry and processes the measured value(s). In one embodiment, the data processing circuitry includes analog-to-digital circuitry (A/D converter) to generate a digital representation of the measured value. See, for example, FIGS. 1C-1F). The data processing circuitry may also include circuitry to calculate one or more parameters or values for clock generation circuitry to generate parameters or values for a given operating temperature and/or compensate for changes in the operating temperature. (See, for example, FIGS. 1D-1F and U.S. Pat. No. 6,995,622). In this regard, where the MEMS device is a MEMS resonator, the data processing circuitry may generate one or more temperature dependent parameters or values for the clock generation circuitry.

For example, where the clock generation circuitry includes one or more phase locked loops (PLLs), delay locked loops (DLLs), digital/frequency synthesizer (for example, a direct digital synthesizer ("DDS"), frequency synthesizer, fractional synthesizer and/or numerically controlled oscillator) and/or frequency locked loops (FLLs), the data processing circuitry may employ the data which is representative of the temperature of the micromachined thermistor structure to adjust the parameters or values applied to such circuitry based on a measured operating temperature and/or changes in the operating temperature. Here, the output of MEMS device 36 is employed as the reference input signal (i.e., the reference clock). The PLL. DLL, digital/frequency synthesizer and/or FLL may provide frequency multiplication (i.e., increase the frequency of the output signal of the MEMS oscillator). The PLL, DLL, digital/frequency synthesizer and/or FLL may also provide frequency division (i.e., decrease the frequency of the output signal of the MEMS oscillator). Moreover, the PLL, DLL, digital/frequency synthesizer and/or FLL may also compensate using multiplication and/or division to adjust, correct, compensate and/or control the characteristics (for example, the frequency, phase and/or jitter) of the output signal of the MEMS resonator/oscillator.

Figure 14H:
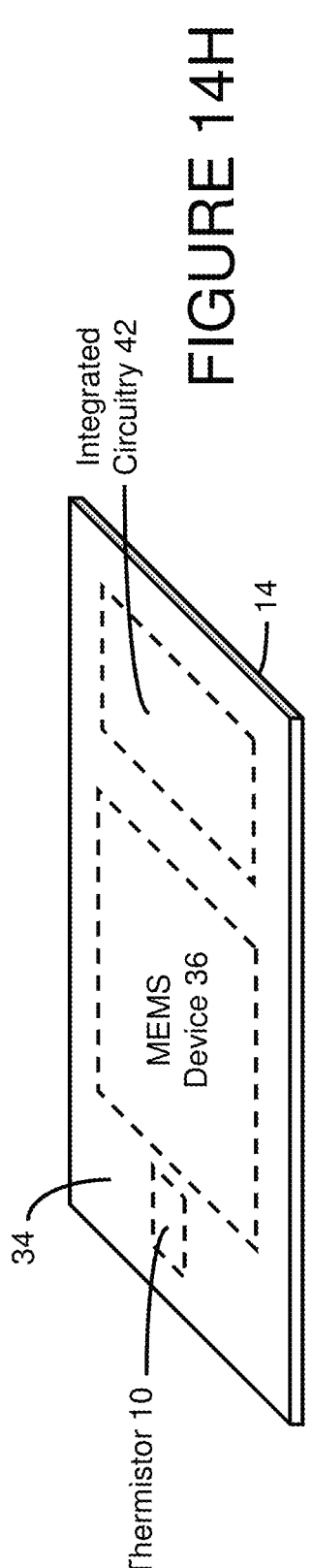
FIG. 14H illustrates a thermistor (in accordance with aspects and/or embodiments of the present inventions) having one or more thermistor structures fabricated, manufactured or integrated on a die with a MEMS device and integrated circuitry, in accordance with certain aspects and/or embodiments of the present inventions; although not illustrated, where the thermistor includes a plurality of micromachined thermistor structures, such structures may be dispersed over or in the die to facilitate acquisition of data which is may provide information which is representative of (i) a temperature gradient in/on the die, (ii) hot spots in/on the die, and/or (iii) an average temperature across/in portions of the die.
Figure 14I:
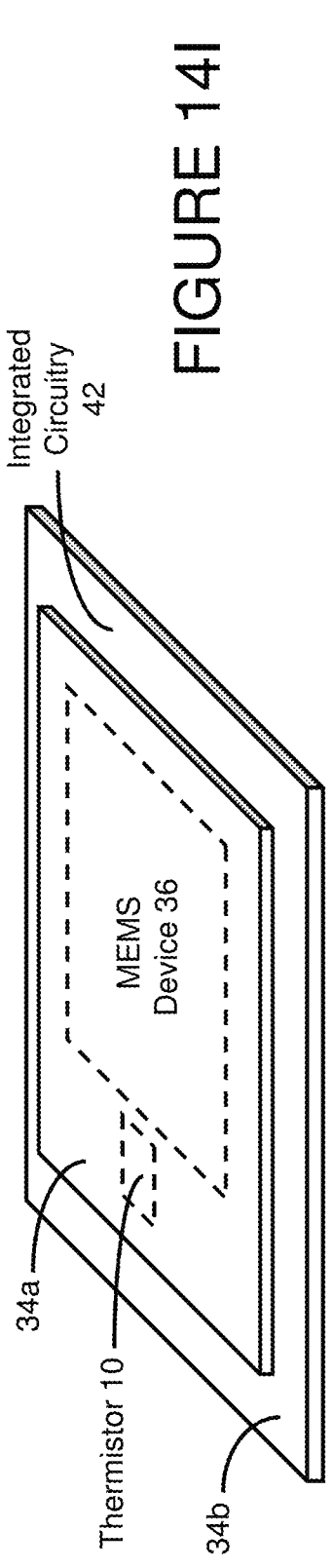
FIGS. 14I-14K illustrate stacked die architectures wherein a thermistor (in accordance with aspects and/or embodiments of the present inventions) fabricated, manufactured or integrated on a die alone or with a MEMS device is stacked with a die having integrated circuitry, in accordance with certain aspects and/or embodiments of the present inventions; notably, all permutations and combinations of stacked die architectures including thermistors, MEMS devices and/or integrated circuitry are intended to fall within the scope of the present inventions.
Figures 14J, 14K, 14L:
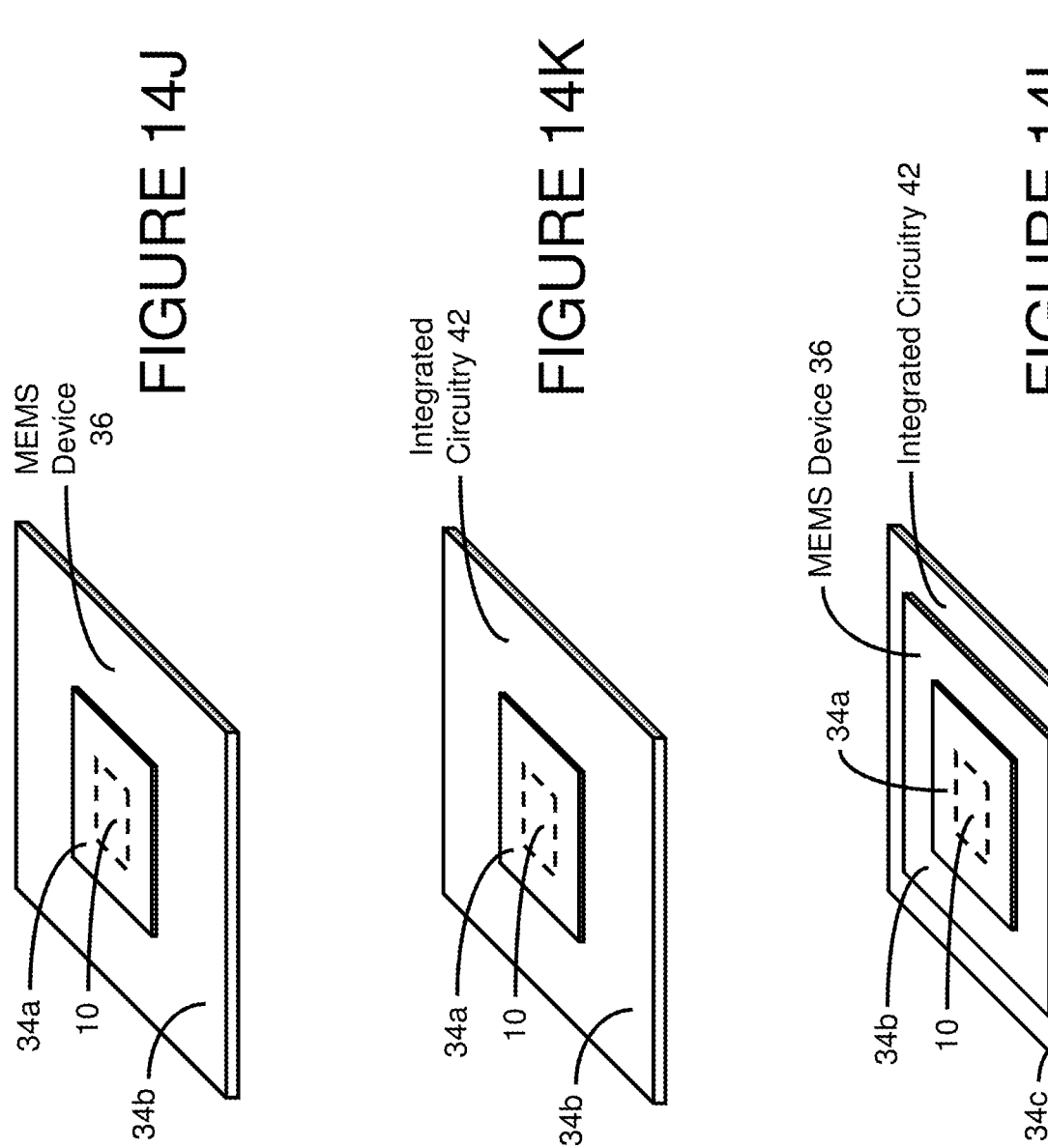
FIG. 14L illustrate a stacked die architecture wherein a thermistor (in accordance with aspects and/or embodiments of the present inventions) fabricated, manufactured or integrated on a die, is stacked with (i) a die having a MEMS device and (ii) a die having integrated circuitry, in accordance with certain aspects and/or embodiments of the present inventions.

With reference to FIG. 14H, thermistor 10 (in accordance with any aspects and/or embodiments of the present inventions) may be integrated MEMS device 36 and integrated circuitry 42 on die 34. In this embodiment, die 34 may include, in addition to thermistor 10, a MEMS resonator/oscillator (MEMS device 36) and data processing and clock generation circuitry to provide an integrated temperature compensated MEMS oscillator. (See, for example, U.S. Pat. No. 6,995,622).

The multiplication or division (and/or phase adjustments) by the clock generation circuitry may be in fine or coarse increments. For example, the clock generation circuitry may include an integer PLL, a fractional PLL and/or a fine-fractional-N PLL to precisely select, control and/or set the output signal of the MEMS resonator/oscillator. In this regard, the output of MEMS device 36 may be provided to the input of the fractional-N PLL and/or the fine-fractional-N PLL (hereinafter collectively "fractional-N PLL"), which may be pre-set, pre-programmed and/or programmable to provide an output signal having a desired, selected and/or predetermined frequency and/or phase. Again, the data processing circuitry may employ the data which is representative of the temperature of the micromachined thermistor structure to adjust the parameters or values applied to such circuitry based on a measured operating temperature and/or changes in the operating temperature.

In other embodiment, the thermistor die (the die in/on which thermistor 10 is fabricated) is physically coupled and stacked with other die, for example, die having integrated circuitry 42 and MEMS device 36. (See, for example, FIGS.

14I-14N). In certain embodiments, thermistor die 34a is stacked with integrated circuitry 42, and in other embodiments, die 34a, which includes thermistor 10 and MEMS device 36, is stacked with integrated circuitry 42. As noted above, thermistor 10 may include one or more micromachined thermistor structures 12 wherein, in those embodiments, where thermistor 10 includes more than one thermistor structure, circuitry may receive a plurality of temperature data samples corresponding to a plurality of different spatial regions in/on die 34 and calculate and/or determine temperature related data (for example, the gradient in/on die 34, hot spots in/on die 34 and/or an average temperature across/in portions of die 34). In response, the circuitry may control or adjust the control of circuitry (which employs the output of the MEMS device 36). All combinations and/or permutations of stacking, integration and/or number of thermistor structures are intended to fall within the scope of the present inventions.

Notably, in a stacked die configuration/architecture, it may be advantageous to minimize any temperature gradient between the thermistor and the MEMS device. That gradient may be due to, for example, thermal transfer from the integrated circuit die to the MEMS device die. For example, in one embodiment, the MEMS device die includes a MEMS resonator/oscillator to generate an output that is employed by clock generation circuitry to generate an clock output signal (see, for example, FIGS. 1E and 1F), wherein changes in temperature of the MEMS resonator due the operation of circuitry on the integrated circuit die may impact the frequency of the output of the MEMS resonator. As such, in one embodiment, with reference to FIG. 14M, die 34a includes (i) a thickness which is greater than the thickness of a standard die and/or (ii) a thermal insulating material (for example, a silicon nitride or silicon oxide) disposed between die 34a and die 34b. In this way, the temperature gradient between the thermistor and the MEMS device is reduced or minimized and the temperature dependent output signal of thermistor 10 is more representative of the temperature of the MEMS structure of MEMS device 36.

Figures 14M, 14N:
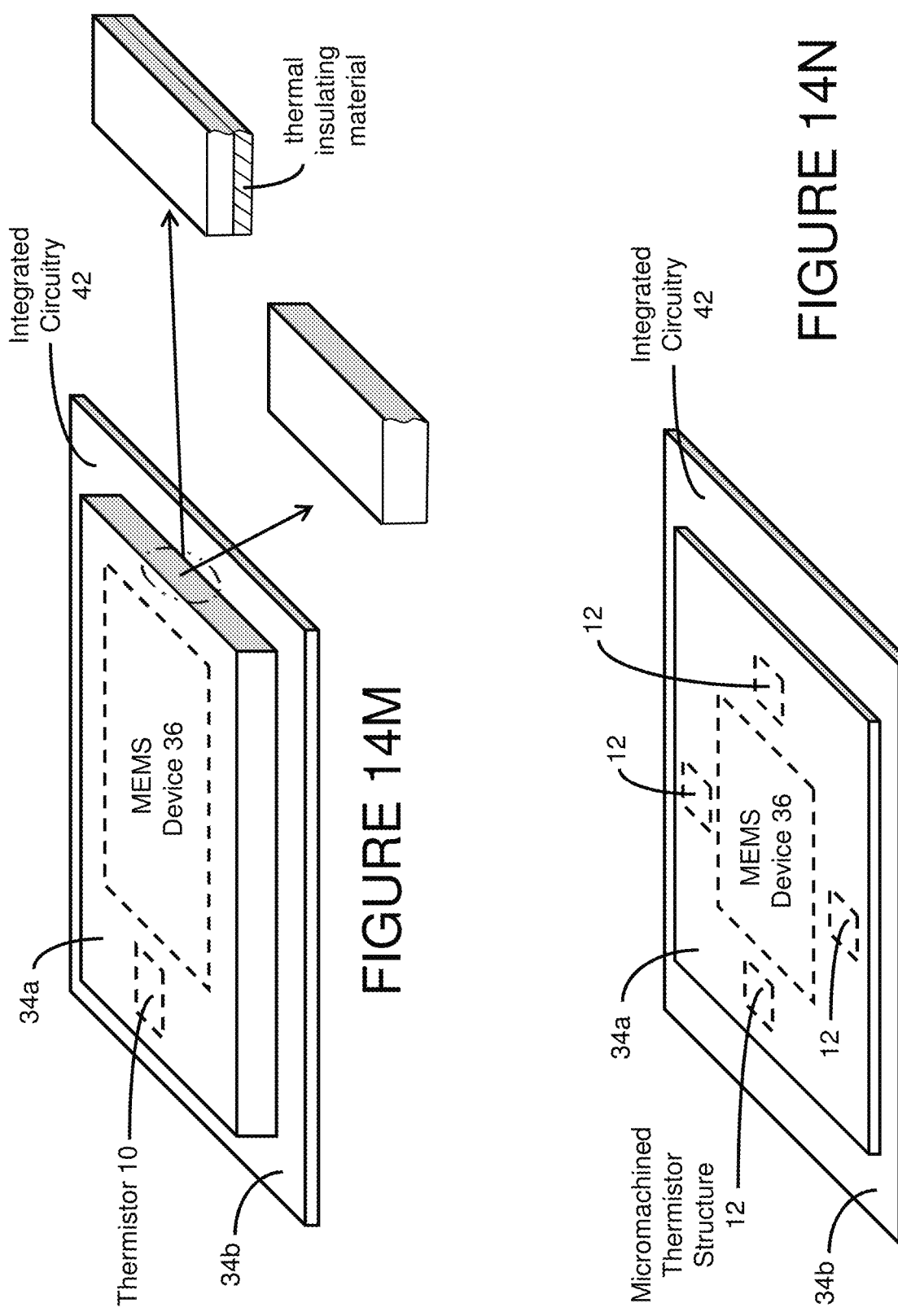
FIG. 14M illustrates a stacked die architecture wherein a thermistor (in accordance with aspects and/or embodiments of the present inventions) is fabricated, manufactured or integrated, with a MEMS device, on a die which includes (i) a thickness and/or (ii) a thermal insulating material (for example, a silicon nitride or silicon oxide) at the interface of the dice of the stacked die architecture that reduces and/or minimizes the temperature gradient between the thermistor and the MEMS device due to, for example, heat transfer from the die containing the integrated circuitry, in accordance with certain aspects and/or embodiments of the present inventions.
FIG. 14N illustrates a stacked die architecture wherein a thermistor having a plurality of micromachined thermistor structures (in accordance with aspects and/or embodiments of the present inventions) is fabricated, manufactured or integrated on a die with a MEMS device, wherein data from the thermistors may provide, for example, information which is representative of (i) a temperature gradient in/on the die, (ii) hot spots in/on the die, and/or (iii) an average temperature across/in portions of the die, in accordance with certain aspects and/or embodiments of the present inventions.

With reference to FIG. 14N, the stacked die architectures may include a thermistor having a plurality of micromachined thermistor structures (in accordance with aspects and/or embodiments of the present inventions). Here, a plurality of micromachined thermistor structures 12 are fabricated, manufactured or integrated on die 34a with a MEMS device, wherein data from the thermistors may provide, for example, information which is representative of (i) a temperature gradient in/on die 34a, (ii) hot spots in/on the die, and/or (iii) an average temperature across/in portions of die 34a. A die including a plurality of micromachined thermistor structures 12 may be implemented in any of the stacked die configurations, including, for example, the configuration of FIG. 14M.

As intimated above, where the thermistor is disposed in a die which is different from the die of the MEMS device and/or the die of the integrated circuitry, the dice may be configured in a stacked die architecture (See, for example, FIGS. 14J-14L and 14O. In this regard, the thermistor (in accordance with aspects and/or embodiments of the present inventions) may be fabricated, manufactured or integrated on a die which is stacked with (i) a die having a MEMS device and/or (ii) a die having integrated circuitry. The dice may be stacked on each other or in a side-by-side configuration. For example, where each of the thermistor, MEMS device and integrated circuitry fabricated, manufactured or disposed on a different die, the dice may be stacked on each other (see, for example, FIG. 14L) or in a side-by-side configuration (see, for example, FIG. 14O).

Figures 14O, 14P, 14Q, 14R:
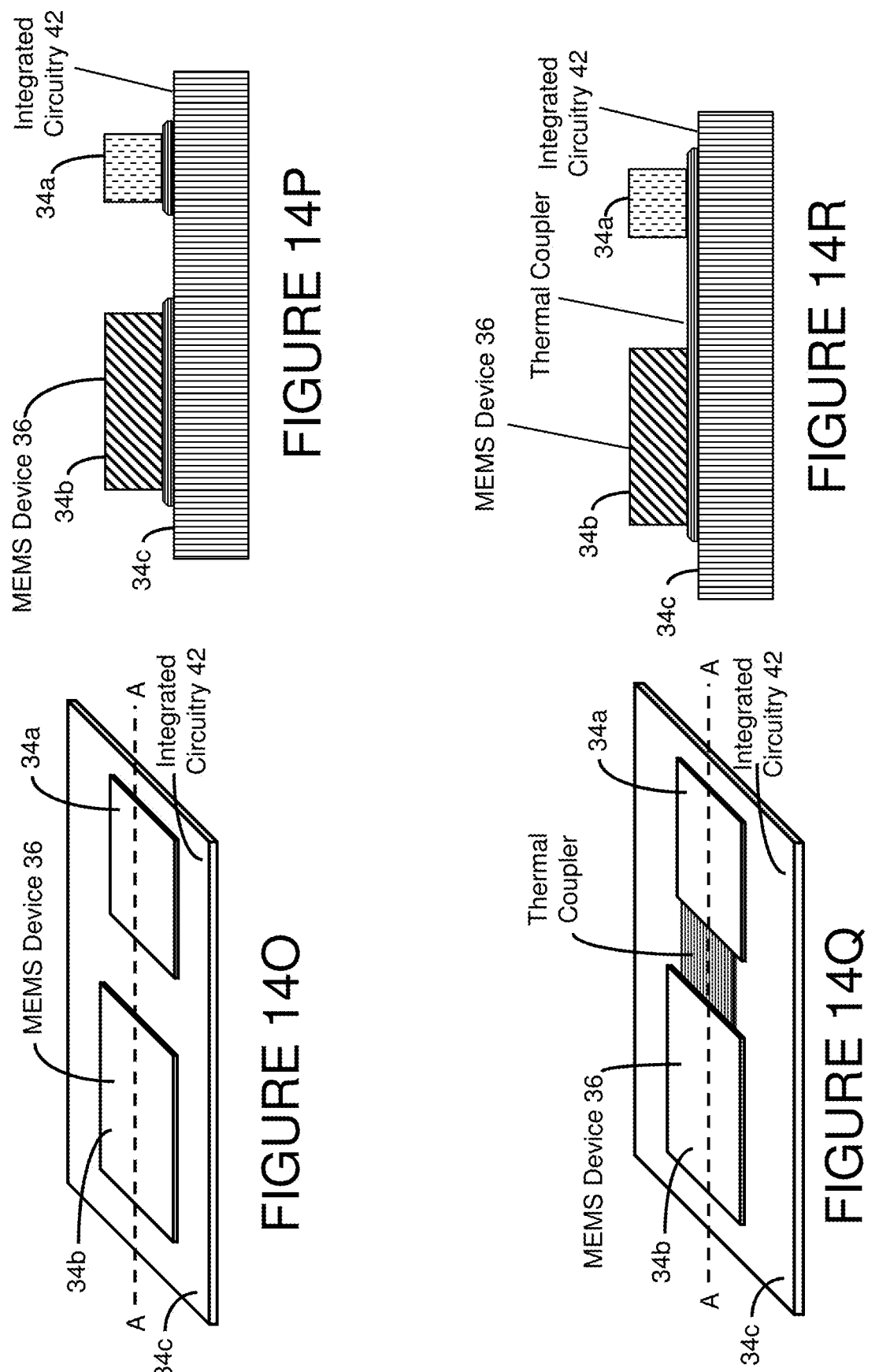
FIGS. 14O and 14Q illustrate stacked die architectures wherein a thermistor (in accordance with aspects and/or embodiments of the present inventions) fabricated, manufactured or integrated on a die, is stacked side-by-side with a die having a MEMS device and on a die having integrated circuitry, in accordance with certain aspects and/or embodiments of the present inventions, wherein a thermal coupler (for example, a thermally and/or electrically conductive epoxy (an "island" of such epoxy on or above the integrated circuit die that "bridges" both dice or secures both dice to the integrated circuit die), metal trace or bar (which may be disposed on or suspended above the integrated circuit die and "bridges" both dice to provide more extensive thermal communication between the dice of the thermistor and the MEMS device.
FIGS. 14P and 14R are cross-sectional views, along dotted line A-A, of the stacked die architectures of FIGS. 14O and 14Q, respectively, wherein the stacked architecture illustrated in FIG. 14P includes the dice of the MEMS device and the thermistor secured or fixed to an exposed surface of the package or die of the integrated circuit via an adhesive (for example, a thermally and/or electrically conductive epoxy) and the stacked architecture illustrated in FIG. 14R includes a thermal coupler bridging the dice of the MEMS device and the thermistor, wherein the thermal coupler may be, for example, a thermally and/or electrically conductive epoxy (for example, an "island" of such epoxy on or above the integrated circuit die that "bridges" both dice), which secures both dice to the integrated circuit die and facilitates more extensive thermal communication between the dice of the thermistor and the MEMS device.

With reference to FIGS. 14Q and 14R, in one embodiment of the stacked die architecture, a thermal coupler is employed to facilitate thermal transfer/equilibrium between the dice of the thermistor and the MEMS device. In one embodiment the thermal coupler provides a low resistance thermal path or connection between the thermistor and the MEMS device. In this way, the output of the thermistor is more representative of or more closely correlates to the temperature of the MEMS device.

In one embodiment, the thermal coupler is a thermal and/or electrical conductive epoxy wherein an "island" of such epoxy on or above the integrated circuit die may encompass the dice of the thermistor and the MEMS device as well as secure or fix each die to the integrated circuit die. In another embodiment, the thermal coupler is a metal trace or bar (which may be disposed on or suspended above the integrated circuit die. Again, the thermal coupler may be any material which provides a low resistance thermal path or connection between the thermistor and the MEMS device so that the output of the thermistor is more representative of or more closely correlates to the temperature of the MEMS device.

Figures 14S, 14T, 14U:
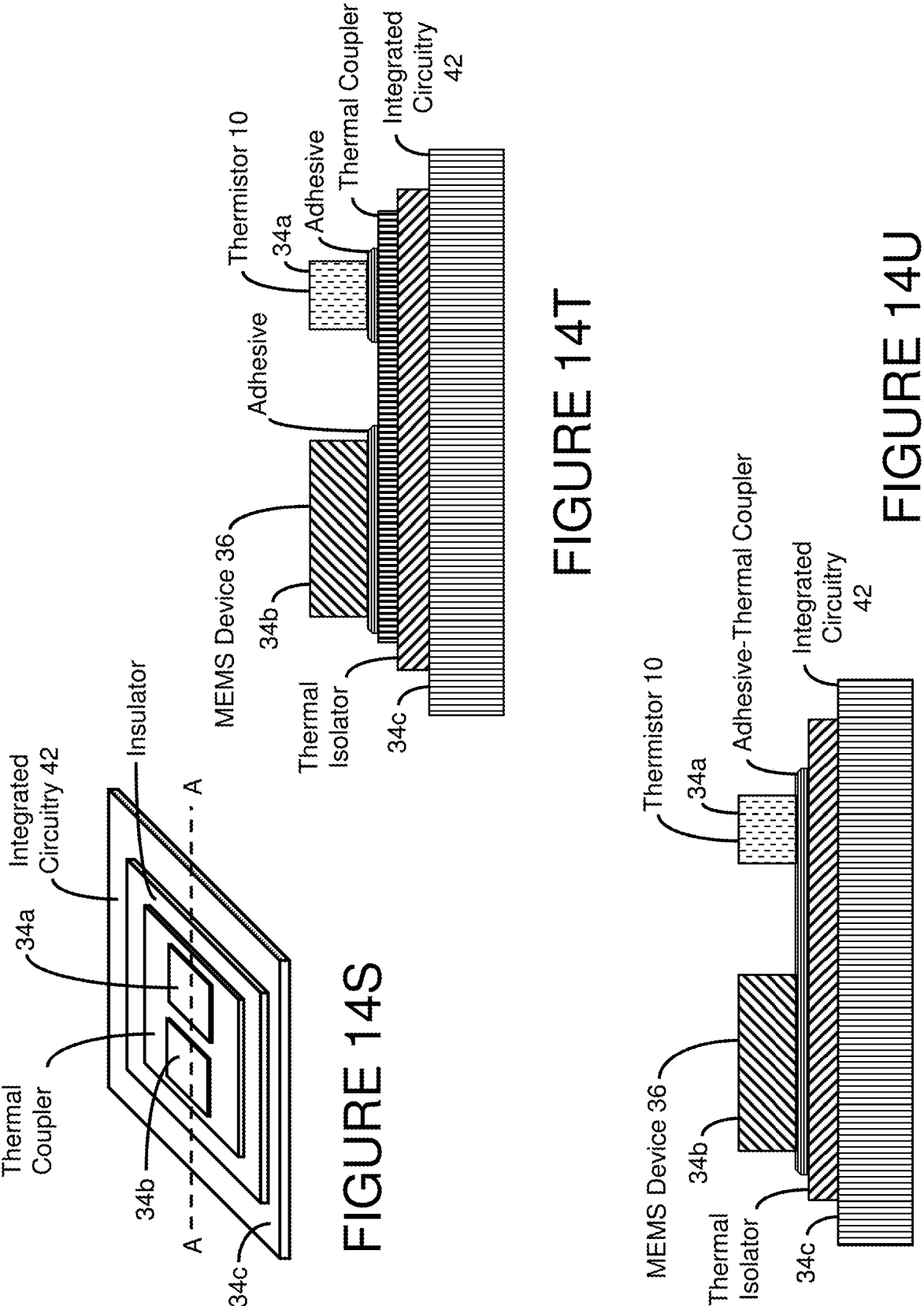
FIG. 14S illustrates stacked die architecture including a thermal coupler and thermal isolator, wherein a thermistor (in accordance with aspects and/or embodiments of the present inventions) fabricated, manufactured or integrated on a die, is stacked side-by-side with a die having a MEMS device and on a thermal coupler which is disposed on a thermal isolating material (for example, a polyimide film) which, in turn, is disposed on or above the die containing the integrated circuitry, wherein the thermal coupler (for example, a metal film, or a thermally and/or electrically conductive epoxy) provides more extensive thermal communication between the dice of the thermistor and the MEMS device and the thermal isolator reduces thermal transfer from the integrated circuitry die to the MEMS device die and/or the thermistor die.
FIGS. 14T and 14U are cross-sectional views, along dotted line A-A, of certain embodiments of the stacked die architectures of FIG. 14S, wherein the cross-sectional view of FIG. 14T illustrates the dice of the thermistor and the MEMS device secured to the thermal coupler via, for example, an adhesive (which may facilitate thermal communication to the thermal coupler (for example, a thermally and/or electrically conductive epoxy) and the cross-sectional view of FIG. 14U illustrates an adhesive-thermal coupler (for example, a thermally and/or electrically conductive epoxy) securing the dice of the thermistor and the MEMS device directly to a thermal isolating material (for example, a polyimide film) which is disposed on or above the integrated circuit.

In another embodiment, the stacked die configuration may employ a thermal coupler to provide a low resistance thermal path or connection between the thermistor and the MEMS device and thermal isolator to thermally isolate and/or reduce thermal transfer of heat to/from the integrated circuitry die from/to the MEMS device die and/or the thermistor die. With reference to FIGS. 14S and 14T, in one embodiment, die 34a of thermistor 10 and die 34b of MEMS device 36 are arranged in side-by-side arrangement and fixed or secured on a thermal coupler. The thermal coupler is fixed or secured (directly or indirectly) to a thermal isolator which is fixed or secured (directly or indirectly) to die 34c of integrated circuitry 42. In this way, the thermal coupler enhances the correlation between the output of the thermistor and the temperature of the MEMS device. The thermal isolator reduces thermal transfer to/from integrated circuitry die 34c from/to MEMS device die 34b and/or thermistor die 34a.

In one embodiment, the thermal isolator is a thermally isolating material, for example, a polyimide film. The thermal coupler may be a metal (for example, a metal film) such as copper or aluminum. The thermal coupler may be a thermally conductive adhesive, as described above. Where the thermal coupler is electrically conductive, it may be advantageous that the thermally isolating material also be electrically isolating to enhance the reliability of the stacked die configuration.

With reference to FIG. 14U, in another embodiment, the dice of the thermistor and MEMS device are fixed or secured (directly or indirectly) to the thermal isolator via an adhesive-thermal coupler (for example, a thermally and/or electrically conductive epoxy). Such a configuration eliminates the separate thermal coupler and, instead combines the adhesive and coupler.

Notably, the present inventions may employ a plurality of alternating thermal isolators and conductors in a stacked configuration (for example, an integrated circuitry die-isolator-conductor—isolator—conductor . . . thermistor fixed or secured to a thermal conductor (via, for example, an adhesive such as a thermal epoxy)). This embodiment may enhance or improve the thermal isolation between (i) the integrated circuit die and (ii) the thermistor die (and MEMS die-if applicable) and/or thermal coupling between the thermistor die and MEMS die (where a MEMS device is included). Moreover, a plurality (for example, two or three) thermal isolator layers and thermal coupling layers may provide improved thermal isolation and/or thermal coupling relative to a thermal isolator and thermal coupler having substantially equal thickness to the plurality isolator layers and/or coupling layers, respectively.

The die having one or more thermistors according to any of the embodiments described and/or illustrated herein, whether stacked or not, may be packaged using any technique, configuration and/or packaging structure now known or later developed. (See, for example, the techniques and/or structure of U.S. Patent Application Publication 2007/0290364 (including the provisional application upon which the aforementioned non-provisional application is based)). For example, in one embodiment, the die on which thermistor resides in or on (whether or not the thermistor is integrated with other structures and/or integrated circuitry) may be coupled to a lead frame (chip-on-lead (COL), chip-on-paddle (COP), and chip-on-tape (COT) packages) and thereafter encapsulated in a mold compound. In another embodiment, the thermistor die (whether or not the thermistor die includes other structures (for example, MEMS device) and/or integrated circuitry) may be coupled to another die in a stacked configuration and the combination coupled to a lead frame (for example, COL, COP, COT packages) and thereafter encapsulated in a mold compound.

Notably, the die may be interconnected using any technique now known or later developed including bond wires and/or balls (for example, in a flip-chip configuration), and/or a through-silicon via architecture-thereby providing vertical connections through the body of the die.

In yet another embodiment, the thermistor die (or stacked die architecture) may be disposed, configured and/or provided in a surface mount "package." Such thermistor die may include other structures (for example, MEMS device) and/or integrated circuitry. Again, the die having one or more thermistors according to any of the embodiments described and/or illustrated herein, whether stacked or not, may be packaged using any technique, configuration and/or packaging structure now known or later developed.

As mentioned above, the thermistor of the present inventions may electrically couple to measurement circuitry. (See, for example, FIGS. 1B-1F). For example, in one embodiment, the measurement circuitry includes resistance, voltage and/or current sensors (for example, an ohm meter, a voltmeter and/or a current meter). Any resistance, voltage and/or current sensors, whether now known or later developed, may be employed in conjunction with the thermistors of the present inventions. Indeed, the measurement circuitry may be configured in a 2-point configuration/architecture (for example, ohm meter type circuitry coupled to electrical connection or contact points of the thermistor) or a 3-point or 4-point configuration/architecture (for example, current meter and voltmeter type circuitry coupled to electrical connection or contact points of the thermistor). Importantly, in one aspect, the present inventions are directed to measurement circuitry and methods of operating such circuitry. In one embodiment of this aspect of the inventions, the measurement circuitry provides low noise temperature sensing with high accuracy, low power, and/or low area using a thermistor element as the micromachined temperature sensitive device (for example, one or more of the thermistors of the present inventions wherein the resistance of the micromachined thermistor structure depends on or changes with temperature). For example, in one embodiment, the measurement circuitry includes a switched capacitor network that creates a low noise adaptable reference resistor for comparison purposes, a frequency divider that is controlled by a digital Sigma-Delta modulator to achieve an accurately controlled switching frequency for the switched capacitor network, a chopping method to mitigate the effect of 1/f noise and circuit offsets, a pseudo-differential VCO-based analog-to-digital converter structure to efficiently convert the analog error between the MEMS-based resistance value and the effective resistance of the switched capacitor network into a digital code, and an overall feedback loop that changes a Sigma-Delta modulator input in response to that error. In this way, the measurement circuitry minimizes the impact of non-idealities of the measurement system and/or configuration to measure the temperature dependent characteristics of the micromachined thermistor structure and/or change therein (for example, resistance introduced via the measurement circuitry) by measuring a parameter (for example, capacitance) that is a measure of but different from the temperature dependent characteristics of the micromachined thermistor structure (for example, resistance).

The measurement circuitry and methods of operating such circuitry according to this aspect of the present inventions is described and illustrated in detail in ATTACHMENT A to the Provisional Application.

With reference to FIG. 17A, in one embodiment, a thermal coupler 46 interconnects thermistor 10 and MEMS device 36. The thermal coupler 46 provides a low resistance thermal path or connection between the thermistor 10 and the MEMS device 36. In this way, thermistor 10 outputs data which is more representative of the operating temperature of the MEMS structure of MEMS device 36. The thermal coupler 46 may be any material now known or later developed that provides a low resistance thermal path. In one embodiment, thermal coupler 46 may be a semiconductor or metal material—for example, the same material used to fabricate the MEMS structure of MEMS device 36 and/or micromachined thermistor structure 12 of thermistor 10. Moreover, the thermal coupler may be disposed laterally relative to the MEMS and thermistor structures (in a coplanar configuration) and/or vertically disposed relative to the MEMS and thermistor structures (in a stacked configuration). (See, FIGS. 17B-17D and FIGS. 17E-17F, respectively). For example, in one embodiment, the thermal coupler(s) interconnect anchors of the MEMS and thermistor structures. Indeed, in one embodiment, the MEMS and thermistor structures share one or more anchors which provide a low resistance thermal path or connection between thermistor 10 and MEMS device 36. (See, FIG. 18). Notably, die 34 may include one or more thermistor structures, one or more MEMS structures, and a plurality of thermal couplers 46 to provide low resistance thermal paths or connections between thermistor 10 and MEMS device 36. In one embodiment, one or more micromachined thermistor structures 12 may be integrated or embedded in the MEMS device and coupled to the MEMS structure via one or more thermal couplers 46. (See, for example, FIG. 17H).

As mentioned above, in addition to or in lieu of a thermistor including one or more micromachined thermistor structures which are fabricated from a temperature-sensitive crystalline material (for example, doped or undoped semiconductor material(s) such as, for example, monocrystalline, polycrystalline and/or amorphous silicon, germanium, silicon/germanium, silicon carbide (SiC), and gallium arsenide), the thermistor may include one or more micromachined thermistor structure which are fabricated from a metal material (for example, platinum, aluminum, molybdenum and/or copper (or alloys thereof)). (See, FIGS. 19A and 19B). The features, embodiments and/or inventions discussed and/or illustrated herein are fully applicable to thermistor 10 having one or more micromachined thermistor structure which are fabricated from a metal material. For the sake of brevity, such discussions will not be repeated.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, micromachined thermistor structure 12 may include any shape now known or later developed. In one embodiment, the thermistor structure 12 includes "rounded" corners to reduce stress points/regions of the structure. (See, for example, FIGS. 20A-20D, 21A-21F. 23A-23D, 24A and 24B). In addition, "sharp" corners in the current path of the structure may present increased concentrations of electrical current density in the micromachined thermistor structure. As such, structures having "rounded" corners may reduce the potential of increased current concentrations within the micromachined thermistor structure.

In addition, to facilitate signal/current flow in micromachined thermistor structure 12, it may be advantageous to locate anchors (or portions/areas under stress) remote from the signal flow (for example, current flow) through or in the micromachined thermistor structure. (See, for example, anchor 16 in the exemplary micromachined thermistor structure embodiments illustrated in FIGS. 20A-20D, 21A-21F, 23A-23D, 24A and 24B). In this way, thermistor 10 may provide a more accurate and/or a more reliable representation of the ambient temperature regardless of the non-temperature related/dependent ambient operating conditions of the thermistor (for example, substrate stress or forces (internal or external) applied thereto). A detailed technical discussion of certain aspects of the deformation of a silicon resistor structure due to stress (from the package or otherwise) is provided in ATTACHMENT B to the Provisional Application.

Where thermistor 10 is encapsulated, for example, via a MEMS fabrication, encapsulation and packaging process as described and illustrated in U.S. Pat. Nos. 6,936,491 and/or 7,075,160, vents are formed in an encapsulation layer to etch or remove a sacrificial layer thereby substantially or entirely releasing (vertically and horizontally) micromachined thermistor structure. With reference to FIGS. 21A-21F, 23A-23D, vents 44 may be located (i) directly over portions of micromachined thermistor structure 12 (see, for example, FIGS. 21A, 21B and 21D), or (ii) remote from portions of micromachined thermistor structure 12 (see, for example, FIG. 21C), or (iii) adjacent to portions of structure 12 (see, for example, FIGS. 21E and 21F).

Briefly, with reference to FIGS. 22A-22F, in one exemplary embodiment, as discussed above, after defining micromachined thermistor structure 12 (see FIG. 22A), a process of fabricating a thin-film encapsulation structure starts with depositing or providing sacrificial layer 24 over micromachined thermistor structure 12. (See FIG. 22B). Thereafter, layer 26 is provided, for example, formed, deposited and/or grown. (See FIG. 22C). Vents 44 are then formed in encapsulation layer 26. (See FIG. 22D). Notably, in the illustrated embodiment, vents 44 are formed in encapsulation layer 26 directly over portions of micromachined thermistor structure 12 (see, for example, FIG. 21A). Thereafter, sacrificial layer 24 is removed or etched around micromachined thermistor structure 12 thereby substantially or entirely releasing (vertically and horizontally) micromachined thermistor structure 12. (See, FIG. 22E).

After releasing micromachined thermistor structure 12, in one embodiment, vents 44 may be closed and cavity 50 is sealed via deposition of layer 28. (See, FIG. 22F). Notably, material corresponding to layer 28 may collect in vents 44 (as illustrated in FIG. 22F), enter cavity 50, and/or deposit on micromachined thermistor structure 12. As such, it may be advantageous to locate vents 44 (*ii*) remote from portions of micromachined thermistor structure 12. (See, for example, FIG. 21C).

As mentioned above, MEMS device 36 may include one or more MEMS structures and may be any shape or device now known or later developed. For example, the MEMS device may include one or more structures to provide a gyroscope, resonator, pressure sensor and/or accelerometer, made in accordance with well-known fabrication techniques, such as lithographic and other precision fabrication techniques, which form mechanical components to a scale that is generally comparable to microelectronics.

In certain embodiments, the micromachined thermistor structures include one or more loop-shape portions. The radii of the loop-shape portions may differ and be designed and fabricated to facilitate a more uniform current flow throughout the micromachined thermistor structure and in particular, through the loop-shape portion of the micromachined thermistor structure. (Compare FIGS. 25A, 25B and 25C). Notably, the loop-shape portion of the micromachined thermistor structures may include portions that are not curved but the combination, as a whole, is loop-shaped. For example, with reference to FIG. 25C, the loop-shaped portion may include one or more straight portions between or separating two curved end portions wherein the combination, as a whole, is loop-shaped.

Notably, although, at times, the present inventions have been described and/or illustrated in relation to or in the context of a semiconductor-on-insulator (SOI) substrate. For example, the semiconductor layer of the SOI substrate may be materials in column IV of the periodic table, for example, silicon, germanium, carbon; also combinations of these, for example, silicon germanium, or silicon carbide; also of III-V compounds, for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon-germanium; also these materials with various crystal structures, including single/mono crystalline, polycrystalline, nanocrystalline, or amorphous; also with combinations of crystal structures, for instance with regions of single crystalline and polycrystalline structure (whether doped or undoped). Notably, the mechanical and/or thermistor structures may be comprised of the same materials as described above with respect to the first semiconductor layer.

Other substrates are also suitable-including, an insulating material (for example, a ceramic material, a glass material, a silicon oxide material and a silicon nitride material). The substrate may be a semiconductor material of a standard wafer (for example, a monocrystalline or polycrystalline silicon wafer) having an insulator or sacrificial layer deposited thereon. Moreover, the substrate may be a metal material. All substrates now known or later developed are intended to fall within the scope of the present inventions.

It should be further noted that various structures (for example, the structures of the thermistor and/or MEMS device), circuits and/or circuitry (for example, the measurement circuitry (including the material in ATTACHMENT A to the Provisional Application), data processing circuitry and clock generation circuitry) disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such structure and/or circuit expressions may be implemented include, but are not limited to, formats supporting behavioral languages such as C. Verilog, and HDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described structures, circuits and/or circuitry may be processed by a processing entity (e.g., one or more processors) within the computer system in conjunction with execution of one or more other computer programs including, without limitation, net-list generation programs, place and route programs and the like, to generate a representation or image of a physical manifestation of such structures, circuits and/or circuitry. Such representation or image may thereafter be used in device fabrication, for example, by enabling generation of one or more masks that are used to form various components of the circuits in a device fabrication process.

Moreover, the various structures various structures (for example, the structures of the thermistor and/or MEMS device), circuits and/or circuitry (for example, the measurement circuitry (including the circuitry of material in ATTACHMENT A to the Provisional Application), data processing circuitry and clock generation circuitry) disclosed herein may be represented via simulations using computer aided design and/or testing tools. The simulation of the various structures (for example, the structures of the thermistor and/or MEMS device), circuits and/or circuitry (for example, the measurement circuitry (including the circuitry of the material in ATTACHMENT A to the Provisional Application), data processing circuitry and clock generation circuitry), and/or characteristics or operations thereof, may be implemented by a computer system wherein characteristics and operations of such structures and/or circuitry, and techniques implemented thereby, are imitated, replicated and/or predicted via a computer system. The present inventions are also directed to such simulations of the inventive structures and circuitry, and/or techniques implemented thereby, and, as such, are intended to fall within the scope of the present inventions. The computer-readable media corresponding to such simulations and/or testing tools are also intended to fall within the scope of the present inventions.

It should be noted that the term "circuit" may include, among other things, a single component (for example, electrical/electronic and/or microelectromechanical) or a multiplicity of components (whether in integrated circuit form, discrete form or otherwise), which are active and/or passive, and which are coupled together to provide or perform a desired function. The term "circuitry" may include, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated, discrete or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form.

Notably, the terms "first," "second," and the like, herein do not denote any order, quantity, or importance, but rather are used to distinguish one element from another. Moreover, in the claims, the terms "a" and "an" herein do not denote a limitation of quantity, but rather denote the presence of at least one of the referenced item.

What is claimed is:

1. An integrated circuit device comprising:
   a die having a substrate, a cover, an enclosed space defined in between the substrate and the cover, the enclosed space being hermitically sealed within the die relative to an environment external to the integrated circuit device, and a micromachined thermistor within the enclosed space, the micromachined thermistor being anchored to the substrate; and
   wherein a body of the micromachined thermistor comprises a doped, crystalline semiconductor material.

2. The integrated circuit device of claim 1 wherein the micromachined thermistor has an electrical path length within the enclosed space, wherein electrical couplings which connect the integrated circuit device to the micromachined thermistor are in proximity to one another relative to the path length, such that the path length within the enclosed space is substantially greater than a linear distance between the electrical couplings.

3. The integrated circuit device of claim 2 wherein the path length is at least twice the linear distance between the electrical couplings.

4. The integrated circuit device of claim 1 wherein the cover comprises a lid which has been bonded to the substrate.

5. The integrated circuit device of claim 1 wherein the cover comprises a semiconductor layer which has been deposited over a release material, wherein the semiconductor layer is characterized by vents, through which the release material has been removed to at least partially free the micromachined thermistor from contact with the substrate and with the semiconductor layer, and wherein the integrated circuit device further comprises at least one plug, which closes the vents following removal of the release material.

6. The integrated circuit device of claim 1 wherein the body further comprises a metal material.

7. The integrated circuit device of claim 1 wherein the doped, crystalline semiconductor material comprises crystal silicon, doped with an N-type dopant.

8. The integrated circuit device of claim 1 wherein the doped, crystalline semiconductor material comprises a first region, the first region having a first impurity dopant type, and a second region, the second region having a second impurity dopant type.

9. The integrated circuit device of claim 1 further comprising a microelectromechanical systems (MEMS) resonator, the MEMS resonator also being hermitically sealed with a chamber relative to the environment external to the integrated circuit device.

10. The integrated circuit device of claim 9 wherein the die is a first die, wherein the integrated circuit device comprises a second die, is in a stacked configuration relative the first die, and wherein the chamber that hermitically seals the MEMS resonator relative to the environment external to the integrated circuit device is in the second die.

11. The integrated circuit device of claim 1 wherein the enclosed space comprises a vacuum.

12. The integrated circuit device of claim 1 wherein the micromachined thermistor is encapsulated within the integrated circuit device.

13. The integrated circuit device of claim 1 further comprising a microelectromechanical systems (MEMS) resonator also on the die.

14. The integrated circuit device of claim 13, further comprising clock generation circuitry, the clock generation circuitry operable to generate a timing signal dependent on an output of the MEMS resonator and dependent on an output of the thermistor.

15. A method of fabricating an integrated circuit device, the method comprising:

forming a first die to have a substrate, a cover, an enclosed space defined in between the substrate and the cover, the enclosed space being hermitically sealed within the die relative to an environment external to the integrated circuit device, and a micromachined thermistor within the enclosed space, the micromachined thermistor in a manner such that it is anchored to the substrate; and wherein forming the first die comprises forming a body of the micromachined thermistor so as to include a doped, crystalline semiconductor material.

16. The method of claim 15 wherein the method further comprises forming the micromachined thermistor to have an electrical path length, within the enclosed space, and couplings which electrically connect the integrated circuit device to the micromachined thermistor, wherein the electrical couplings are in proximity to one another relative to the path length, such that the path length within the enclosed space is substantially greater than a linear distance between the electrical couplings.

17. The method of claim 16 wherein the path length is at least twice the linear distance between the electrical couplings.

18. The method of claim 15 wherein forming the first die comprises bonding a lid to the substrate, the cover comprising the lid.

19. The method of claim 15 wherein:

the forming of the die comprises:

depositing a release material over the substrate, depositing a semiconductor layer over a release material, forming vents in the semiconductor layer, etching the release material via the vents, to at least partially free the micromachined thermistor from contact with the substrate and with the semiconductor layer, and plugging the vents, to close the vents following the etching of the release material; and the cover comprises the semiconductor layer.

20. The method of claim 15 wherein forming the body further comprises forming the body to include a metal material.

21. The method of claim 15 wherein the doped, crystalline semiconductor material comprises crystal silicon, doped with an N-type dopant.

22. The method of claim 15 wherein forming the die comprises forming the doped, crystalline semiconductor material to have a first region, with a first impurity dopant type, and a second region, with a second impurity dopant type.

23. The method of claim 15 wherein the method further comprises forming a microelectromechanical systems (MEMS) resonator, in a manner such that the MEMS resonator is also hermitically sealed with a chamber relative to the environment external to the integrated circuit device.

24. The method of claim 23 wherein the die is a first die, wherein the method further comprises fabricating the integrated circuit device so as to have a second die, in a stacked configuration relative the first die, and such that the chamber that hermitically seals the MEMS resonator relative to the environment external to the integrated circuit device is in the second die.

* * * * *